(12) United States Patent  
Sakuma et al.

(10) Patent No.: US 8,896,054 B2
(45) Date of Patent: Nov. 25, 2014

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventors: Kiwamu Sakuma, Yokohama (JP); Atsuhiro Kinoshita, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/940,331

(22) Filed: Jul. 12, 2013

(65) Prior Publication Data

US 2013/0299894 A1 Nov. 14, 2013

Related U.S. Application Data

(63) Continuation of application No. 13/236,734, filed on Sep. 20, 2011, now Pat. No. 8,513,725.

(30) Foreign Application Priority Data

Sep. 21, 2010 (JP) .................................. 2010-211272

(51) Int. Cl.
*H01L 29/792* (2006.01)
*H01L 27/115* (2006.01)

(52) U.S. Cl.
CPC ........ *H01L 29/792* (2013.01); *H01L 27/11565* (2013.01); *H01L 27/11519* (2013.01); *H01L 27/11578* (2013.01); *H01L 27/11524* (2013.01); *H01L 27/11551* (2013.01)
USPC .......................................... 257/326; 257/314

(58) Field of Classification Search
CPC .................. H01L 27/11519; H01L 27/11524; H01L 29/792; H01L 27/11551

USPC .......................................................... 257/314
See application file for complete search history.

(56) References Cited

U.S. PATENT DOCUMENTS 8,008,732 B2 8/2011 Kiyotoshi et al.
8,331,149 B2 * 12/2012 Choi et al. ............... 365/185.05

(Continued)

FOREIGN PATENT DOCUMENTS

JP 02-002668 1/1990
JP 2004-152893 5/2004

(Continued)

OTHER PUBLICATIONS

U.S. Appl. No. 13/547,567, filed Jul. 12, 2012, Sakuma et al.

(Continued)

*Primary Examiner* — Kimberly Rizkallah
*Assistant Examiner* — Mounir Amer
(74) *Attorney, Agent, or Firm* — Oblon, Spivak, McClelland, Maier & Neustadt, L.L.P.

(57) ABSTRACT

According to one embodiment, a memory device includes first and second fin type stacked structures each includes first to i-th memory strings (i is a natural number except 1) that are stacked in a first direction, the first and second fin type stacked structures which extend in a second direction and which are adjacent in a third direction, a first portion connected to one end in the second direction of the first fin type stacked structure, a width in the third direction of the first portion being greater than a width in the third direction of the first fin type stacked structure, and a second portion connected to one end in the second direction of the second fin type stacked structure, a width in the third direction of the second portion being greater than a width in the third direction of the second fin type stacked structure.

26 Claims, 36 Drawing Sheets

(56) References Cited

U.S. PATENT DOCUMENTS

| | | |
|---|---|---|
| 2007/0296033 A1 | 12/2007 | Park et al. |
| 2008/0044986 A1* | 2/2008 | Storbeck et al. ............ 438/471 |
| 2008/0149913 A1 | 6/2008 | Tanaka et al. |
| 2008/0258203 A1 | 10/2008 | Happ et al. |
| 2010/0039865 A1 | 2/2010 | Kidoh et al. |
| 2010/0052042 A1 | 3/2010 | Tanaka et al. |
| 2010/0226195 A1 | 9/2010 | Lue |
| 2010/0232224 A1 | 9/2010 | Maeda et al. |
| 2010/0265773 A1 | 10/2010 | Lung et al. |
| 2010/0270529 A1 | 10/2010 | Lung |
| 2010/0270593 A1 | 10/2010 | Lung et al. |
| 2010/0327323 A1* | 12/2010 | Choi ............................ 257/202 |
| 2011/0049611 A1 | 3/2011 | Kiyotoshi et al. |
| 2011/0084397 A1 | 4/2011 | Lung |
| 2011/0169067 A1* | 7/2011 | Ernst et al. .................... 257/316 |
| 2011/0286283 A1 | 11/2011 | Lung et al. |
| 2012/0007167 A1 | 1/2012 | Hung et al. |
| 2012/0051137 A1 | 3/2012 | Hung et al. |
| 2012/0068254 A1 | 3/2012 | Sakuma et al. |
| 2012/0280303 A1 | 11/2012 | Kiyotoshi et al. |

FOREIGN PATENT DOCUMENTS

| | | |
|---|---|---|
| JP | 2006-155750 | 6/2006 |
| JP | 2008-78404 | 4/2008 |
| JP | 2009-27136 | 2/2009 |
| JP | 2009-283799 | 12/2009 |

OTHER PUBLICATIONS

A. Hubert et al., "A stacked SONOS technology, up to 4 levels and 6nm crystalline nanowires, with gate-all-around or independent gates (Φ-Flash), suitable for full 3D integration", IEDM, 2009, pp. 637-640.

Hang-Ting Lue et al., "A Highly Scalable 8-Layer 3D Vertical-Gate (VG) TFT NAND Flash Using Junction-Free Buried Channel BE-SONOS Device", Symposium on VLSI Technology Digest of Technical Papers, 2010, pp. 131-132.

Wonjoo Kim et al., "Multi-Layered Vertical Gate NAND Flash Overcoming Stacking Limit for Terabit Density Storage", Symposium on VLSI Technology Digest of Technical Papers, 2009, pp. 188-189.

Office Action issued Jul. 29, 2014 in Japanese Patent Application No. 2010-211272 (with English Translation).

* cited by examiner

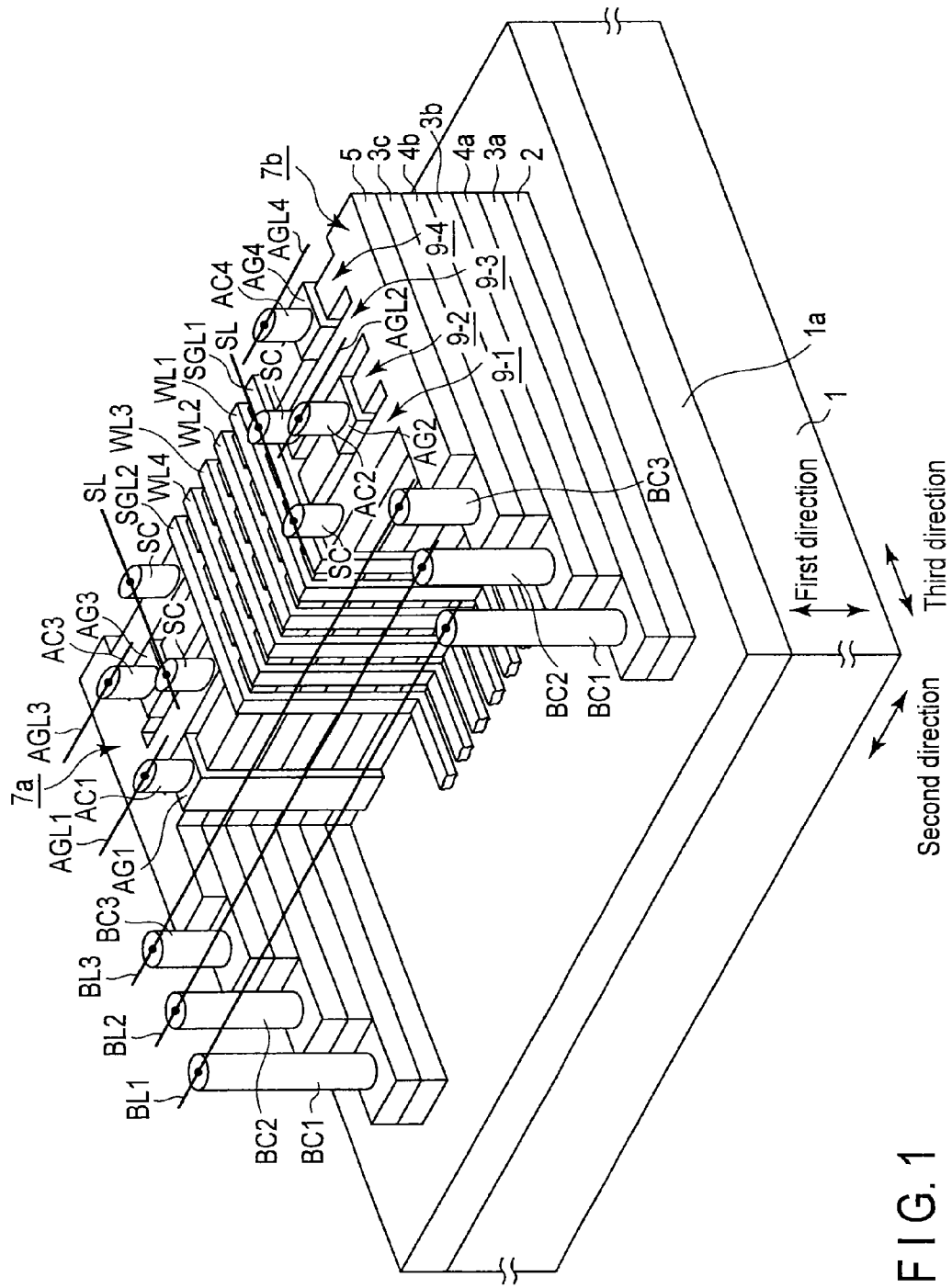
F I G. 1

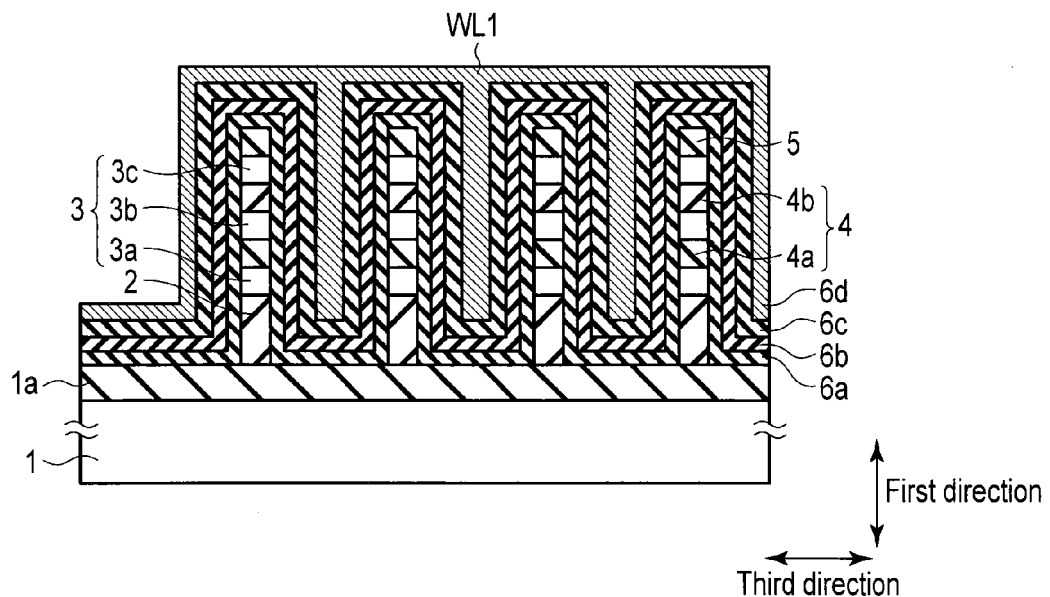
F I G. 4
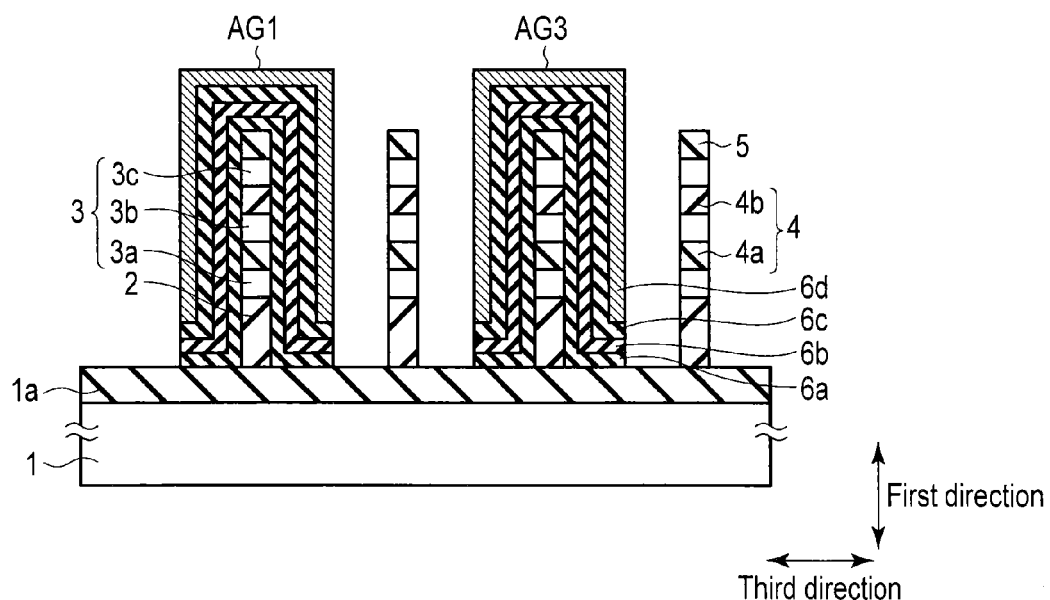
F I G. 5

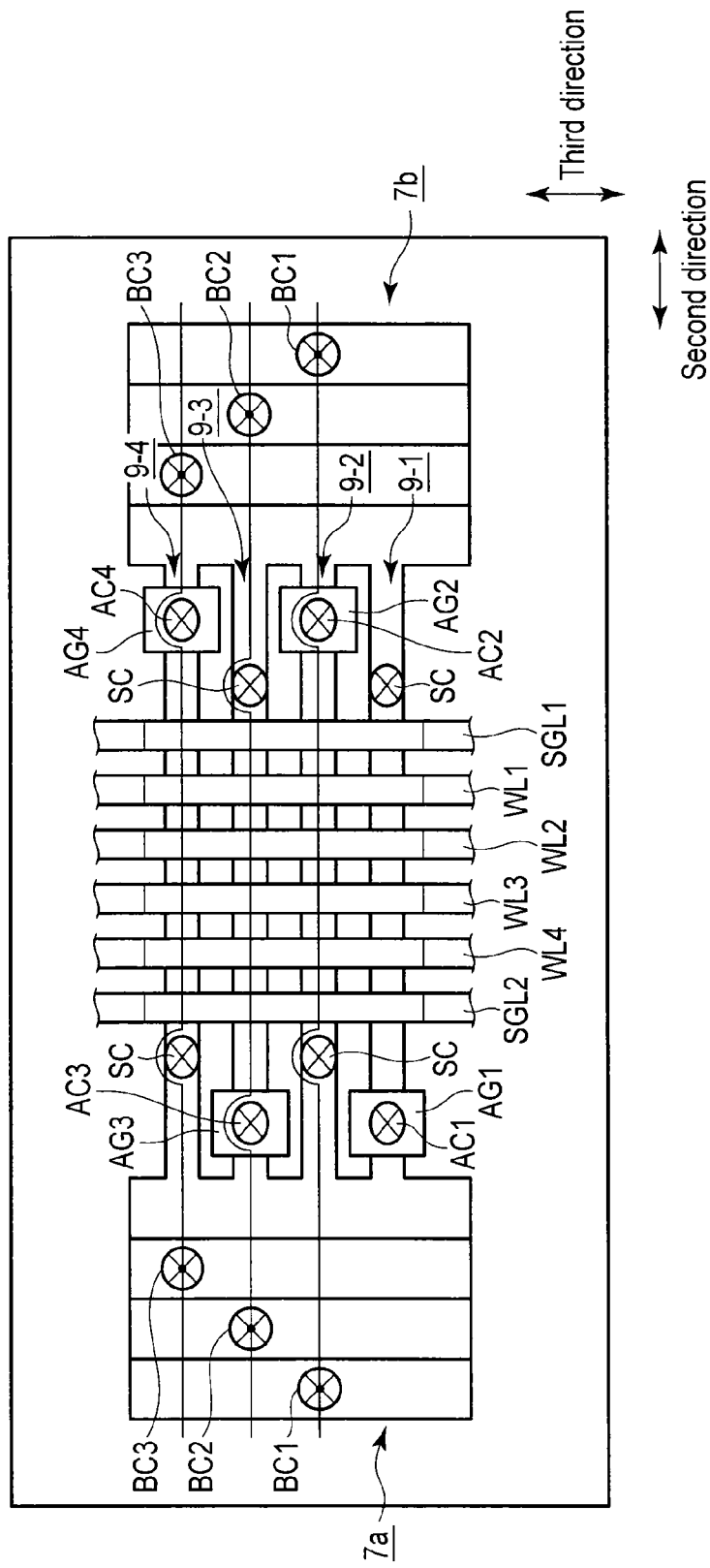
F I G. 6

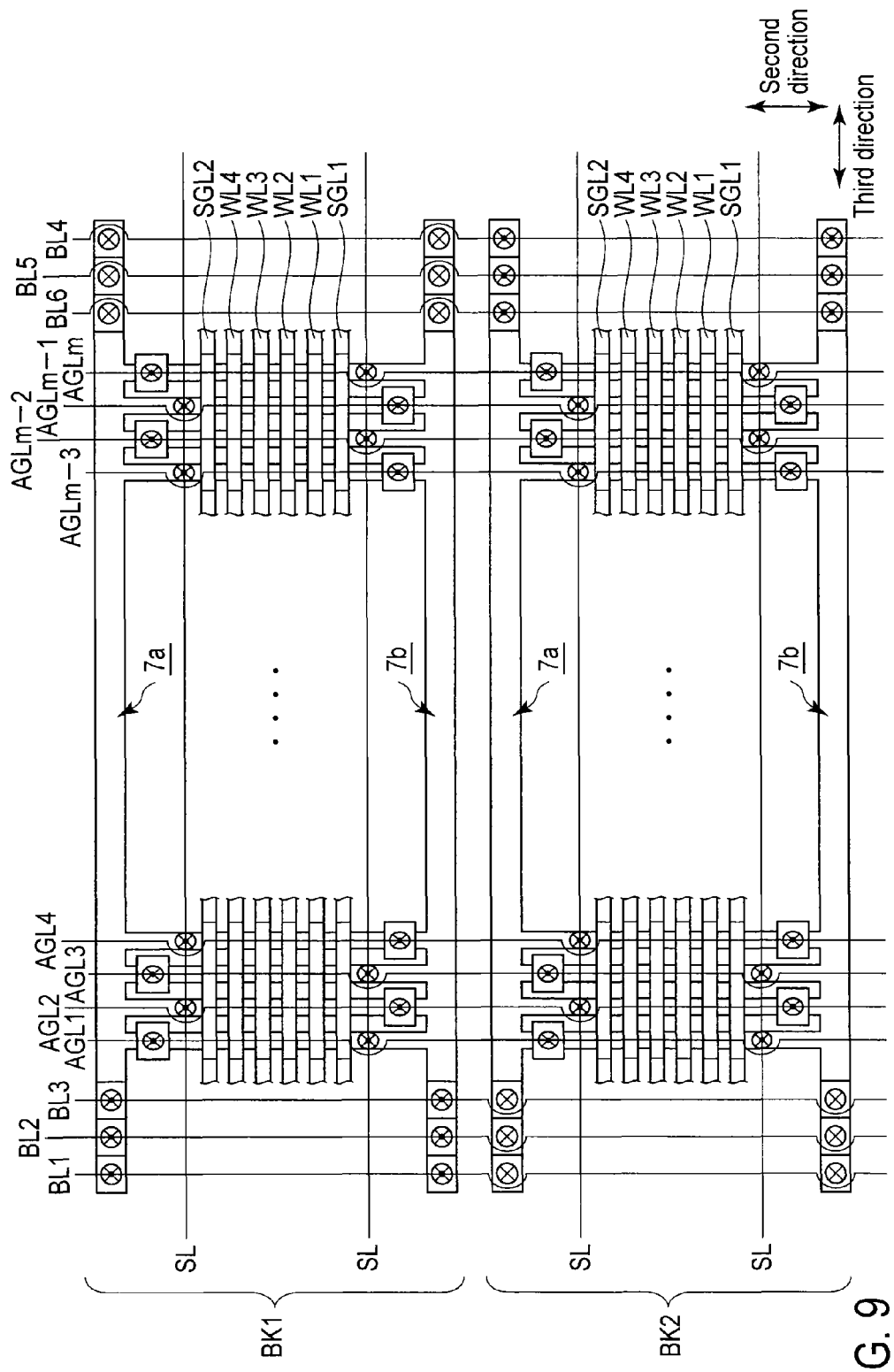
F I G. 9

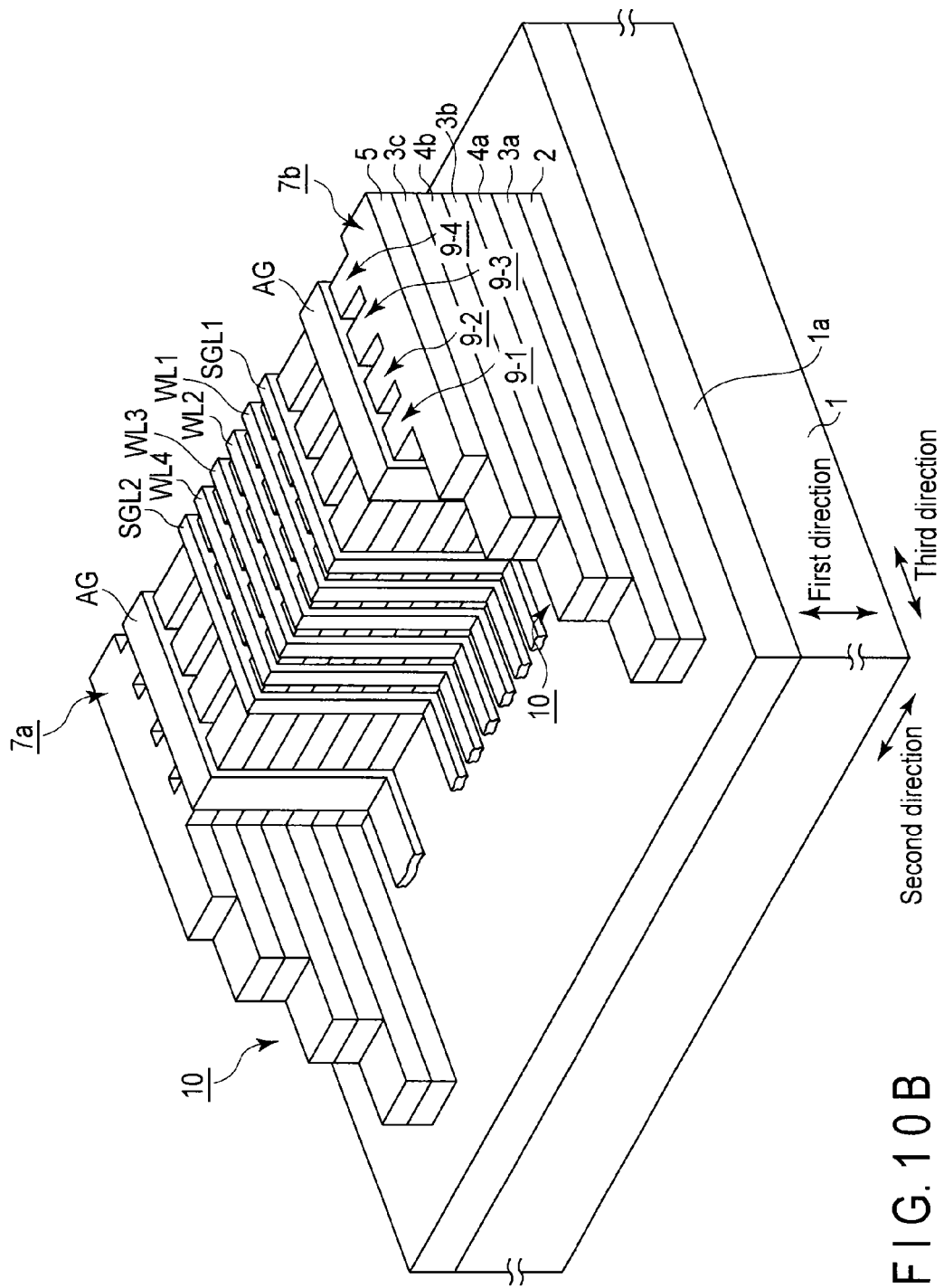
F I G. 10 B

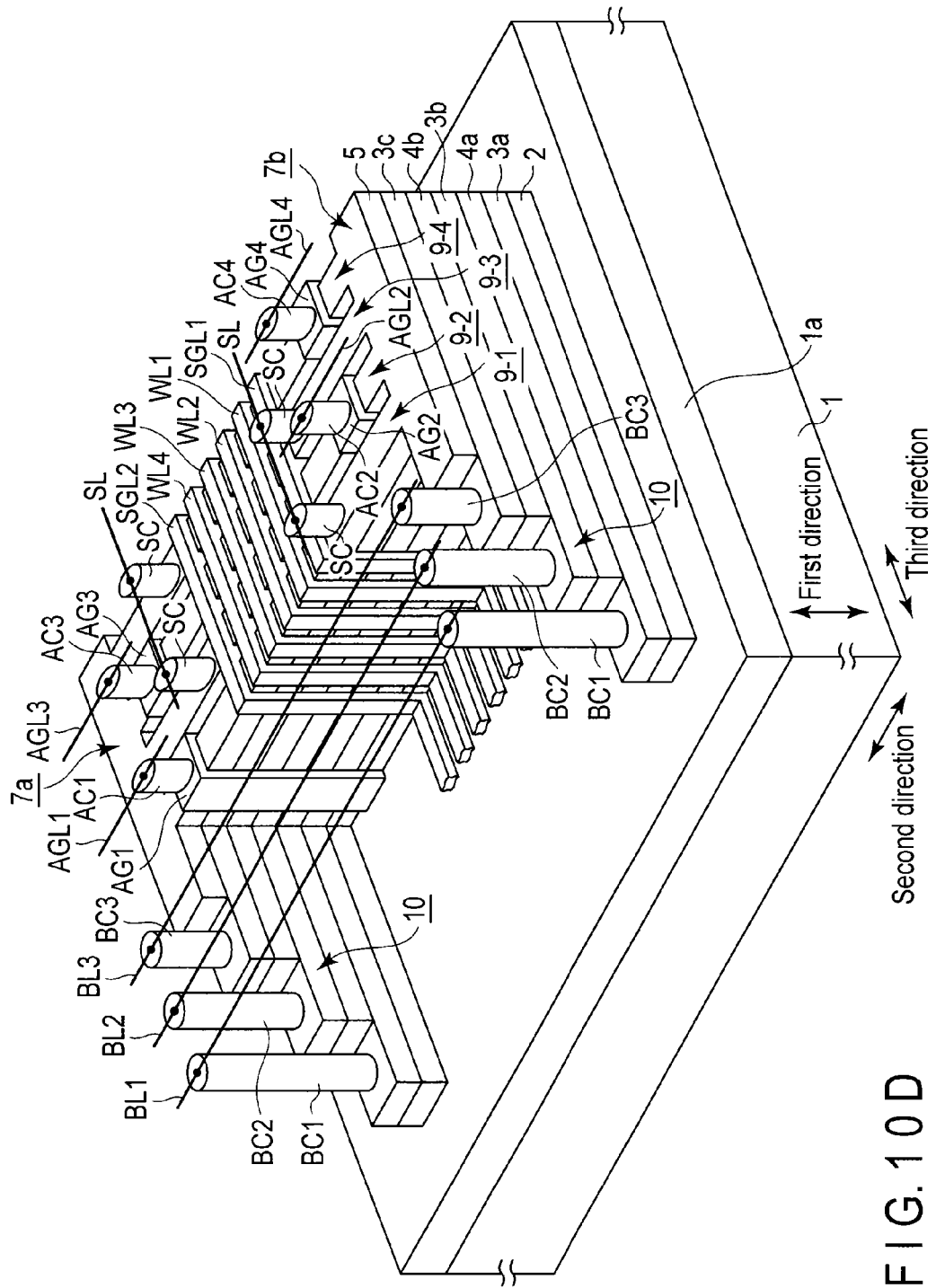
F I G. 10D

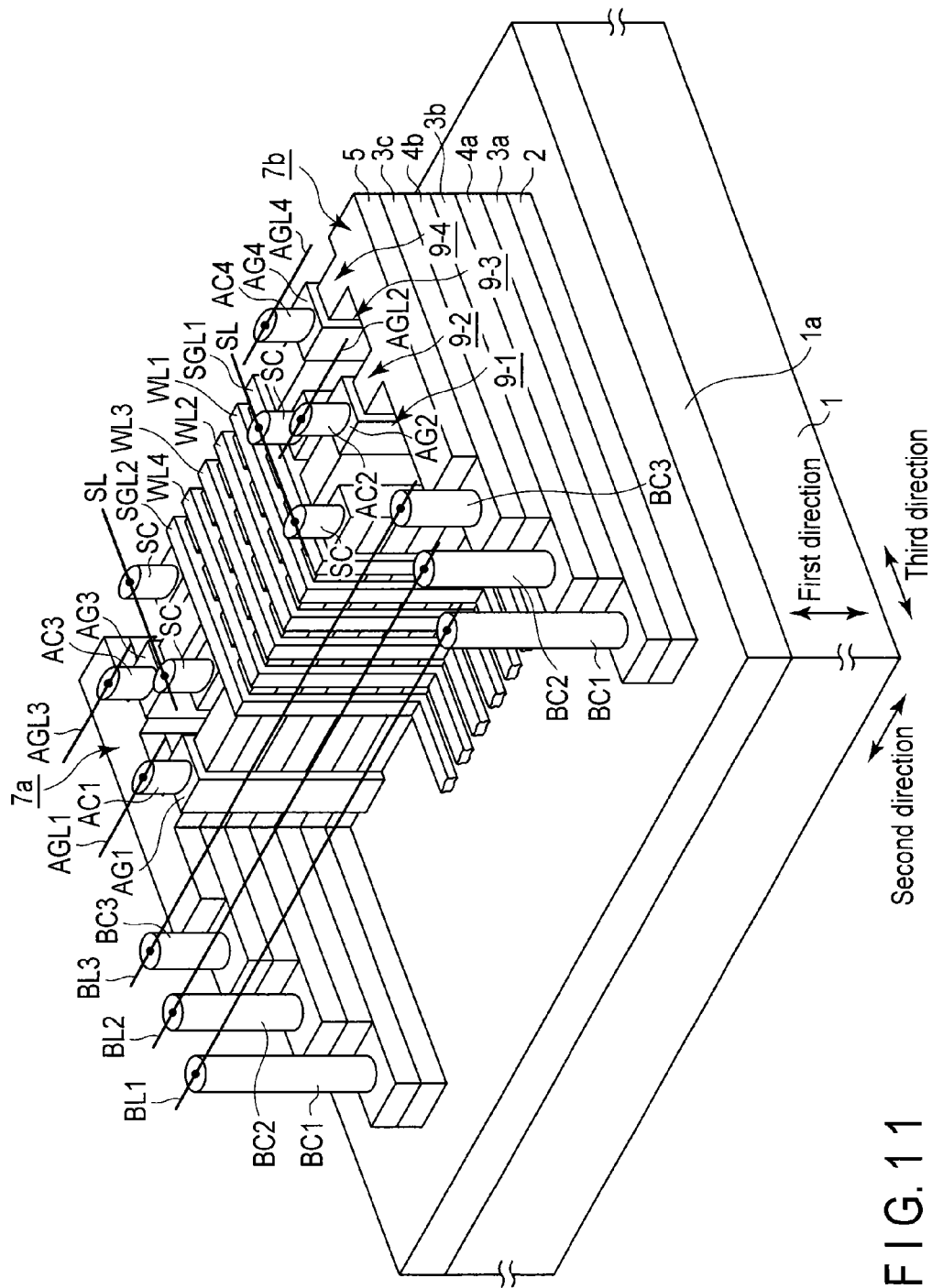
F I G. 11

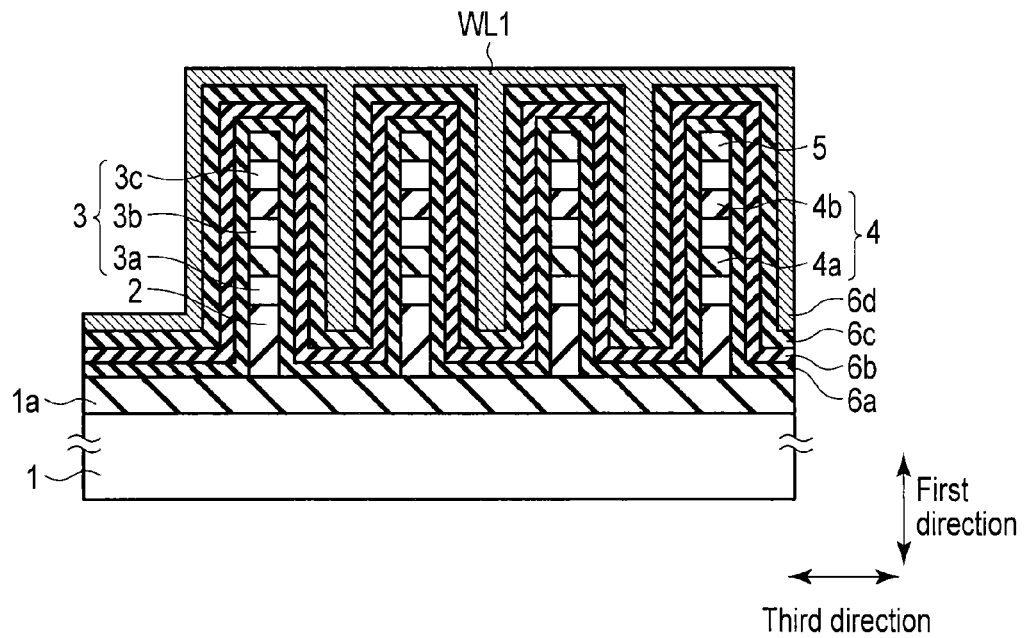
F I G. 14
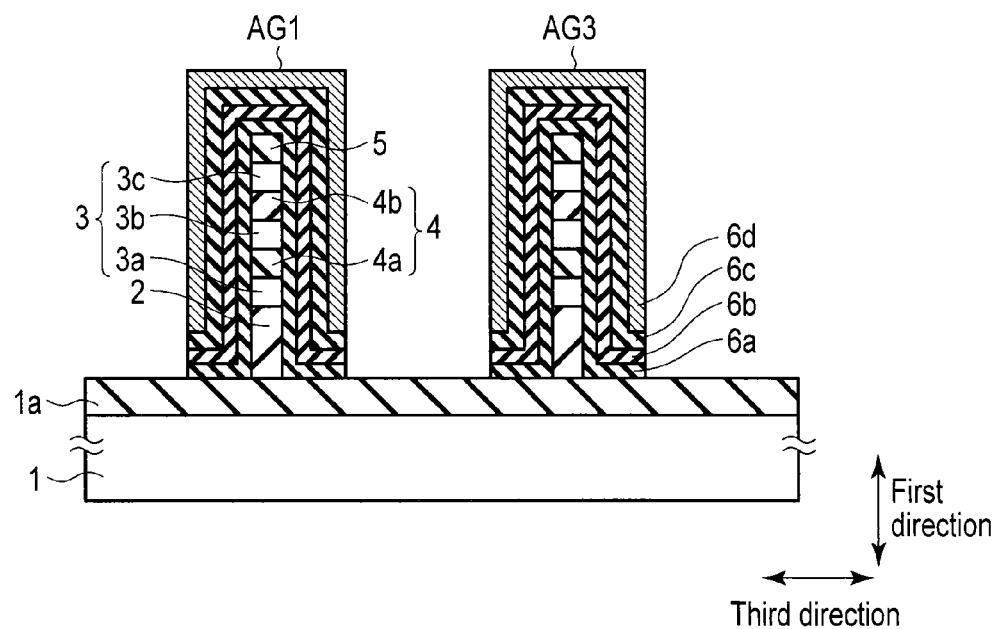
F I G. 15

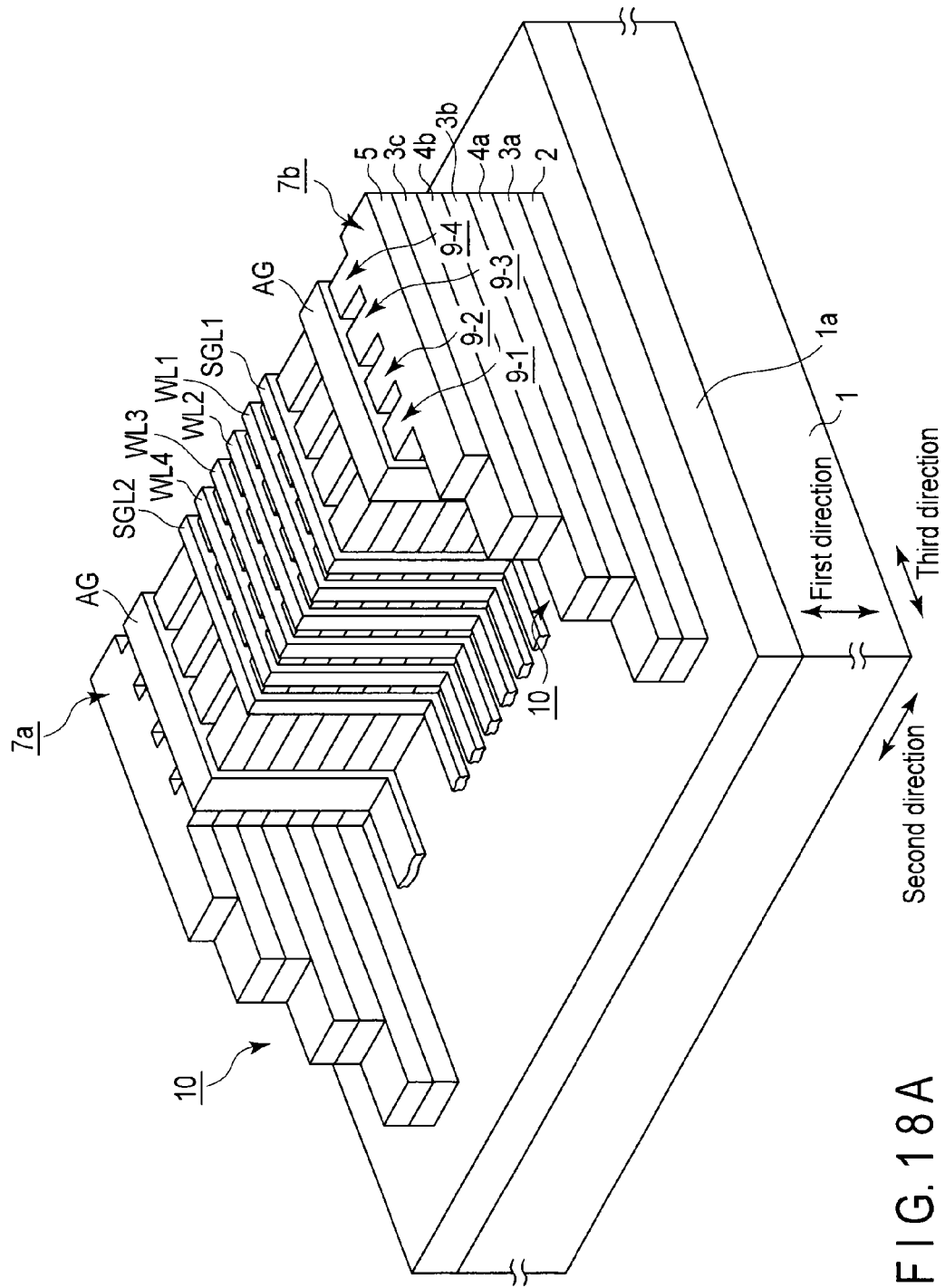
F I G. 18A

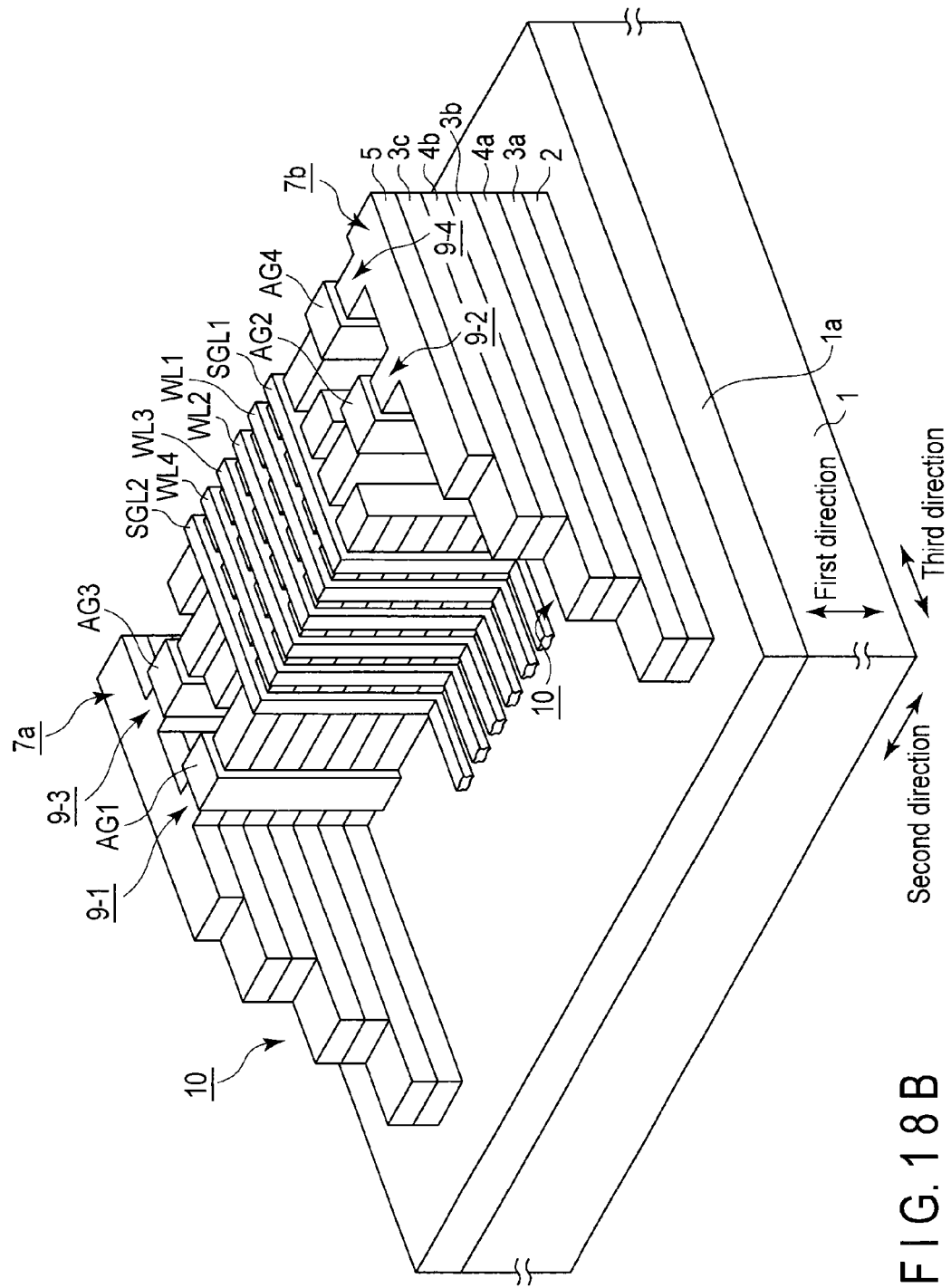
F I G. 18 B

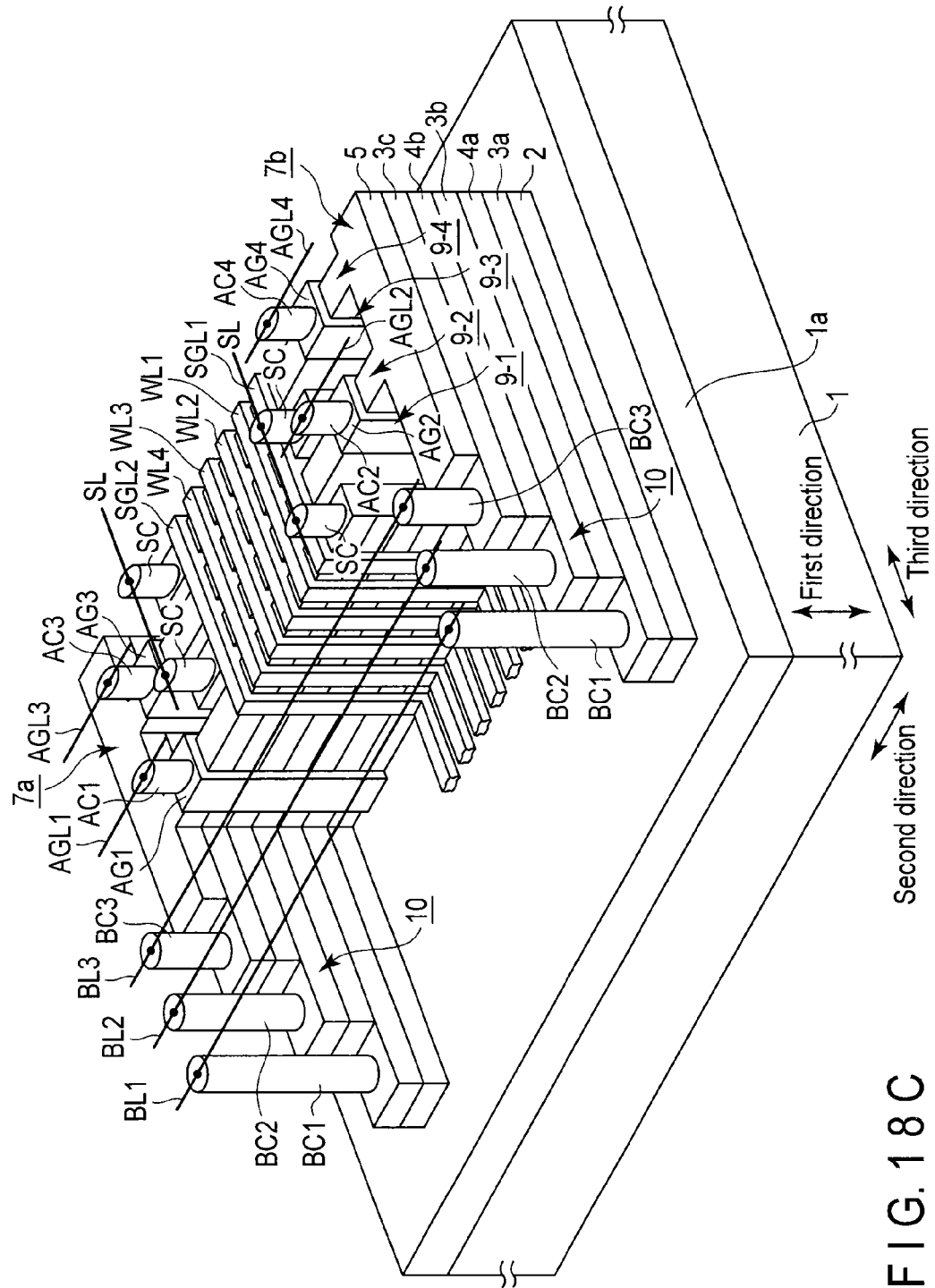
F I G. 18 C

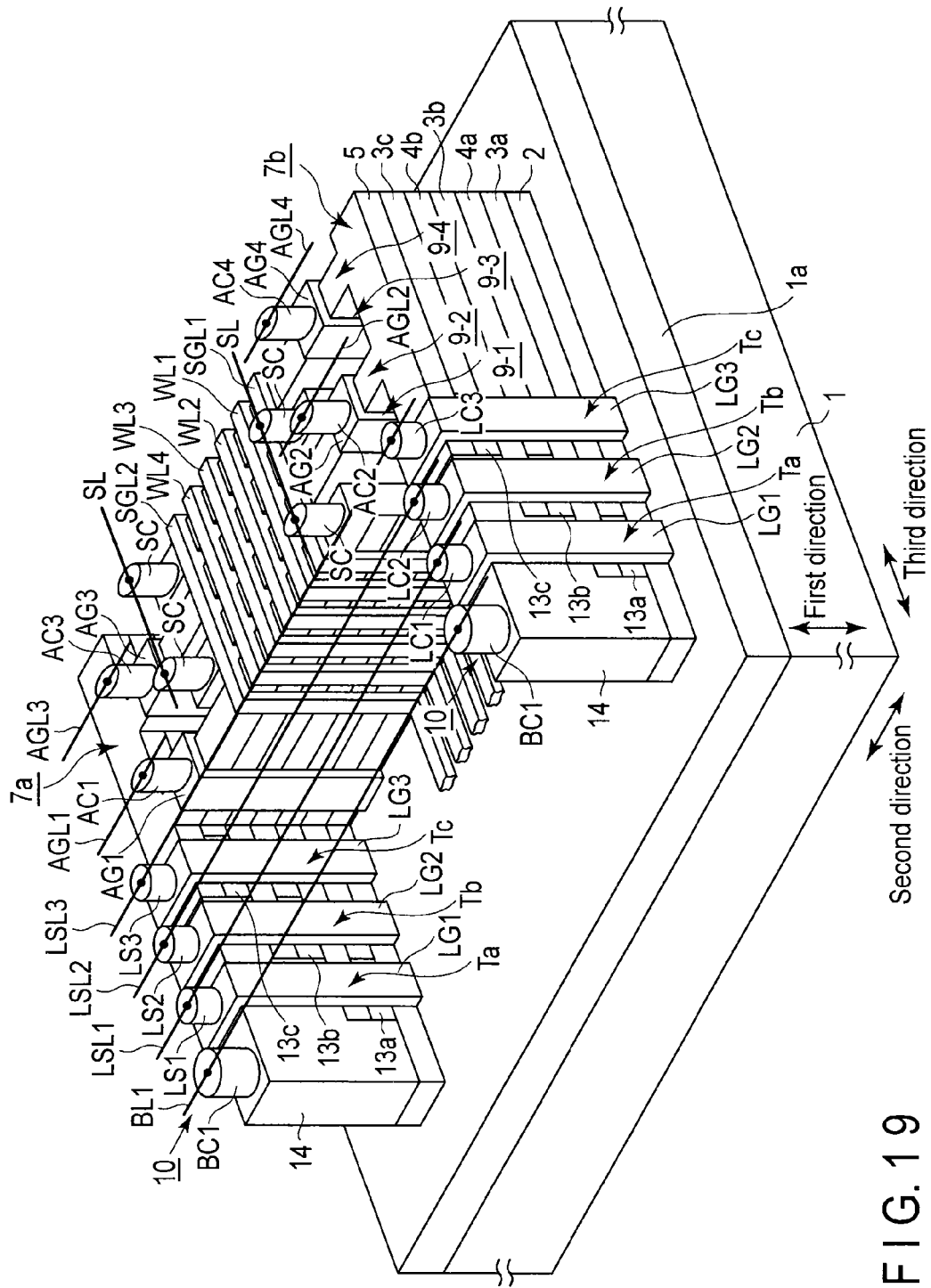
F I G. 19

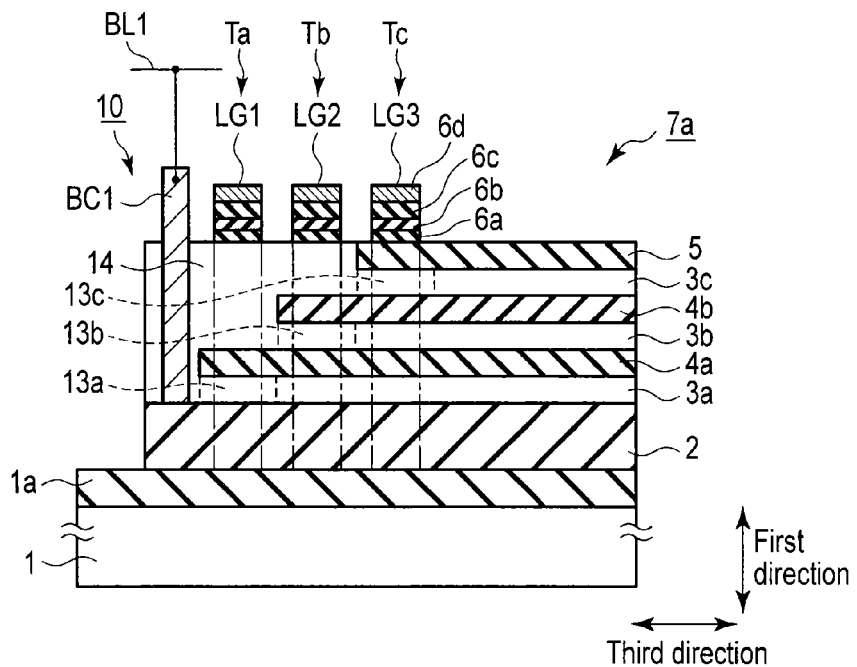
F I G. 2 1
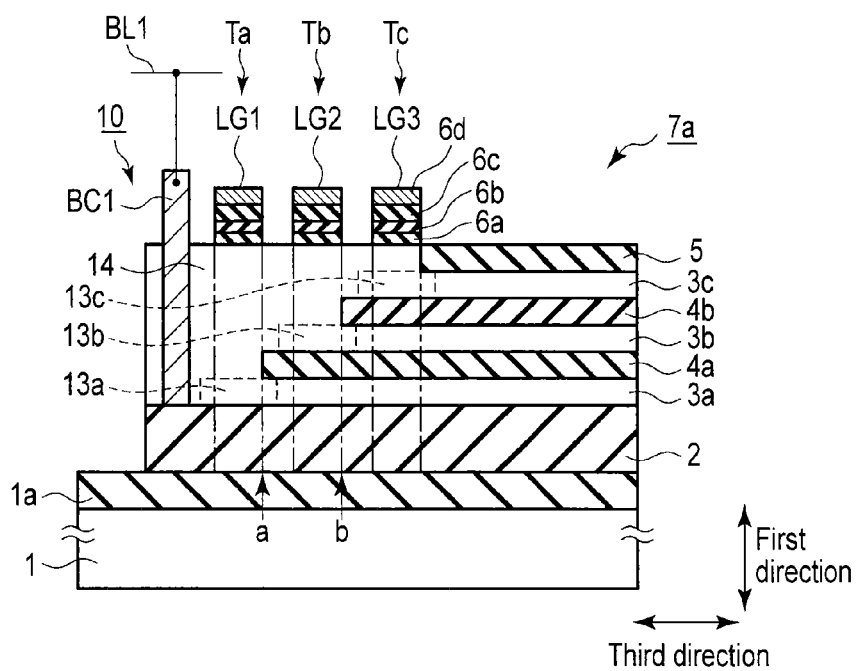
F I G. 2 2

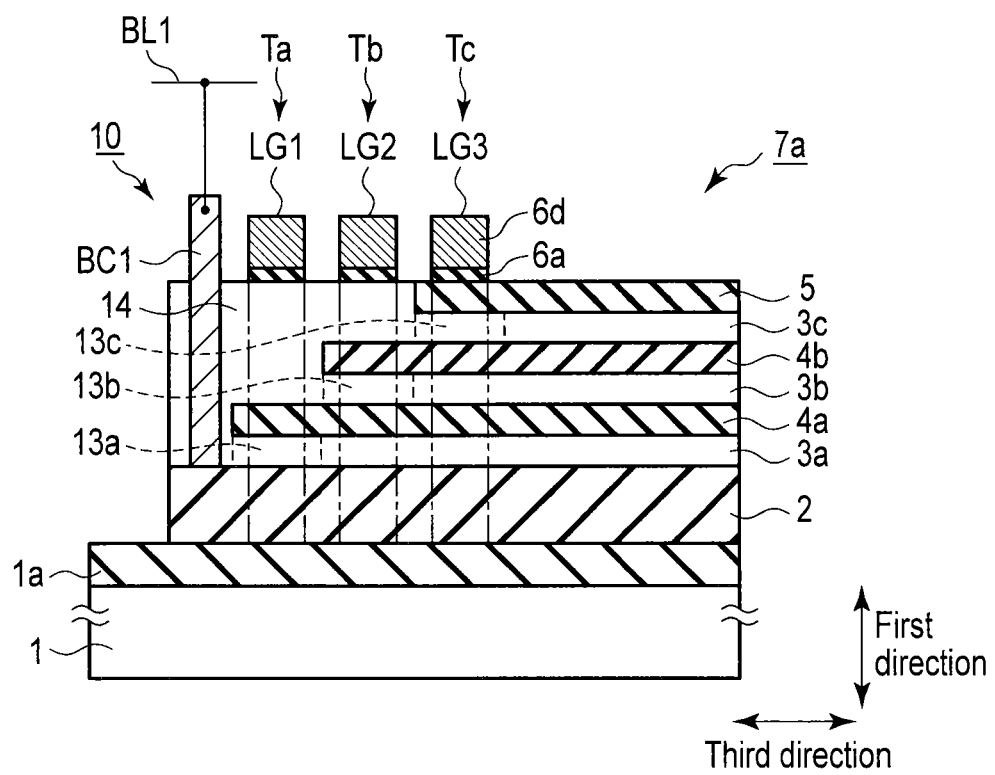
F I G. 24

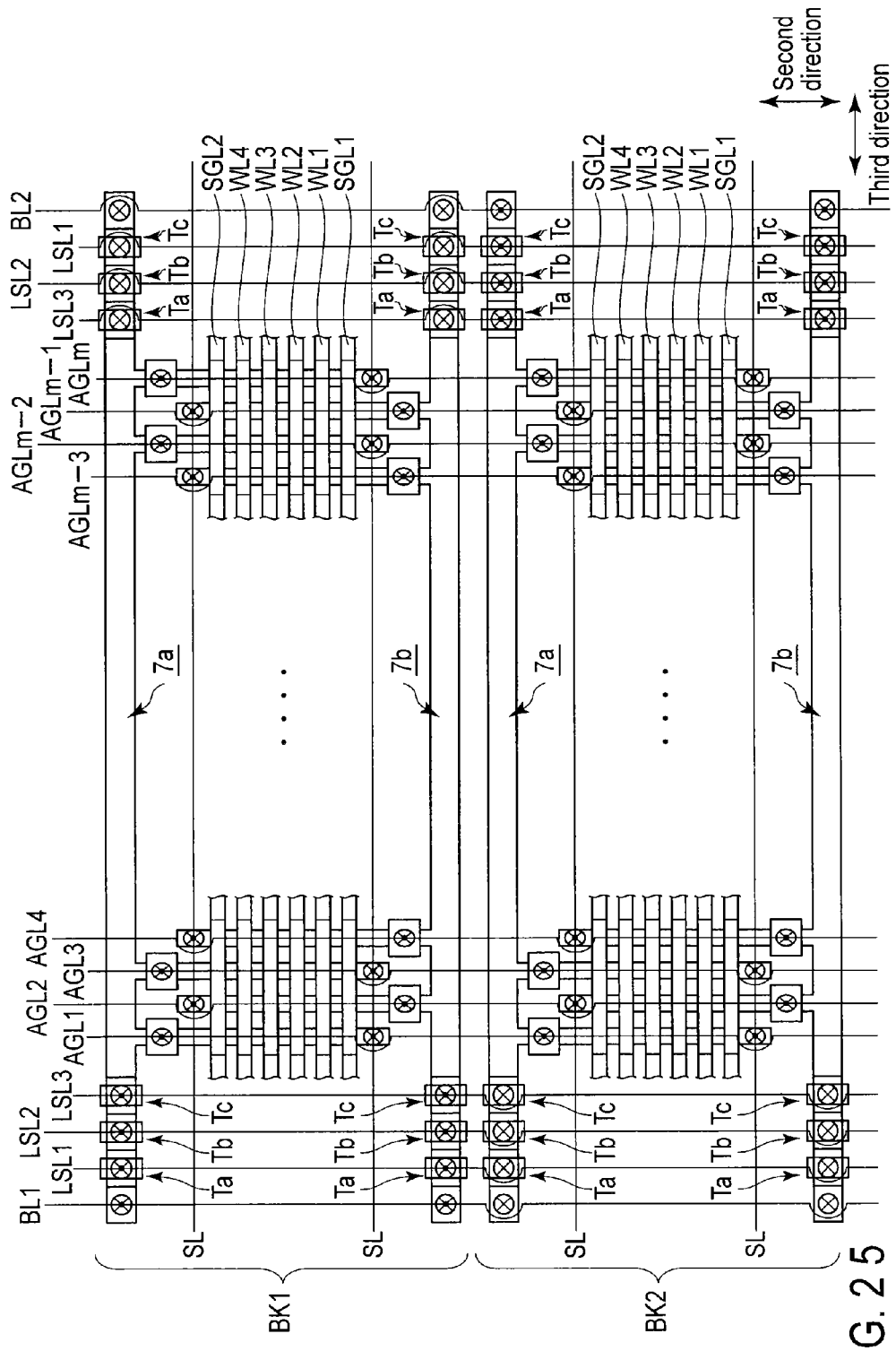
F I G. 25

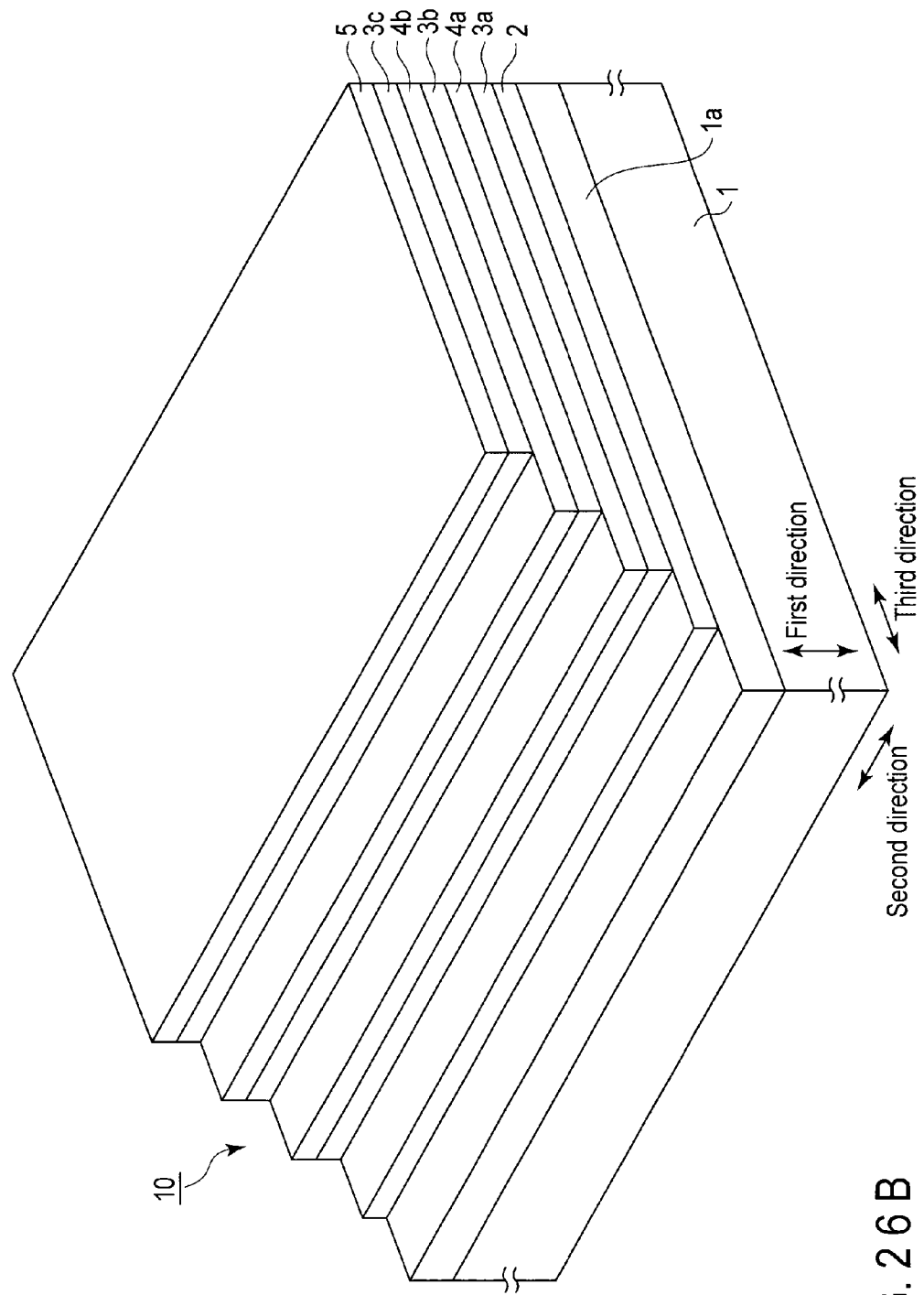
F I G. 2 6 B

US 8,896,054 B2

NONVOLATILE SEMICONDUCTOR MEMORY DEVICE AND METHOD OF MANUFACTURING THE SAME

CROSS-REFERENCE TO RELATED APPLICATIONS

This application is continuation of and claims the benefit of priority under 35 U.S.C. §120 from U.S. Ser. No. 13/236,734 filed Sep. 20, 2011, and claims the benefit of priority under 35 U.S.C. §119 from Japanese Patent Application No. 2010-211272 filed Sep. 21, 2010, the entire contents of each of which are incorporated herein by reference.

FIELD

Embodiments described herein relate generally to a nonvolatile semiconductor memory device and a method of manufacturing the same.

BACKGROUND

For higher integration and higher capacity of a nonvolatile semiconductor memory device, it is necessary to reduce design rules. In order to reduce the design rules, enhanced micro fabrication of wiring patterns or the like is needed. This, however, requires an extremely high level of fabrication technique, so that the reduction of the design rules is increasingly difficult.

Accordingly, nonvolatile semiconductor memory devices having three-dimensional structures have recently been suggested for higher integration of memory cells.

A common feature of these nonvolatile semiconductor memory devices is to use fin type stacked structures to obtain the three-dimensional structures. Theoretically, higher integration is achieved by increasing the number of stacked layers in the fin type stacked structure and by reducing the fin width. In order to prevent the collapse of the fin type stacked structure and enhance reliability, the fin type stacked structures are arranged perpendicularly to their extending direction, and joined to one another at one end and the other.

In this case, an assist gate is added to each of the fin type stacked structures to select one of the fin type stacked structures, and the assist gate of each of the fin type stacked structures is independently controlled. To this end, however, the assist gates of the fin type stacked structures have to be separate from one another. To separate the assist gates, the distance between the fin type stacked structures has to be great enough for the patterning of the assist gates. This is a disadvantage to higher integration.

BRIEF DESCRIPTION OF THE DRAWINGS

FIG. 1 is a perspective view showing a structure of a first embodiment;
FIG. 4 is a sectional view taken along the line IV-IV of FIG. 2;
FIG. 5 is a sectional view taken along the line V-V of FIG. 2;
FIG. 6 is a plan view showing a first modification;
FIG. 9 is a plan view showing a memory cell array;
FIG. 10A to FIG. 10D are perspective views showing a method of manufacturing the structure shown in FIG. 1 to FIG. 9;
FIG. 11 is a perspective view showing a structure of a second embodiment;
FIG. 14 is a sectional view taken along the line XIV-XIV of FIG. 12;
FIG. 15 is a sectional view taken along the line XV-XV of FIG. 12;
FIG. 18A to FIG. 18C are perspective views showing a method of manufacturing the structure shown in FIG. 11 to FIG. 17;
FIG. 19 is a perspective view showing a structure of a third embodiment;
FIG. 21 is a sectional view taken along the line XXI-XXI of FIG. 20;
FIG. 22 is a sectional view showing the ranges of edge positions of second and third insulating layers;
FIG. 24 is a sectional view taken along the line XXIV-XXIV of FIG. 23;
FIG. 25 is a plan view showing a memory cell array;
FIG. 26A to FIG. 26H are perspective views showing a method of manufacturing the structure shown in FIG. 19 to FIG. 25.

DETAILED DESCRIPTION

In general, according to one embodiment, a nonvolatile semiconductor memory device comprising: a semiconductor substrate; first and second fin type stacked structures each comprising first to i-th memory strings (i is a natural number equal to or more than 2) that are stacked in a first direction perpendicular to a surface of the semiconductor substrate, the first and second fin type stacked structures which extend in a second direction parallel to the surface of the semiconductor substrate and which are adjacent in a third direction perpendicular to the first and second directions; a first portion connected to one end in the second direction of the first fin type stacked structure, a width in the third direction of the first portion being greater than a width in the third direction of the first fin type stacked structure; and a second portion connected to one end in the second direction of the second fin type stacked structure, a width in the third direction of the second portion being greater than a width in the third direction of the second fin type stacked structure, wherein the other end in the second direction of the first fin type stacked structure is located at the second portion side, and the other end in the second direction of the second fin type stacked structure is located at the first portion side, the first to i-th memory strings in the first fin type stacked structure uses the first portion as a drain region, and uses the ends of the first to i-th memory strings at the second portion side as a source region, the first to i-th memory strings in the second fin type stacked structure uses the second portion as a drain region, and uses the ends of the first to i-th memory strings at the first portion side as a source region, each of the first to i-th memory strings comprises memory cells connected in series in the second direction, and an assist gate transistor connected between the drain region and the memory cells, each of the memory cells comprises a semiconductor layer, and a first insulating layer, a charge storage layer, a second insulating layer, and a control gate electrode that are disposed on side surfaces in the third direction of the semiconductor layer, the assist gate transistor comprises the semiconductor layer, and a gate insulating layer and an assist gate electrode that are disposed on the side surfaces in the third direction of the semiconductor layer, and the control gate electrode is shared by the first and second fin type stacked structures, and the assist gate electrode in the first fin type stacked structure is electrically isolated from the assist gate electrode in the second fin type stacked structure.

1. First Embodiment

A. Structure

Figure 2:
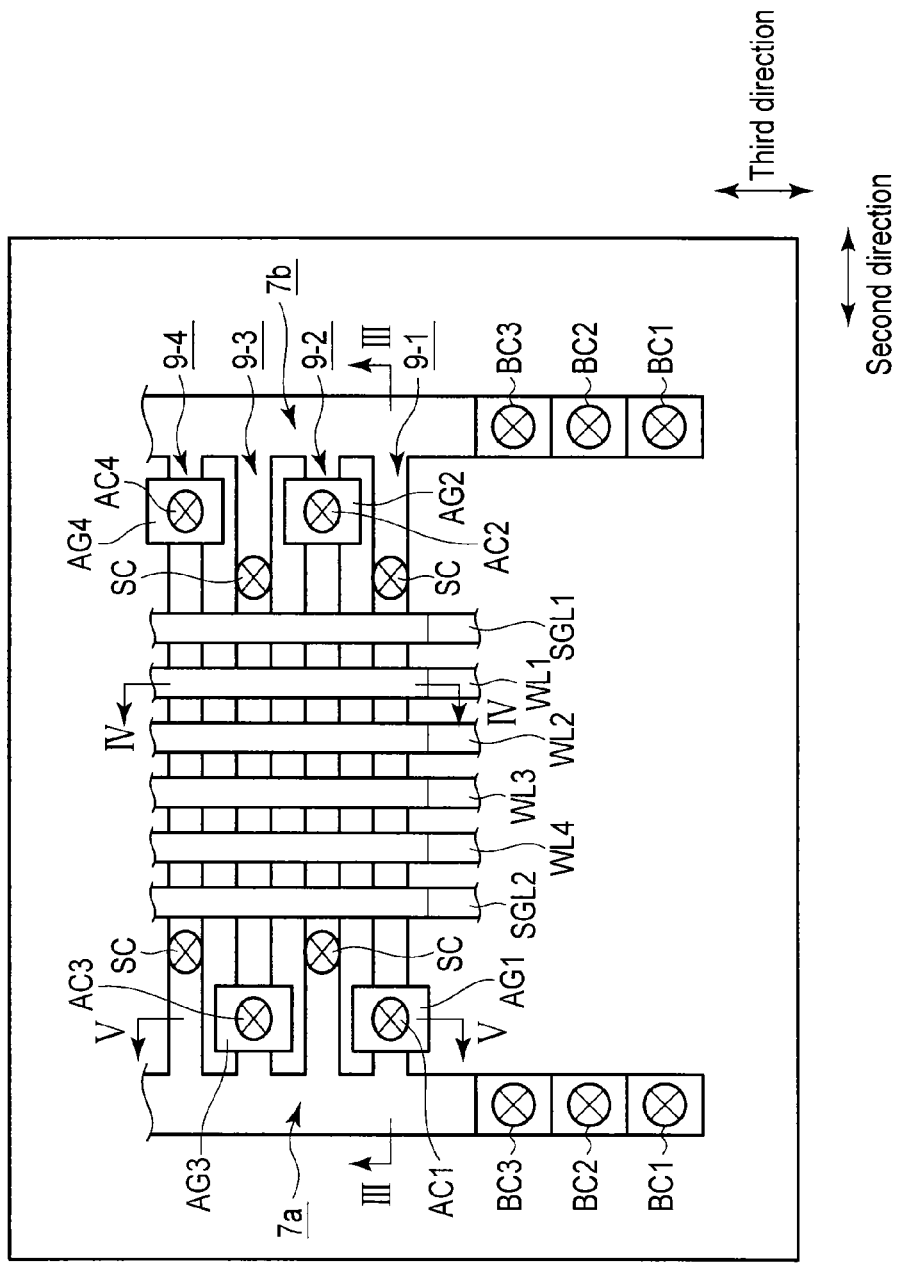
FIG. 2 is a plan view of FIG. 1.
Figure 3:
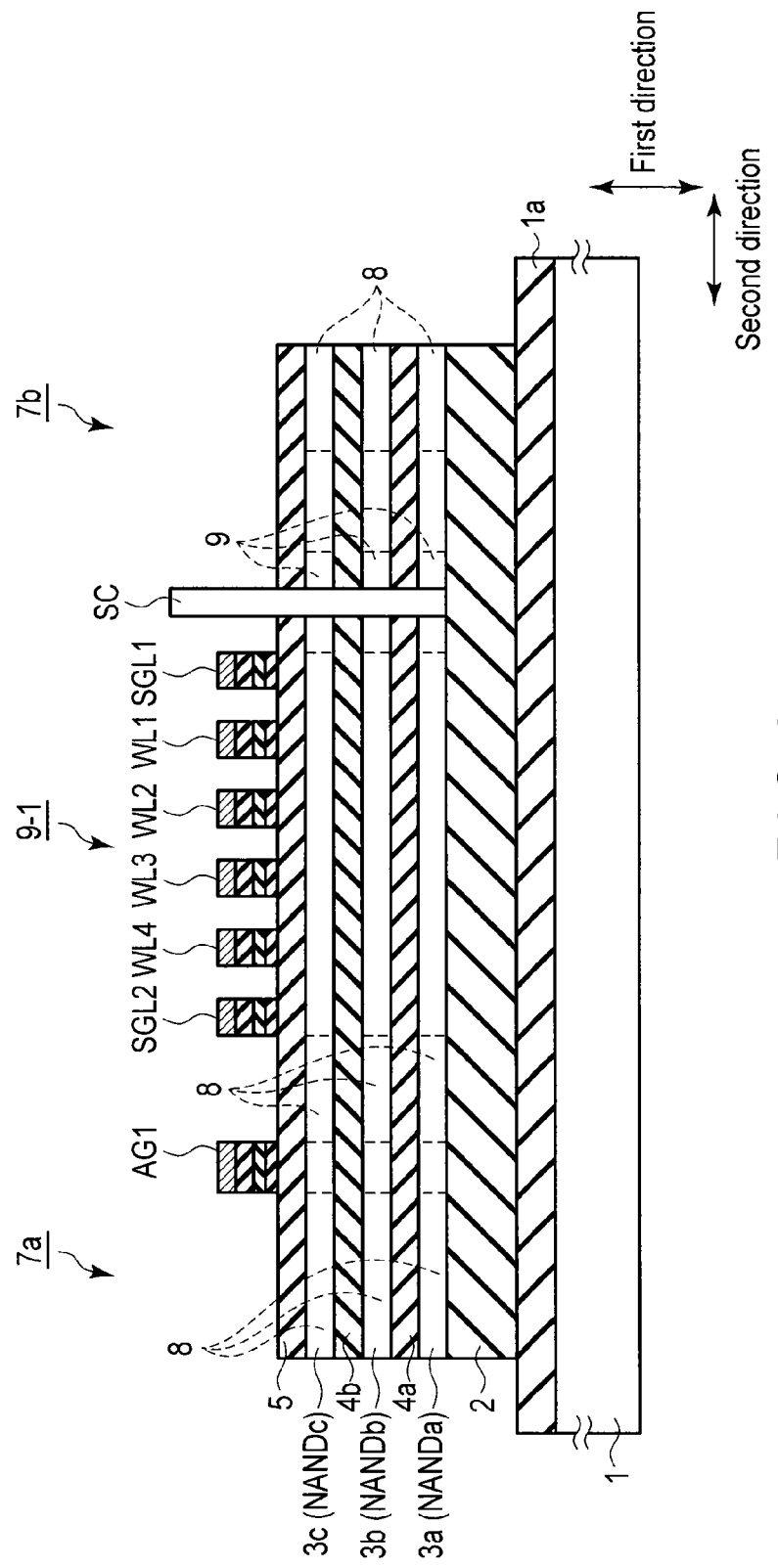
FIG. 3 is a sectional view taken along the line III-III of FIG. 2.

FIG. 1 is a perspective view of a nonvolatile semiconductor memory device. FIG. 2 is a plan view of FIG. 1. FIG. 3 is a sectional view taken along the line III-III of FIG. 2. FIG. 4 is a sectional view taken along the line IV-IV of FIG. 2. FIG. 5 is a sectional view taken along the line V-V of FIG. 2.

In these drawings, the shapes, dimensions, and ratios of elements are set mainly for clear understanding of the following explanation, and can be suitably changed.

For example, in the sectional views in FIG. 4 and FIG. 5, the distances between first to fourth fin type stacked structures 9-1, ... 9-4 in a third direction are about four times the widths of first to fourth fin type stacked structures 9-1, ... 9-4 in the third direction so that a stacked gate structure is more clearly shown. However, the distances between first to fourth fin type stacked structures 9-1, ... 9-4 in the third direction and the widths thereof in the third direction can be set to be equal.

Semiconductor substrate 1 is, for example, a silicon substrate. First, second, third, and fourth fin type stacked structures 9-1, ... 9-4 are formed on insulating layer 1a provided on semiconductor substrate 1.

Each of first to fourth fin type stacked structures 9-1, ... 9-4 has first, second, and third memory strings 3a (NANDa), 3b (NANDb), and 3c (NANDc) that are stacked in a first direction perpendicular to the surface of insulating layer 1a on semiconductor substrate 1. First to fourth fin type stacked structures 9-1, ... 9-4 extend in a second direction parallel to the surface of insulating layer 1a on semiconductor substrate 1.

First to fourth fin type stacked structures 9-1, ... 9-4 are arranged in the third direction which is parallel to the surface of insulating layer 1a and which is perpendicular to the first and second directions.

Although four fin type stacked structures are shown in this embodiment, the number of fin type stacked structures is not limited. n (n is a natural number equal to or more than 2) fin type stacked structures have only to be provided. Although three memory strings are shown in this embodiment, the number of memory strings is not limited. Each of first to fourth fin type stacked structures 9-1, ... 9-4 has only to have first to i-th memory strings (i is a natural number equal to or more than 2).

First to fourth fin type stacked structures 9-1, ... 9-4 are connected to one another at one end in the second direction by first portion 7a. First to fourth fin type stacked structures 9-1, ... 9-4 are connected to one another at the other end in the second direction by second portion 7b.

Both first and second portions 7a and 7b have the same stack structure as first to fourth fin type stacked structures 9-1, ... 9-4.

First to third memory strings NANDa, NANDb, and NANDc in odd fin type stacked structures 9-1 and 9-3 among first to fourth fin type stacked structures 9-1, ... 9-4 use first portion 7a as a drain region, and use the ends of first to third memory strings NANDa, NANDb, and NANDc on the side of second portion 7b as a source region.

First to third memory strings NANDa, NANDb, and NANDc in even fin type stacked structures 9-2 and 9-4 among first to fourth fin type stacked structures 9-1, ... 9-4 use second portion 7b as a drain region, and use the ends of first to third memory strings NANDa, NANDb, and NANDc on the side of first portion 7a as a source region.

That is, first to third memory strings NANDa, NANDb, and NANDc in odd fin type stacked structures 9-1 and 9-3 share first portion (drain region) 7a. First to third memory strings NANDa, NANDb, and NANDc in even fin type stacked structures 9-2 and 9-4 share second portion (drain region) 7b.

The source region of first to third memory strings NANDa, NANDb, and NANDc in odd fin type stacked structures 9-1 and 9-3 is insulated from second portion (drain region) 7b. The source region of first to third memory strings NANDa, NANDb, and NANDc in even fin type stacked structures 9-2 and 9-4 is insulated from first portion (drain region) 7a.

Each of first to third memory strings NANDa, NANDb, and NANDc comprises memory cells connected in series in the second direction, a source-side select gate transistor disposed on the source side of the memory cells, a drain-side select gate transistor disposed on the drain side of the memory cells, and an assist gate transistor disposed between the drain-side select gate transistor and first portion 7a or second portion 7b.

The memory cells comprise first to third semiconductor layers 3 (3a, 3b, and 3c), and a stacked gate structure disposed on the side surfaces of first to third semiconductor layers 3 (3a, 3b, and 3c) in the third direction. The stacked gate structure comprises first insulating layer 6a, charge storage layer 6b, second insulating layer 6c, and electrode layer 6d.

First insulating layer 6a functions as a gate insulating layer (tunnel insulating layer). Second insulating layer 6c functions as a block insulating layer which blocks a leak current between charge storage layer 6b and electrode layer 6d. Electrode layer 6d functions as a control gate electrode, and also functions as word lines WL1, ... WL4 extending on first to fourth fin type stacked structures 9-1, ... 9-4 in the third direction.

Although one memory string comprises four memory cells in this embodiment, one memory string does not exclusively comprise four memory cells. The number of memory cells to constitute one memory string has only to be k (k is a natural number equal to or more than 2) or more. In this case, the number of word lines is also k.

Similarly to the memory cells, the drain-side select gate transistor and the source-side select gate transistor each comprise first to third semiconductor layers 3 (3a, 3b, and 3c), and a stacked gate structure disposed on the side surfaces of first to third semiconductor layers 3 (3a, 3b, and 3c) in the third direction. The stacked gate structure comprises first insulating layer 6a, charge storage layer 6b, second insulating layer 6c, and electrode layer 6d.

First insulating layer 6a functions as a gate insulating layer. Electrode layer 6d functions as a select gate electrode, and also functions as select gate lines SGL1 and SGL2 extending on first to fourth fin type stacked structures 9-1, ... 9-4 in the third direction.

However, the drain-side select gate transistor and the source-side select gate transistor may be different in structure from the memory cells. For example, each of these transistors may have a metal/insulator/semiconductor (MIS) structure that comprises a gate insulating layer and a select gate electrode disposed on the gate insulating layer.

Similarly to the memory cells, the assist gate transistor also comprises first to third semiconductor layers 3 (3a, 3b, and 3c), and a stacked gate structure disposed on the side surfaces of first to third semiconductor layers 3 (3a, 3b, and 3c) in the third direction. The stacked gate structure comprises first insulating layer 6a, charge storage layer 6b, second insulating layer 6c, and electrode layer 6d.

First insulating layer 6a functions as a gate insulating layer. Electrode layer 6d functions as assist gate electrodes AG1, . . . AG4.

However, the assist gate transistor may also be different in structure from the memory cells. For example, the assist gate transistor may have a MIS structure that comprises a gate insulating layer and an assist gate electrode disposed on the gate insulating layer.

Assist gate electrodes AG1, . . . AG4 are electrically isolated from one another. Assist gate electrodes AG1, . . . AG4 are connected to assist gate lines AGL1, . . . AGL4 via contact plugs AC1, . . . AC4, respectively. This allows the assist gate transistor to have a function of selecting one of first to fourth fin type stacked structures 9-1, . . . 9-4.

More specifically, the ends of first and second portions 7a and 7b in the third direction, for example, has a staircase structure, so that the upper surfaces of first to third semiconductor layers 3 (3a, 3b, and 3c) are exposed. Parts of first to third semiconductor layers 3 (3a, 3b, and 3c) that expose their upper surfaces are bit line contact areas where first to third semiconductor layers 3 (3a, 3b, and 3c) are independently connected to bit lines BL1, BL2, and BL3 via contact plugs BC1, BC2, and BC3, respectively.

Therefore, one of first to fourth fin type stacked structures 9-1, . . . 9-4 can be selected by use of the assist gate transistor, and reading/writing/erasing can be performed in first to third memory strings NANDa, NANDb, and NANDc of the selected one fin type stacked structure.

Insulating layers 2, 4 (4a, 4b), and 5 isolate semiconductor layers 3 (3a, 3b, and 3c) from one another.

In this embodiment, impurity region (e.g., N-type diffusion layer) 8 is provided in first to third semiconductor layers 3 (3a, 3b, and 3c) of the assist gate transistor on the side of first or second portion 7a or 7b. This impurity region 8 is also provided in first to third semiconductor layers 3 (including the bit line contact areas) 3a, 3b, and 3c of first or second portion 7a or 7b.

Impurity region (e.g., N-type diffusion layer) 8 is also provided in first to third semiconductor layers 3 (3a, 3b, and 3c) of the assist gate transistor on the side of the memory cells.

Although, in this embodiment, electrode layer 6d has a double gate structure that covers two sides of first to third semiconductor layers 3 (3a, 3b, and 3c) in the third direction in the memory cells, the drain-side select gate transistor, the source-side select gate transistor, and the assist gate transistor, the present invention is not limited to this.

First to third memory strings NANDa, NANDb, and NANDc use first to third semiconductor layers 3 (3a, 3b, and 3c) as channels. Here, as one memory string use one semiconductor layer as a channel, increasing the number of semiconductor layers that constitutes one fin type stacked structure to increase the number of memory strings is preferable to higher integration.

First insulating layer 6a, charge storage layer 6b, second insulating layer 6c, and electrode layer 6d are separated in the second direction in the memory cells, the drain-side/source-side select gate transistors, and the assist gate transistor. However, first insulating layer 6a, charge storage layer 6b, and second insulating layer 6c may be united (continuous) throughout the memory cells, the drain-side/source-side select gate transistors, and the assist gate transistor.

However, at least electrode layer 6d needs to be separated in the memory cells, the drain-side/source-side select gate transistors, and the assist gate transistor.

In the meantime, the assist gate transistors are disposed at the ends of odd fin type stacked structures 9-1 and 9-3 on the side of first portion 7a, and disposed at the ends of even fin type stacked structures 9-2 and 9-4 on the side of second portion 7b.

That is, as a whole, at the ends of first to fourth fin type stacked structures 9-1, . . . 9-4 on the side of first portion 7a, the assist gate transistors are alternately disposed across first to fourth fin type stacked structures 9-1, . . . 9-4 in the third direction. Similarly, at the ends of first to fourth fin type stacked structures 9-1, . . . 9-4 on the side of second portion 7b, the assist gate transistors are alternately disposed across first to fourth fin type stacked structures 9-1, . . . 9-4 in the third direction.

This makes it possible to reduce the pitch (or spaces) of first to fourth fin type stacked structures 9-1, . . . 9-4 in the third direction, and contribute to higher integration.

The source region of first to third memory strings NANDa, NANDb, and NANDc comprises impurity region (e.g., N-type diffusion layer) 9 in first to third semiconductor layers 3 (3a, 3b, and 3c) of the memory cells on the side of first or second portion 7a or 7b. Impurity region 9 as the source region is connected to source line SL via contact plug SC.

Here, the source region of first to third memory strings NANDa, NANDb, and NANDc is disposed closer to the memory cells than a line that connects assist gate electrodes AG1, . . . AG4 in the third direction.

Thus, during the patterning of assist gate electrodes AG1, . . . AG4, damage may be caused to first to third semiconductor layers 3 (3a, 3b, and 3c) in second and fourth fin type stacked structures 9-2 and 9-4 adjacent to assist gate electrodes AG1 and AG3 in the third direction, and to first to third semiconductor layers 3 (3a, 3b, and 3c) in first and third stack structures 9-1 and 9-3 adjacent to assist gate electrodes AG2 and AG4 in the third direction. Nevertheless, such damage is out of channel paths (current paths) of first to third memory strings NANDa, NANDb, and NANDc and has no adverse effect on the read/write/erase operation.

Figure 27:
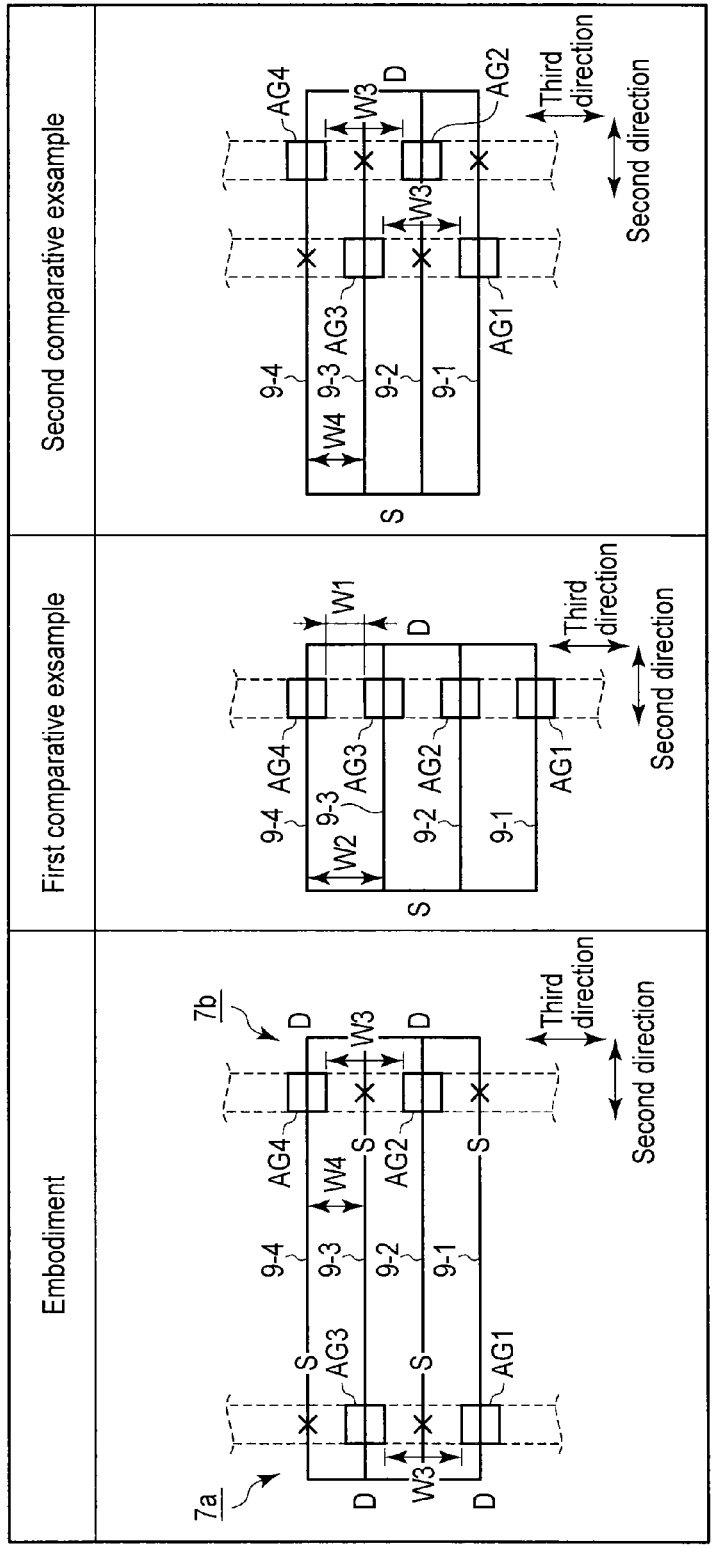
FIG. 27 is a diagram showing advantages of first to third embodiments.

The above-mentioned advantages are specifically described with reference to FIG. 27.

In a first comparative example, one end of first to fourth fin type stacked structures 9-1, . . . 9-4 is drain D, and the other end thereof is drain D, and the other end thereof is source S. Assist gate electrodes AG1, . . . AG4 are collectively disposed at one end (drain D) of first to fourth fin type stacked structures 9-1, . . . 9-4, and are aligned in the third direction.

In this case, the space between assist gate electrodes AG1, . . . AG4 should be set at size W1 sufficient to pattern the assist gate electrodes. Accordingly, space W2 between first to fourth fin type stacked structures 9-1, . . . 9-4 also increases.

In a second comparative example, as in the first comparative example, one end of first to fourth fin type stacked structures 9-1, . . . 9-4 is drain D, and the other end thereof is drain D, and the other end thereof is drain D. Assist gate electrodes AG1, . . . AG4 are collectively disposed at one end (drain D) of first to fourth fin type stacked structures 9-1, . . . 9-4.

However, assist gate electrodes AG1 and AG3 and assist gate electrodes AG2 and AG4 are shifted a predetermined distance in the second direction. That is, assist gate electrodes AG1, . . . AG4 are arranged in the form of a zigzag pattern in the third direction.

In this case, space W3 between assist gate electrodes AG1 and AG3 can be greater, and space W3 between assist gate electrodes AG2 and AG4 can be greater. This makes it possible to decrease space W4 between first to fourth fin type stacked structures 9-1, . . . 9-4 and contribute to higher integration.

However, during the patterning of assist gate electrodes AG1, . . . AG4 (during the change from dotted lines to square patterns), damage (indicated by x marks) is caused to first to fourth fin type stacked structures 9-1, . . . 9-4. This damage is caused between drain D and source S of the memory string, that is, in the channel path (current path) of the memory string, and therefore has an adverse effect on the read/write/erase operation.

In the embodiment, in odd fin type stacked structures 9-1 and 9-3, the side of first portion 7a is drain D, and the side of second portion 7b is source S. In even fin type stacked structures 9-2 and 9-4, the side of second portion 7b is drain D, and the side of first portion 7a is source S. That is, the relation between drain D and source S of odd fin type stacked structures 9-1 and 9-3 is opposite to that of even fin type stacked structures 9-2 and 9-4.

Source S is disposed closer to the memory cells than the line that connects assist gate electrodes AG1, . . . AG4 in the third direction.

In this case, space W3 between assist gate electrodes AG1 and AG3 can be greater, and space W3 between assist gate electrodes AG2 and AG4 can be greater. This makes it possible to decrease space W4 between first to fourth fin type stacked structures 9-1, . . . 9-4 and contribute to higher integration.

During the patterning of assist gate electrodes AG1, . . . AG4 (during the change from dotted lines to square patterns), damage (indicated by x marks) is caused to first to fourth fin type stacked structures 9-1, . . . 9-4. However, this damage is caused outside the area between drain D and source S of the memory string, that is, in the area outside the channel path (current path) of the memory string, and therefore has no adverse effect on the read/write/erase operation.

For example, the damage (defects in the semiconductor layers) caused in first to fourth fin type stacked structures 9-1, . . . 9-4 increases the parasitic resistance of the channel of the memory string, and therefore reduces the current running through the channel during reading/writing and reduces the reading/writing speed. However, this problem does not occur if the damage is outside the channel path of the memory string.

B. Material Examples

Materials best suited to the generations of semiconductor memories can be properly selected as the materials that constitute the elements of the device structure shown in FIG. 1 to FIG. 5.

For example, first insulating layer 2 is made of silicon oxide ($SiO_2$). First to third semiconductor layers 3 (3a, 3b, and 3c) are made of, for example, monocrystalline silicon (Si). First to third semiconductor layers 3 (3a, 3b, and 3c) are preferably monocrystalline, but may be amorphous or polycrystalline.

Second and third insulating layers 4 (4a and 4b) are made of, for example, silicon oxide ($SiO_2$). Fourth insulating layer 5 is made of, for example, silicon oxide ($SiO_2$), silicon nitride ($SiN_x$), or a structure in which these materials are stacked.

Each of first to third memory strings NANDa, NANDb, and NANDc has a silicon/oxide/nitride/oxide/silicon (SONOS) structure.

First gate insulating layer 6a can be made of $SiO_2$, charge storage layer 6b can be made of $Si_3N_4$, second gate insulating layer 6c can be made of $Al_2O_3$, and control gate electrode 6d can be made of NiSi.

First gate insulating layer 6a may be, for example, silicon oxynitride, or a stack structure of silicon oxide and silicon nitride. First gate insulating layer 6a may also include, for example, silicon nanoparticles, or metal ions.

Charge storage layer 6b can be made of at least one of the materials selected from the group consisting of silicon-rich SiN, $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia oxynitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

Charge storage layer 6b may include silicon nanoparticles or metal ions. Charge storage layer 6b may otherwise be made of impurity-added polysilicon or a conductor such as a metal.

Second gate insulating layer 6c can be made of at least one of the materials selected from the group consisting of silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia oxynitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

Electrode layer 6d can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, Er and silicides of these substances.

As an impurity to constitute impurity regions 8 and 9, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Contact plugs BC1, BC2, BC3, AC1, . . . AC4, and SC, bit lines BL1, BL2, and BL3, assist gate lines AGL1, . . . AGL4, and source line SL can be made of, for example, a metal material such as W or Al.

Contact plugs BC1, BC2, BC3, AC1, . . . AC4, and SC, bit lines BL1, BL2, and BL3, assist gate lines AGL1, . . . AGL4, and source line SL can be made of the same material or different materials.

Bit lines BL1, BL2, and BL3, and assist gate lines AGL1, . . . AGL4 can be formed in the same wiring layer, and are therefore preferably made of the same material.

C. Modification

C.-1. First Modification

FIG. 6 shows a first modification of the device structure shown in FIG. 1 to FIG. 5.

Here, the same elements as those in FIG. 1 to FIG. 5 are provided with the same signs and are not described in detail.

This modification is characterized in that bit line contact areas with the staircase structure are provided at the ends of first and second portions 7a and 7b in the second direction.

In this case, the distance between contact plugs BC1, BC2, and BC3 and all fin type stacked structures (in this example, first to fourth fin type stacked structures 9-1, . . . 9-4) can be equal by adjusting the sizes and number of contact plugs BC1, BC2, and BC3. This can reduce characteristic variations among the fin type stacked structures in the read/write/erase operation.

C.-2. Second Modification

Figure 7:
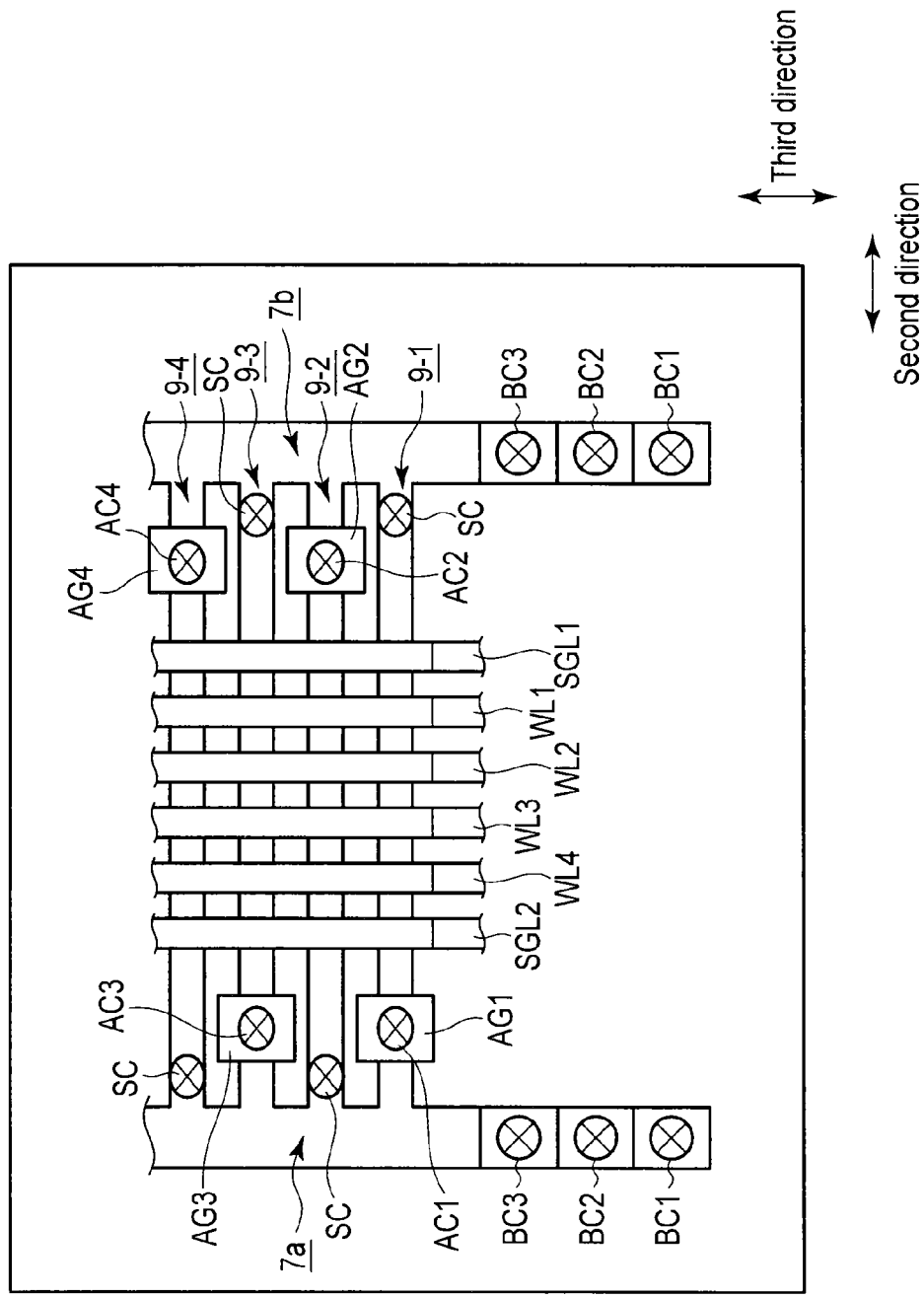
FIG. 7 is a plan view showing a second modification.

FIG. 7 shows a second modification of the device structure shown in FIG. 1 to FIG. 5.

Here, the same elements as those in FIG. 1 to FIG. 5 are provided with the same signs and are not described in detail.

This modification is characterized in that a source (contact plug SC) is positioned closer to first or second portion 7a or 7b than the line that connects assist gate electrodes AG1, . . . AG4 in the third direction.

In this case, as has already been described, damage may be caused to the channel path (current path) of the memory string. However, when the damage in the semiconductor layers can be reduced by the enhancement of an etching technique or by the enhancement of process technology in, for example, a post-etching treatment, the structure shown in the second modification can be sufficiently practically used.

C.-3. Third Modification

Figure 8:
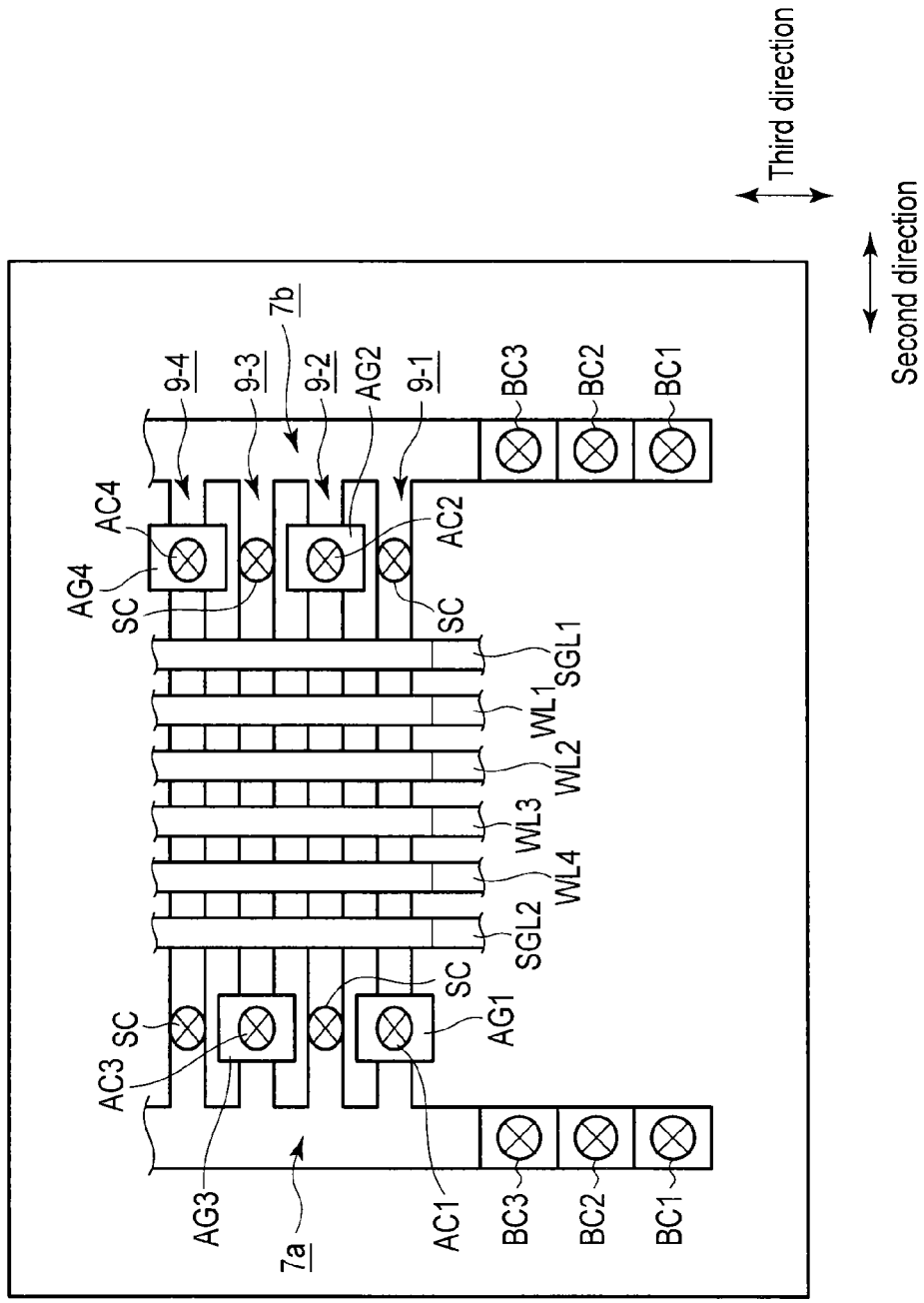
FIG. 8 is a plan view showing a third modification.

FIG. 8 shows a third modification of the device structure shown in FIG. 1 to FIG. 5.

Here, the same elements as those in FIG. 1 to FIG. 5 are provided with the same signs and are not described in detail.

This modification is characterized in that a source (contact plug SC) is positioned on the line that connects assist gate electrodes AG1, . . . AG4 in the third direction.

In this case, for example, as apparent from FIG. 3, contact plug SC pierces first to third semiconductor layers 3 (3a, 3b, and 3c). That is, when a contact hole for forming contact plug SC is made, the damage caused in the channel path (current path) of the memory string is removed.

Thus, there is no adverse effect on the read/write/erase operation, and the structure shown in the third modification can also be sufficiently practically used.

D. Memory Cell Array Structure

FIG. 9 shows a memory cell array that uses the device structure shown in FIG. 1 to FIG. 5.

Here, the same elements as those in FIG. 1 to FIG. 5 are provided with the same signs and are not described in detail.

The memory cell array comprises m (m is a natural number equal to or more than 2, e.g., m=16, 32, 64 . . . ) fin type stacked structures which are arranged in the third direction and which have the same structure as first to fourth fin type stacked structures 9-1, . . . 9-4 shown in FIG. 1 to FIG. 5. m assist gate lines AGL1, . . . AGLm correspond to the m fin type stacked structures.

As both ends of first and second portions 7a and 7b in the third direction has a staircase structure, bit line contact areas are provided at both ends of first and second portions 7a and 7b in the third direction. However, first and second portions 7a and 7b can have the staircase structure at one end only in the third direction, and bit line contact areas can be provided at these ends.

In such a memory cell array structure, for example, a group including fin type stacked structures arranged in the third direction is defined as one block. In this embodiment, two blocks BK1 and BK2 are shown.

In this case, m fin type stacked structures in block BK1 are connected to bit lines BL1, BL2, and BL3, respectively. m fin type stacked structures in block BK2 are connected to bit lines BL4, BL5, and BL6, respectively. m assist gate lines AGL1, . . . AGLm are provided in two common blocks BK1 and BK2.

Thus, reading/writing/erasing can be simultaneously performed in one selected fin type stacked structure within block BK1 and in one selected fin type stacked structure within block BK2.

In the memory cell array structure of this embodiment, the number of memory strings in one block is (the number of memory strings in one fin type stacked structure)×(the number of columns m). Therefore, a three-dimensionally stacked semiconductor memory having a high memory capacity can be obtained.

E. Operation

An example of the operation of the nonvolatile semiconductor memory device of the first embodiment (FIG. 1 to FIG. 9) is described.

An example of write operation is as follows.

It is assumed that memory strings NANDa, NANDb, and NANDc in first fin type stacked structure 9-1 are selected and writing is simultaneously performed in these memory strings.

First, a ground potential is applied to bit lines BL1, BL2, and BL3 and source line SL, and in this condition, a first positive bias is applied to all word lines WL1, . . . WL4. At the same time, N-type impurity storage regions are formed in first to third semiconductor layers 3a, 3b, and 3c serving as channels of first to third memory strings NANDa, NANDb, and NANDc.

Furthermore, the potential of assist gate line AGL1 is set to, for example, "H", and the assist gate transistor in first fin type stacked structure 9-1 is switched on. In order to keep the potentials of assist gate lines AGL2, . . . AGL4 at, for example, "L", the assist gate transistors in second to fourth fin type stacked structures 9-2, . . . 9-4 are off.

Here, "H" is defined as a potential for switching on the transistor, and "L" is defined as a potential for switching off the transistor. The same applies to the following cases.

Subsequently, for example, a second positive bias higher than the first positive bias is applied to word line (control gate electrode) WL-select of the selected memory cell targeted for writing, and program data "0"/"1" is transferred to the channels of first to third memory strings NANDa, NANDb, and NANDc in first fin type stacked structure 9-1 from bit lines BL1, BL2, and BL3.

In first to third memory strings NANDa, NANDb, and NANDc in second to fourth fin type stacked structures 9-2, . . . 9-4, the channel potential is increased by capacitive coupling resulting from the application of the second positive bias. Therefore, a voltage high enough for writing is not applied across the control gate electrode (or charge storage layer) and the channel, and writing is inhibited accordingly.

In first to third memory strings NANDa, NANDb, and NANDc in first fin type stacked structure 9-1, the assist gate transistors are on, so that program data "0"/"1" is transferred to first to third semiconductor layers 3a, 3b, and 3c as the channels.

When the program data is "0", the channel, for example, has a positive potential. In this condition, if the second positive bias is applied to the control gate electrode of the selected memory cell, the drain-side select gate transistor is cut off when the channel potential is slightly increased by the capacitive coupling.

Therefore, in the memory string to which the program data "0" is transferred, the channel potential is increased by the capacitive coupling resulting from the application of the second positive bias. That is, a voltage high enough for writing is not applied across the control gate electrode (or charge storage layer) and the channel, and electrons are not injected into the charge storage layer. That is, writing is inhibited ("0"-programming).

In contrast, when the program data is "1", the channel, for example, has a ground potential. In this condition, even if the second positive bias is applied to the control gate electrode of the selected memory cell, the drain-side select gate transistor is not cut off.

Therefore, in the memory string to which the program data "1" is transferred, a voltage high enough for writing is generated across the control gate electrode (or charge storage layer) and the channel, and electrons are injected into the charge storage layer. That is, writing is performed ("1"-programming).

An example of erase operation is as follows.

The erase operation can be simultaneously performed in, for example, first to third memory strings NANDa, NANDb, and NANDc in selected one or more fin type stacked structures.

First, a ground potential is applied to bit lines BL1, BL2, and BL3 and source line SL, and a first negative bias is applied to select gate lines SGL1 and SGL2 and word lines WL1, . . . WL4. At the same time, P-type impurity storage regions are formed in first to third semiconductor layers 3a, 3b, and 3c serving as channels of first to third memory strings NANDa, NANDb, and NANDc.

Furthermore, the potential of the assist gate line corresponding to selected one or more fin type stacked structures targeted for erasing is set to "H", and the assist gate transistor corresponding to selected one or more fin type stacked structures is switched on.

A second negative bias higher than the first negative bias is then applied to all word lines WL1, . . . WL4.

As a result, a voltage high enough for erasing is generated across the control gate electrode (or charge storage layer) and the channel, and electrons in the charge storage layer are discharged to the channel. Thus, erasing is performed.

An example of read operation is as follows.

It is assumed that memory strings NANDa, NANDb, and NANDc in first fin type stacked structure 9-1 are selected and reading is simultaneously performed in these memory strings.

First, a reading circuit is connected to bit lines BL1, BL2, and BL3, and a ground voltage is applied to source line SL. The potential of assist gate line AGL1 is set to, for example, "H", and the assist gate transistor in first fin type stacked structure 9-1 is switched on. In order to keep the potentials of assist gate lines AGL2, . . . AGL4 at, for example, "L", the assist gate transistors in second to fourth fin type stacked structures 9-2, . . . 9-4 are off.

A first positive bias is applied to select gate lines SGL1 and SGL2 and word lines WL1, . . . WL4. The first positive bias has a value that the memory cells turn on regardless of whether data in the memory cells is "0" or "1".

Subsequently, data is sequentially read in first to third memory strings NANDa, NANDb, and NANDc from the memory cells on the source region side to the memory cells on the drain region side.

In the selected memory cell targeted for reading, for example, a second positive bias for reading lower than the first positive bias is applied to the control gate electrode. The second positive bias has, for example, a value between the threshold of the "0"-data and the threshold of the "1"-data.

Therefore, whether to switch on or off the selected memory cell is determined by the value of the data stored in the selected memory cell, so that reading can be performed by using the reading circuit to detect potential changes in bit lines BL1, BL2, and BL3 and changes in currents running through bit lines BL1, BL2, and BL3.

F. Example of Method of Manufacturing the Structure Shown in FIG. 1 to FIG. 9

FIG. 10A to FIG. 10D show a method of manufacturing the structure shown in FIG. 1 to FIG. 9.

Figure 10A:
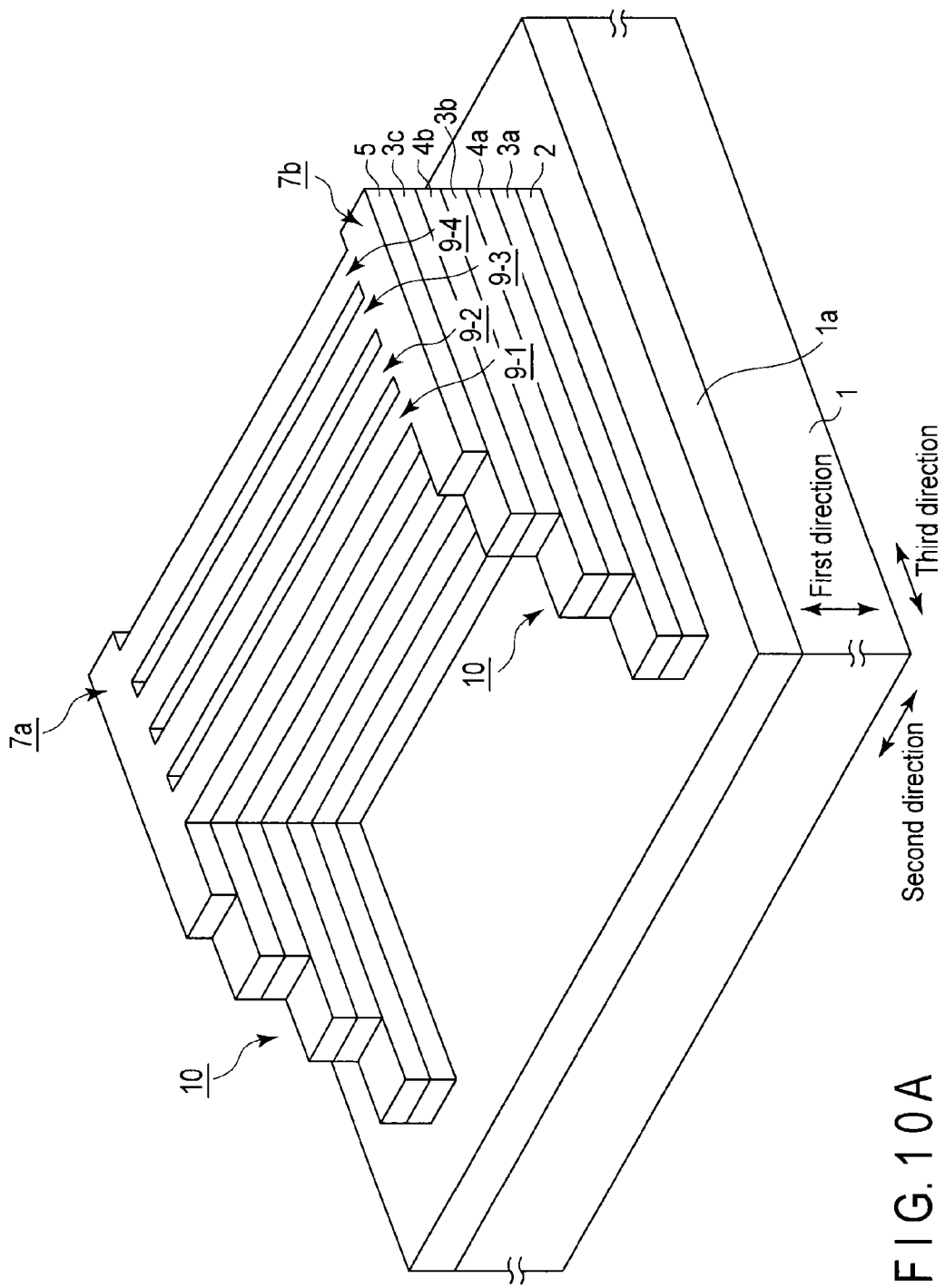

First, as shown in FIG. 10A, bit line contact area 10 with a staircase structure, first to fourth fin type stacked structures 9-1, . . . 9-4, and first and second portions 7a and 7b are formed.

Bit line contact area 10 is formed, for example, as follows.

First, first-conductivity-type (e.g., P-type) semiconductor substrate (e.g., silicon) 1 having, for example, a plane direction (100) and a specific resistance of 10 to 20 Ωcm is prepared. On this semiconductor substrate 1, element isolation insulating layer 1a and first insulating layer 2 are formed, and first semiconductor layer (e.g., silicon) 3a is formed on first insulating layer 2.

A resist pattern is then formed on first semiconductor layer 3a by a photo engraving process (PEP). Ions are implanted using this resist pattern as a mask, thereby forming an impurity region in first semiconductor layer 3a. The resist pattern is removed afterwards.

A resist pattern is again formed on first semiconductor layer 3a by the PEP. Reactive ion etching (RIE) is performed using this resist pattern as a mask, thereby patterning first semiconductor layer 3a and first insulating layer 2. The resist pattern is removed afterwards.

Second insulating layer 4a and second semiconductor layer 3b are then formed on first semiconductor layer 3a. A resist pattern is then formed on second semiconductor layer 3b by the PEP. Ions are implanted using this resist pattern as a mask, thereby forming an impurity region in second semiconductor layer 3b. The resist pattern is removed afterwards.

A resist pattern is again formed on second semiconductor layer 3b by the PEP. The RIE is performed using this resist pattern as a mask, thereby patterning second semiconductor layer 3b and second insulating layer 4a. The resist pattern is removed afterwards.

Third insulating layer 4b and third semiconductor layer 3c are then formed on second semiconductor layer 3b. A resist pattern is then formed on third semiconductor layer 3c by the PEP. Ions are implanted using this resist pattern as a mask, thereby forming an impurity region in third semiconductor layer 3c. The resist pattern is removed afterwards.

A resist pattern is again formed on third semiconductor layer 3c by the PEP. The RIE is performed using this resist pattern as a mask, thereby patterning third semiconductor layer 3c and third insulating layer 4b. The resist pattern is removed afterwards.

Finally, fourth insulating layer 5 is formed on third semiconductor layer 3c. A resist pattern is formed on fourth insulating layer 5 by the PEP. The RIE is performed using this resist pattern as a mask, thereby patterning fourth insulating layer 5. The resist pattern is removed afterwards.

In the process described above, bit line contact area 10 with a staircase structure is formed at the end in the third direction.

Furthermore, etching is performed to obtain first to fourth fin type stacked structures 9-1, . . . 9-4, and first and second portions 7a and 7b.

That is, a resist pattern is formed on fourth insulating layer 5 by the PEP. The RIE is performed using this resist pattern as a mask, thereby patterning fourth insulating layer 5, third semiconductor layer 3c, third insulating layer 4b, second semiconductor layer 3b, second insulating layer 4a, first semiconductor layer 3a, and first insulating layer 2.

As a result, first to fourth fin type stacked structures 9-1, . . . 9-4, and first and second portions 7a and 7b are formed on element isolation insulating layer 1a on semiconductor substrate 1. The resist pattern is removed afterwards.

Furthermore, as shown in FIG. 10B, a stacked gate structure is formed. The stacked gate structure comprises, for example, a first insulating layer, a charge storage layer, a second insulating layer, and an electrode layer.

A resist pattern is again formed on this stacked gate structure. The RIE is performed using this resist pattern as a mask, thereby forming word lines WL1, . . . WL4, select gate lines SGL1 and SGL2, and assist gate electrode AG. The resist pattern is removed afterwards.

It should be understood that at this point, assist gate electrode AG is disposed across first to fourth fin type stacked structures 9-1, . . . 9-4.

Figure 10C:
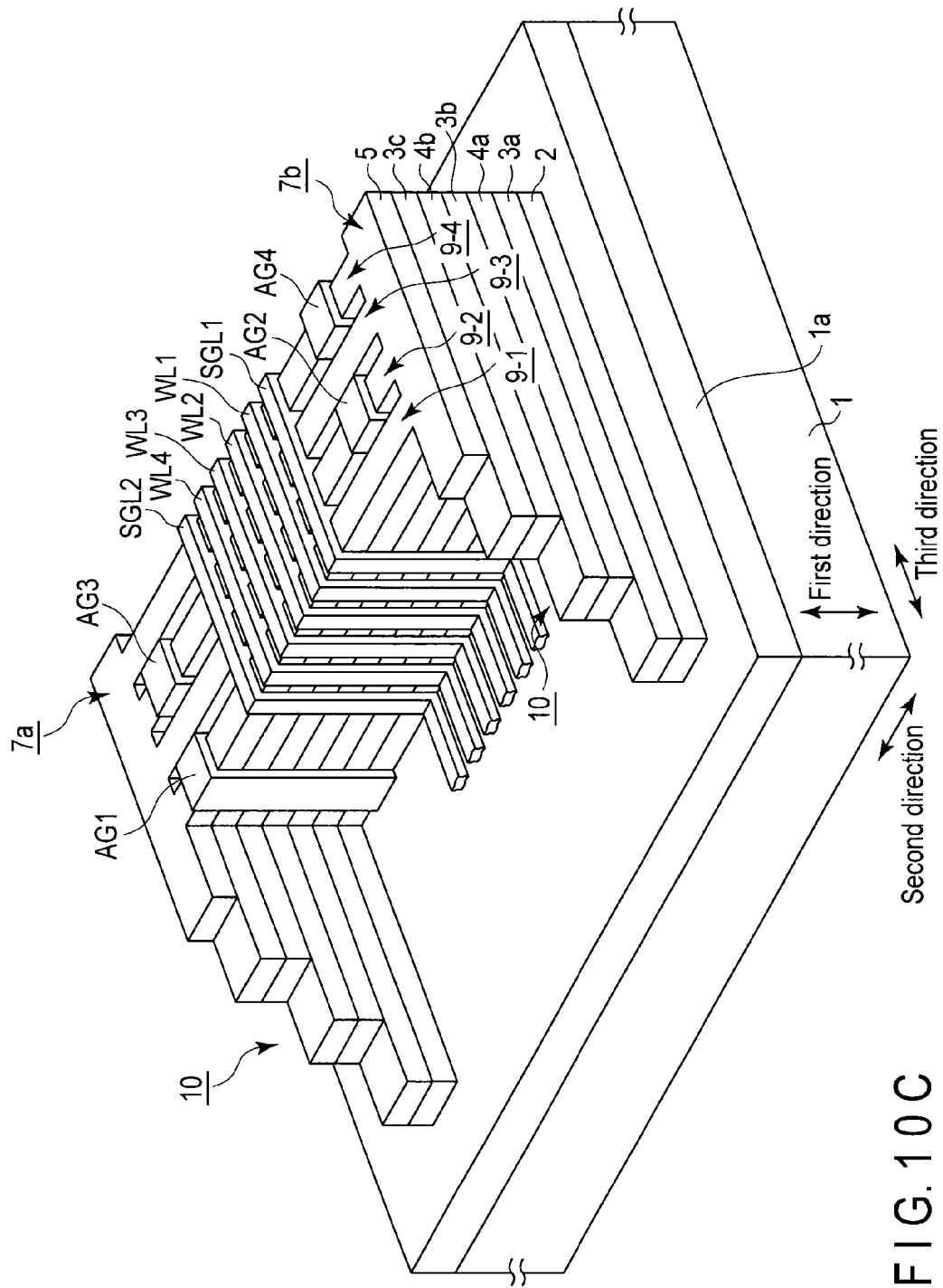

Thus, as shown in FIG. 10C, a resist pattern is again formed on the stacked gate structure. This resist pattern is used as a mask to etch assist gate electrode AG in FIG. 10B, such that assist gate electrodes AG1, . . . AG4 of first to fourth fin type stacked structures 9-1, . . . 9-4 are electrically isolated from one another. The resist pattern is removed afterwards.

Although assist gate electrodes AG1, . . . AG4 are patterned by two etchings in this embodiment, assist gate electrodes AG1, . . . AG4 of first to fourth fin type stacked structures 9-1, . . . 9-4 can be electrically isolated from one another, for example, by one etching in the process in FIG. 10B.

Before the PEP process in FIG. 10A to FIG. 10C, the base for this process can be planarized by chemical mechanical processing (CMP). In this case, in FIG. 10A, an insulating film of, for example, $SiO_2$ may be deposited before the CMP.

Furthermore, as shown in FIG. 10D, contact plugs BC1, BC2, and BC3 are formed on first to third semiconductor layers 3a, 3b, and 3c in bit line contact area 10, contact plugs AC1, . . . AC4 are formed on assist gate electrodes AG1, . . . AG4, and contact plug SC is formed on the source region.

Moreover, bit lines BL1, BL2, and BL3 are formed on contact plugs BC1, BC2, and BC3, assist gate lines AGL2, . . . AGL4 are formed on contact plugs AC1, . . . AC4, and source line SL is formed on contact plug SC.

The structure shown in FIG. 1 to FIG. 9 is completed in the process described above.

G. Summary

According to the first embodiment, adjacent two fin type stacked structures are combined together by the first and second portions. One of the two fin type stacked structures uses the first portion as the drain region, and the other fin type stacked structure uses the second portion as the drain region. That is, the even fin type stacked structure and the odd fin type stacked structure are different in the direction of the memory string (the relation between the source region and the drain region).

It is thus possible to increase the pitch of the assist gate electrodes and reduce the pitch of the fin type stacked structures, and achieve higher integration of the nonvolatile semiconductor memory device. As the processing of the assist gate electrodes is facilitated, it is also possible to contribute to higher reliability. Moreover, the source region of one of the two fin type stacked structures is located at the same position as the assist gate electrode of the other of the two fin type stacked structures or located closer to the memory cells, so that reliability is further enhanced.

2. Second Embodiment

A. Structure

Figure 12:
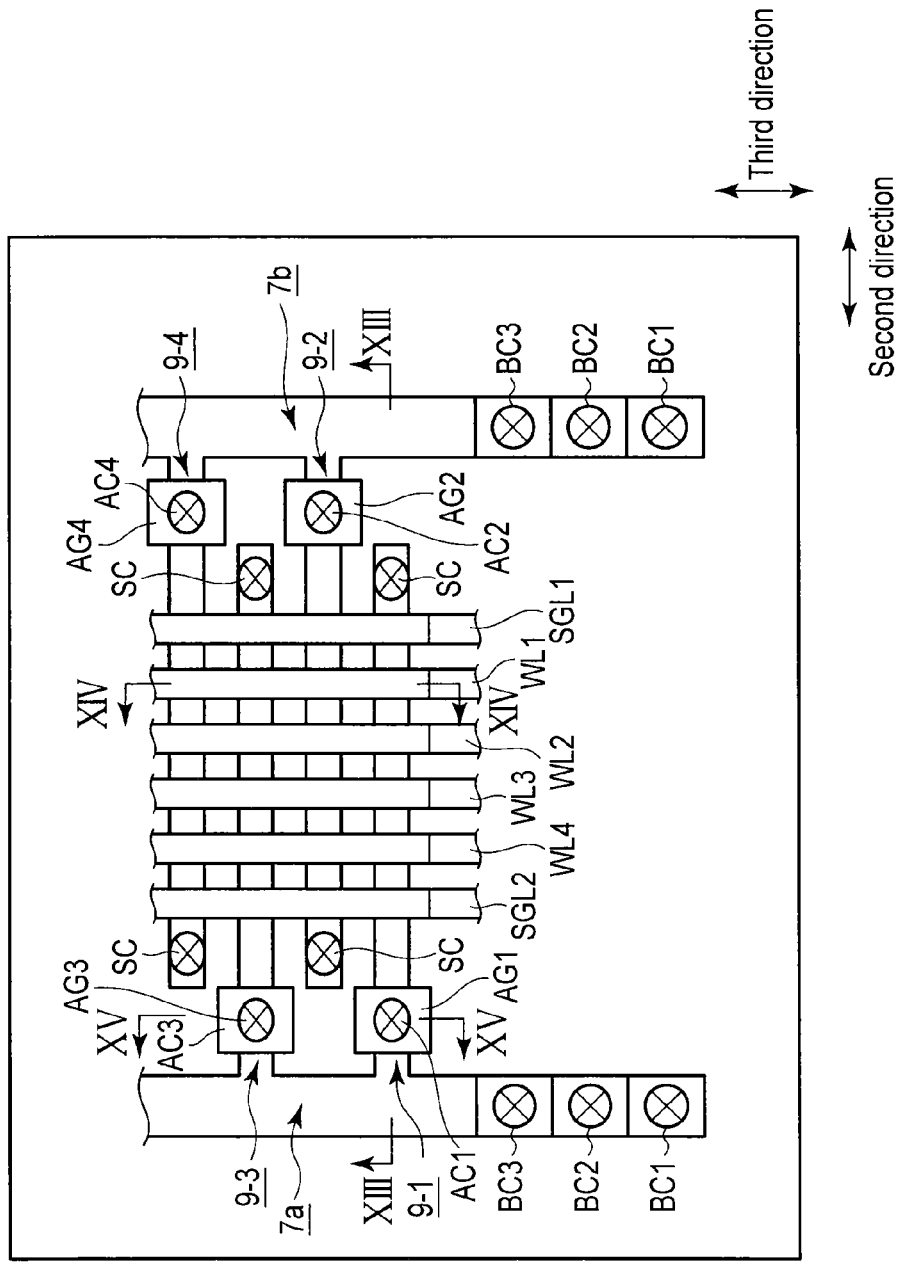
FIG. 12 is a plan view of FIG. 11.
Figure 13:
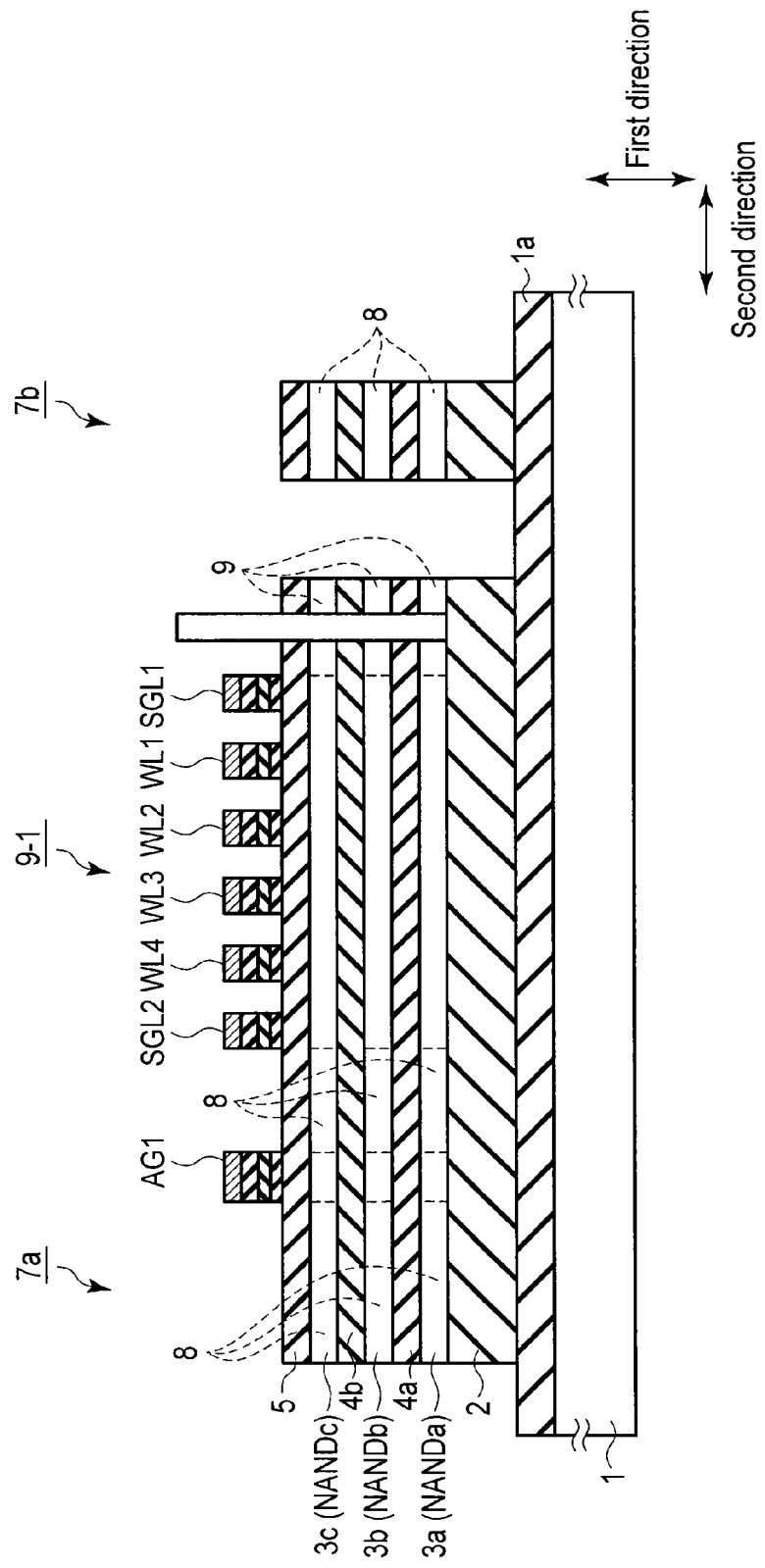
FIG. 13 is a sectional view taken along the line XIII-XIII of FIG. 12.

FIG. 11 is a perspective view of a nonvolatile semiconductor memory device. FIG. 12 is a plan view of the device of FIG. 11. FIG. 13 is a sectional view taken along the line XIII-XIII of FIG. 12. FIG. 14 is a sectional view taken along the line XIV-XIV of FIG. 12. FIG. 15 is a sectional view taken along the line XV-XV of FIG. 12.

In these drawings, the shapes, dimensions, and ratios of elements are set mainly for clear understanding of the following explanation, and can be suitably changed.

For example, in the sectional views in FIG. 14 and FIG. 15, the distances between first to fourth fin type stacked structures 9-1, . . . 9-4 in a third direction are about four times the widths of first to fourth fin type stacked structures 9-1, . . . 9-4 in the third direction so that a stacked gate structure is more clearly shown. However, the distances between first to fourth fin type stacked structures 9-1, . . . 9-4 in the third direction and the widths thereof in the third direction can be set to be equal.

The structure of the second embodiment (FIG. 11 to FIG. 15) is a modification of the structure of the first embodiment (FIG. 1 to FIG. 5). Thus, in the second embodiment, the same elements as those in the first embodiment are provided with the same signs and are not described in detail.

The structure of the second embodiment is characterized in that odd fin type stacked structures 9-1 and 9-3 are apart from second portion 7b at the other end in a second direction and even fin type stacked structures 9-2 and 9-4 are apart from first portion 7a at the other end in the second direction.

That is, even fin type stacked structures 9-2 and 9-4 are not present on a line that connects assist gate electrodes AG1 and AG3 in odd fin type stacked structures 9-1 and 9-3. Moreover, odd fin type stacked structures 9-1 and 9-3 are not present on a line that connects assist gate electrodes AG2 and AG4 in even fin type stacked structures 9-2 and 9-4.

According to this structure, the source region at the other end of odd fin type stacked structures 9-1 and 9-3 in the second direction can be completely insulated from second portion 7b which is the drain region of even fin type stacked structures 9-2 and 9-4. It is thus possible to prevent the generation of an unintended current path (leak current) between the source region and the drain region.

Similarly, the source region at the other end of even fin type stacked structures 9-2 and 9-4 in the second direction can be completely insulated from first portion 7a which is the drain region of odd fin type stacked structures 9-1 and 9-3. It is thus possible to prevent the generation of an unintended current path (leak current) between the source region and the drain region.

According to the structure in the second embodiment, wrong operation during reading/writing/erasing caused by the leak current can be prevented, and reliability is further enhanced.

B. Material Examples

Materials best suited to the generations of semiconductor memories can be properly selected as the materials that constitute the elements of the device structure shown in FIG. 11 to FIG. 15.

Material examples are the same as those in the first embodiment, and are therefore not described here.

C. Modification

Figure 16:
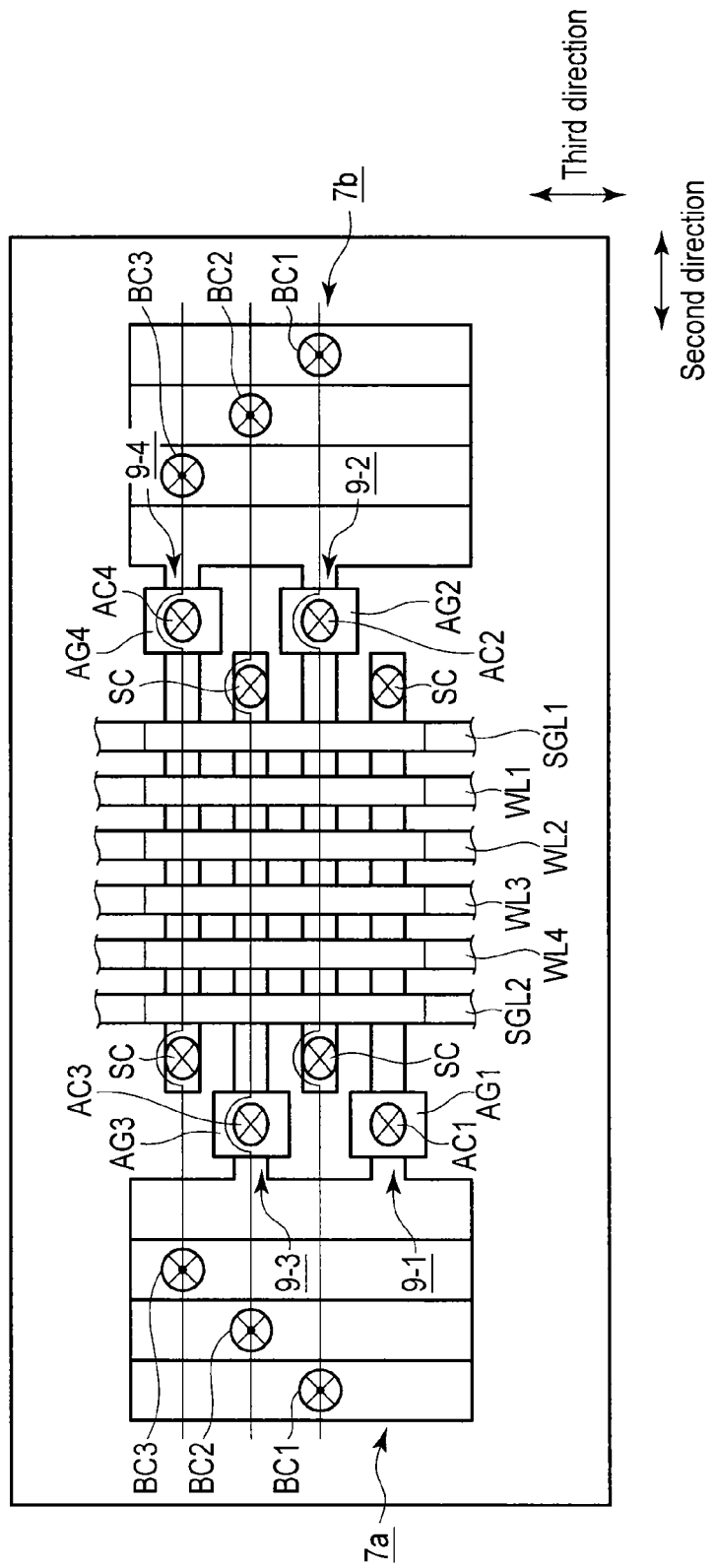
FIG. 16 is a plan view showing a modification.

FIG. 16 shows a modification of the device structure shown in FIG. 11 to FIG. 15. Here, the same elements as those in FIG. 11 to FIG. 15 are provided with the same signs and are not described in detail.

This modification is characterized in that bit line contact areas with a staircase structures are provided at the ends of first and second portions 7a and 7b in the second direction.

In this case, the distance between contact plugs BC1, BC2, and BC3 and all fin type stacked structures (in this example, first to fourth fin type stacked structures 9-1, . . . 9-4) can be equal by adjusting the sizes and number of contact plugs BC1, BC2, and BC3. This can reduce characteristic variations among the fin type stacked structures in the read/write/erase operation.

D. Memory Cell Array Structure

Figure 17:
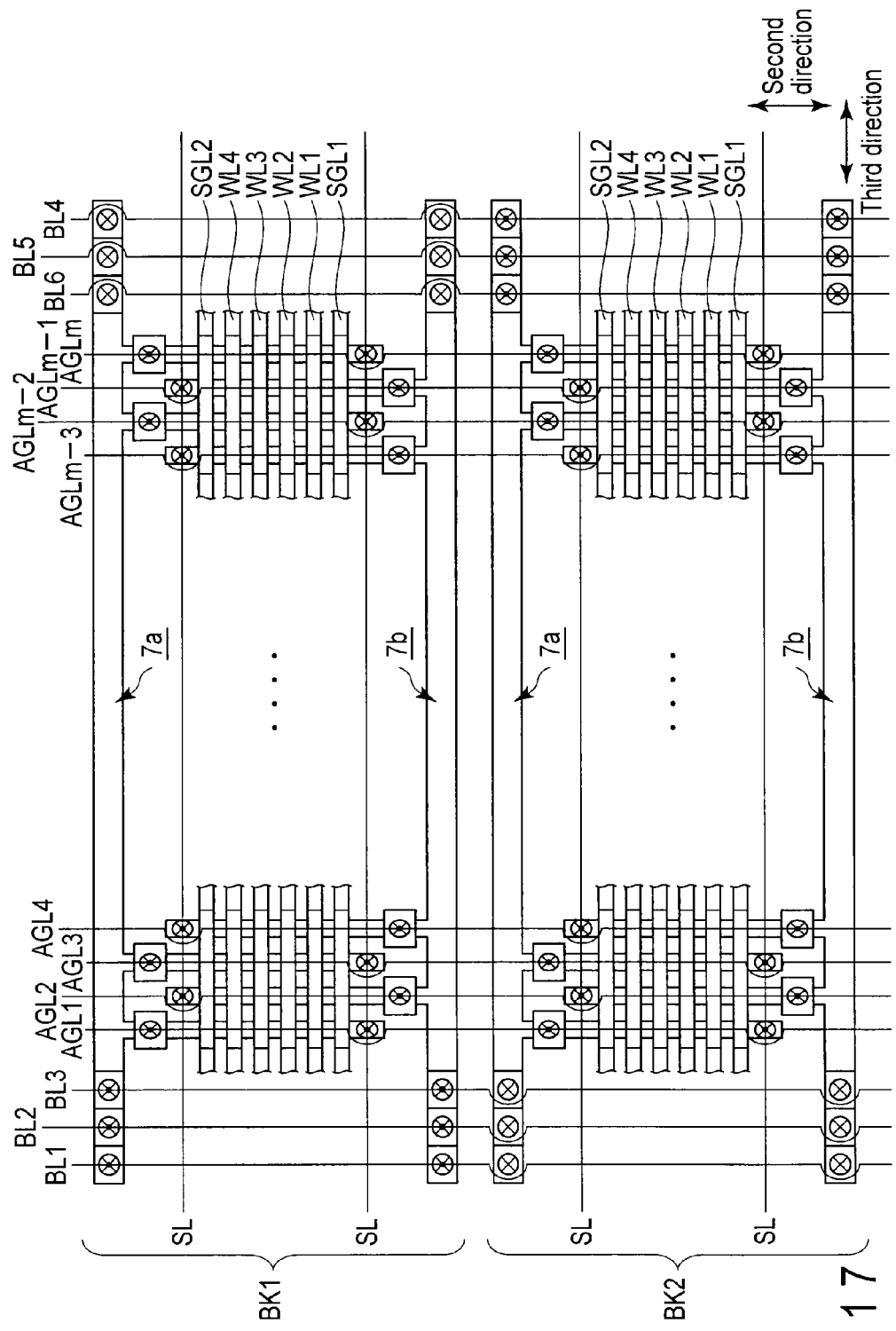
FIG. 17 is a plan view showing a memory cell array.

FIG. 17 shows a memory cell array that uses the device structure shown in FIG. 11 to FIG. 15. Here, the same elements as those in FIG. 11 to FIG. 15 are provided with the same signs and are not described in detail.

The memory cell array comprises m (m is a natural number equal to or more than 2, e.g., m=16, 32, 64 . . . ) fin type stacked structures which are arranged in the third direction and which have the same structure as first to fourth fin type stacked structures 9-1, . . . 9-4 shown in FIG. 11 to FIG. 15. m assist gate lines AGL1, . . . AGLm correspond to the m fin type stacked structures.

As both ends of first and second portions 7a and 7b in the third direction have staircase structures, bit line contact areas are provided at both ends of first and second portions 7a and 7b in the third direction. However, first and second portions 7a and 7b can have a staircase structure at one end only in the third direction, and bit line contact areas can be provided at these ends.

In such a memory cell array structure, for example, a group including fin type stacked structures arranged in the third direction is defined as one block. In this embodiment, two blocks BK1 and BK2 are shown.

In this case, m fin type stacked structures in block BK1 are connected to bit lines BL1, BL2, and BL3, respectively. m fin type stacked structures in block BK2 are connected to bit lines BL4, BL5, and BL6, respectively. m assist gate lines AGL1, . . . AGLm are provided in two common blocks BK1 and BK2.

Thus, reading/writing/erasing can be simultaneously performed in one selected fin type stacked structure within block BK1 and in one selected fin type stacked structure within block BK2.

In the memory cell array structure of this embodiment, the number of memory strings in one block is (the number of memory strings in one fin type stacked structure)×(the number of columns m). Therefore, a three-dimensionally stacked semiconductor memory having a high memory capacity can be obtained.

E. Operation

The operation of the nonvolatile semiconductor memory device of the second embodiment (FIG. 11 to FIG. 19) is the same as that in the first embodiment, and is therefore not described here.

F. Example of Method of Manufacturing the Structure Shown in FIG. 11 to FIG. 17

FIG. 18A to FIG. 18C show a method of manufacturing the structure shown in FIG. 11 to FIG. 17.

First, as shown in FIG. 18A, bit line contact area 10 with a staircase structure, first to fourth fin type stacked structures 9-1, . . . 9-4, and first and second portions 7a and 7b are formed.

Bit line contact area 10 can be manufactured, for example, in the same process as that in the first embodiment, and is therefore not described here. Consequently, a stack structure including bit line contact area 10 is formed.

The stack structure including bit line contact area 10 comprises semiconductor substrate 1, element isolation insulating layer 1a on semiconductor substrate 1 and first insulating layer 2, first semiconductor layer 3a on first insulating layer 2, second insulating layer 4a on first semiconductor layer 3a, second semiconductor layer 3b on second insulating layer 4a, third insulating layer 4b on second semiconductor layer 3b, third semiconductor layer 3c on third insulating layer 4b, and fourth insulating layer 5 on third semiconductor layer 3c.

The stack structure including bit line contact area 10 is then patterned, thereby forming first to fourth fin type stacked structures 9-1, . . . 9-4, and first and second portions 7a and 7b.

That is, a resist pattern is formed on fourth insulating layer 5 by the PEP. The RIE is performed using this resist pattern as a mask, thereby patterning fourth insulating layer 5, third semiconductor layer 3c, third insulating layer 4b, second semiconductor layer 3b, second insulating layer 4a, first semiconductor layer 3a, and first insulating layer 2.

As a result, first to fourth fin type stacked structures 9-1, . . . 9-4, and first and second portions 7a and 7b are formed on element isolation insulating layer 1a on semiconductor substrate 1. The resist pattern is removed afterwards.

A stacked gate structure is then formed. The stacked gate structure comprises, for example, a first insulating layer, a charge storage layer, a second insulating layer, and an electrode layer.

A resist pattern is formed on this stacked gate structure. The RIE is performed using this resist pattern as a mask, thereby forming word lines WL1, . . . WL4, select gate lines SGL1 and SGL2, and assist gate electrode AG. The resist pattern is removed afterwards.

It should be understood that at this point, assist gate electrode AG is disposed across first to fourth fin type stacked structures 9-1, . . . 9-4.

Thus, as shown in FIG. 18B, a resist pattern is again formed on the stacked gate structure. This resist pattern is used as a mask to etch assist gate electrode AG in FIG. 18A, such that assist gate electrodes AG1, . . . AG4 of first to fourth fin type stacked structures 9-1, . . . 9-4 are electrically isolated from one another.

At the same time, odd fin type stacked structures 9-1 and 9-3 among first to fourth fin type stacked structures 9-1, . . . 9-4 are cut from second portion 7b at the other end in the second direction, and even fin type stacked structures 9-2 and 9-4 among first to fourth fin type stacked structures 9-1, . . . 9-4 are cut from first portion 7a at the other end in the second direction.

The resist pattern is removed afterwards.

In this embodiment, assist gate electrodes AG1, . . . AG4 are patterned by two etchings. However, for example, by one etching in the process in FIG. 18A, assist gate electrodes AG1, . . . AG4 of first to fourth fin type stacked structures 9-1, . . . 9-4 can be electrically isolated from one another, and first to fourth fin type stacked structures 9-1, . . . 9-4 can be cut at the other end in the second direction.

Before the PEP process in FIG. 18A and FIG. 18B, the base for this process can be planarized by the CMP.

Furthermore, as shown in FIG. 18C, contact plugs BC1, BC2, and BC3 are formed on first to third semiconductor layers 3a, 3b, and 3c in bit line contact area 10, contact plugs AC1, . . . AC4 are formed on assist gate electrodes AG1, . . . AG4, and contact plug SC is formed on the source region.

Moreover, bit lines BL1, BL2, and BL3 are formed on contact plugs BC1, BC2, and BC3, assist gate lines AGL1, . . . AGL4 are formed on contact plugs AC1, . . . AC4, and source line SL is formed on contact plug SC.

The structure shown in FIG. 11 to FIG. 17 is completed in the process described above.

G. Summary

According to the second embodiment, the same advantages as those in the first embodiment can be obtained.

Moreover, the odd fin type stacked structures are apart from the second portion (the drain region of the even fin type stacked structures) at the other end (source region) in the second direction, and the even fin type stacked structures are apart from the first portion (the drain region of the odd fin type stacked structures) at the other end (source region) in the second direction.

It is therefore possible to prevent a leak current running between the source region of the odd fin type stacked structures and the drain region of the even fin type stacked structures, and a leak current running between the source region of the even fin type stacked structures and the drain region of the odd fin type stacked structures. Thus, wrong operation during reading/writing/erasing is eliminated, and reliability can be further enhanced.

3. Third Embodiment

A. Structure

Figure 20:
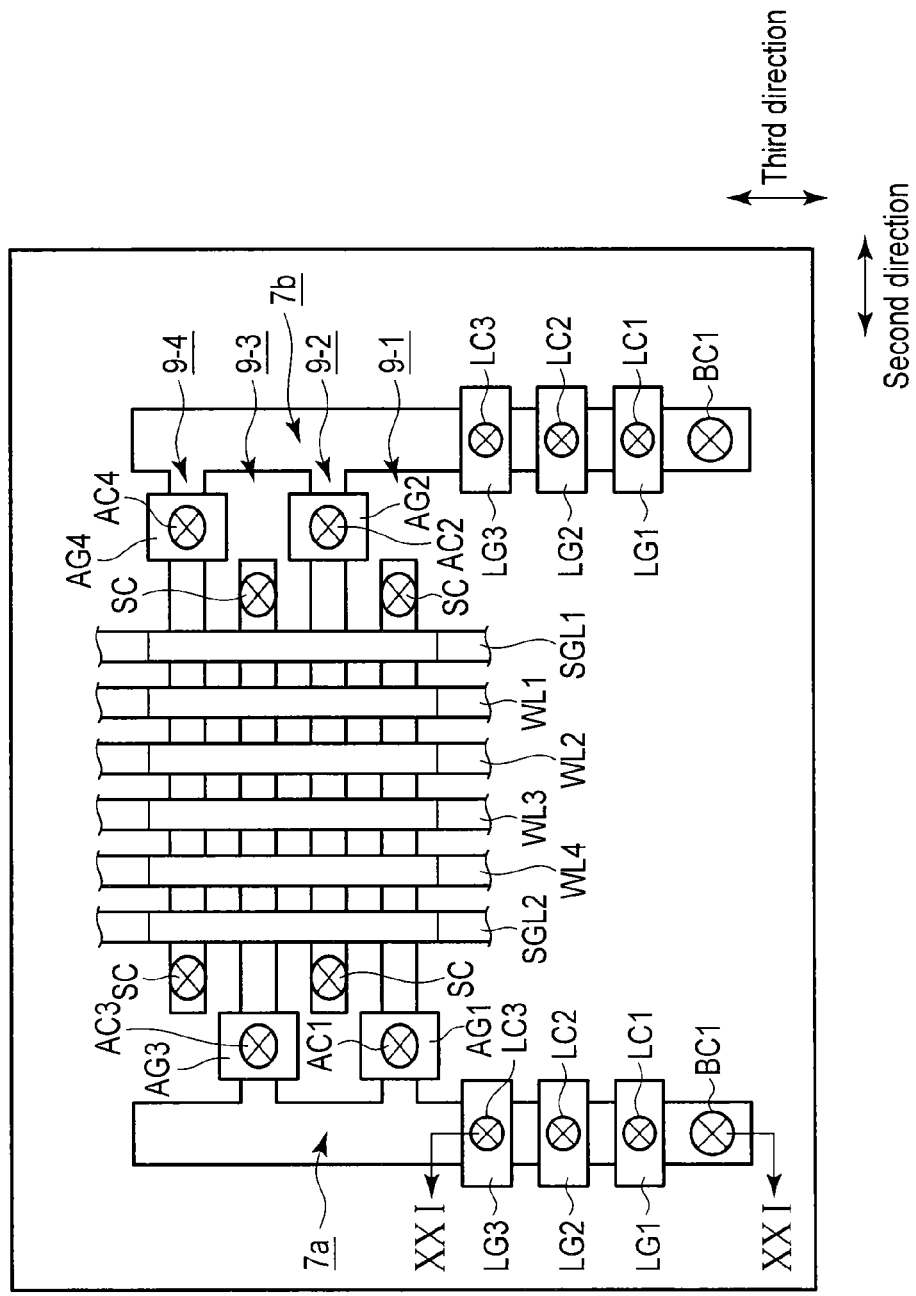
FIG. 20 is a plan view of FIG. 19.

FIG. 19 is a perspective view of a nonvolatile semiconductor memory device. FIG. 20 is a plan view of the device of FIG. 19. FIG. 21 is a sectional view taken along the line XXI-XXI of FIG. 20.

In these drawings, the shapes, dimensions, and ratios of elements are set mainly for clear understanding of the following explanation, and can be suitably changed.

The third embodiment is a modification of the first and second embodiments. That is, the third embodiment uses the first or second embodiment as the basic structure, and modifies part of this basic structure. While the second embodiment is used as the basic structure in the example described below to prevent repeated explanations, it should be understood that the first embodiment can also be used as the basic structure.

Semiconductor substrate 1 is, for example, a silicon substrate. First, second, third, and fourth fin type stacked structures 9-1, . . . 9-4 are formed on insulating layer 1a provided on semiconductor substrate 1.

Each of first to fourth fin type stacked structures 9-1, . . . 9-4 has first, second, and third memory strings 3a (NANDa), 3b (NANDb), and 3c (NANDc) that are stacked in a first direction perpendicular to the surface of insulating layer 1a on semiconductor substrate 1. First to fourth fin type stacked structures 9-1, . . . 9-4 extend in a second direction parallel to the surface of insulating layer 1a on semiconductor substrate 1.

First to fourth fin type stacked structures 9-1, . . . 9-4 are arranged in a third direction which is parallel to the surface of insulating layer 1a and which is perpendicular to the first and second directions.

Although four fin type stacked structures are shown in this embodiment, the number of fin type stacked structures is not limited. n (n is a natural number equal to or more than 2) fin type stacked structures have only to be provided. Although three memory strings are shown in this embodiment, the number of memory strings is not limited. Each of first to fourth fin type stacked structures 9-1, . . . 9-4 has only to have first to i-th memory strings (i is a natural number equal to or more than 2).

Odd fin type stacked structures 9-1 and 9-3 among first to fourth fin type stacked structures 9-1, . . . 9-4 are connected to each other by first portion 7a at one end in the second direction. Odd fin type stacked structures 9-1 and 9-3 are apart from second portion 7b at the other end in the second direction.

Even fin type stacked structures 9-2 and 9-4 among first to fourth fin type stacked structures 9-1, . . . 9-4 are connected to each other by second portion 7b at one end in the second direction. Even fin type stacked structures 9-2 and 9-4 are apart from first portion 7a at the other end in the second direction.

Both first and second portions 7a and 7b have the same stack structure as first to fourth fin type stacked structures 9-1, . . . 9-4.

First portion 7a has, at its end in the third direction, first common semiconductor 14 which connects first to third memory strings NANDa, NANDb, and NANDc in odd fin type stacked structures 9-1 and 9-3 to one another, and contact plug (drain electrode) BC1 connected to first common semiconductor 14.

Similarly, second portion 7b has, at its end in the third direction, second common semiconductor 14 which connects first to third memory strings NANDa, NANDb, and NANDc in even fin type stacked structures 9-2 and 9-4 to one another, and contact plug (drain electrode) BC1 connected to first common semiconductor 14.

First to third memory strings NANDa, NANDb, and NANDc in odd fin type stacked structures 9-1 and 9-3 use first portion 7a as a drain region, and use the ends of first to third memory strings NANDa, NANDb, and NANDc on the side of second portion 7b as a source region.

First to third memory strings NANDa, NANDb, and NANDc in even fin type stacked structures 9-2 and 9-4 use second portion 7b as a drain region, and use the ends of first to third memory strings NANDa, NANDb, and NANDc on the side of first portion 7a as a source region.

That is, first to third memory strings NANDa, NANDb, and NANDc in odd fin type stacked structures 9-1 and 9-3 share first portion (drain region) 7a. First to third memory strings NANDa, NANDb, and NANDc in even fin type stacked structures 9-2 and 9-4 share second portion (drain region) 7b.

The source region of first to third memory strings NANDa, NANDb, and NANDc in odd fin type stacked structures 9-1 and 9-3 is insulated from second portion (drain region) 7b. The source region of first to third memory strings NANDa, NANDb, and NANDc in even fin type stacked structures 9-2 and 9-4 is insulated from first portion (drain region) 7a.

Each of first to third memory strings NANDa, NANDb, and NANDc comprises memory cells connected in series in the second direction, a source-side select gate transistor disposed on the source side of the memory cells, a drain-side select gate transistor disposed on the drain side of the memory cells, and an assist gate transistor disposed between the drain-side select gate transistor and first portion 7a or second portion 7b.

The memory cells comprise first to third semiconductor layers 3 (3a, 3b, and 3c), and a stacked gate structure disposed on the side surfaces of first to third semiconductor layers 3 (3a, 3b, and 3c) in the third direction. The stacked gate structure comprises first insulating layer 6a, charge storage layer 6b, second insulating layer 6c, and electrode layer 6d.

First insulating layer 6a functions as a gate insulating layer (tunnel insulating layer). Second insulating layer 6c functions as a block insulating layer which blocks a leak current between charge storage layer 6b and electrode layer 6d. Electrode layer 6d functions as a control gate electrode, and also functions as word lines WL1, . . . WL4 extending on first to fourth fin type stacked structures 9-1, . . . 9-4 in the third direction.

Although one memory string comprises four memory cells in this embodiment, one memory string does not exclusively comprise four memory cells. The number of memory cells to constitute one memory string has only to be k (k is a natural number equal to or more than 2) or more. In this case, the number of word lines is also k.

Similarly to the memory cells, the drain-side select gate transistor and the source-side select gate transistor each comprise first to third semiconductor layers 3 (3a, 3b, and 3c), and a stacked gate structure disposed on the side surfaces of first to third semiconductor layers 3 (3a, 3b, and 3c) in the third direction. The stacked gate structure comprises first insulating layer 6a, charge storage layer 6b, second insulating layer 6c, and electrode layer 6d.

First insulating layer 6a functions as a gate insulating layer. Electrode layer 6d functions as a select gate electrode, and also functions as select gate lines SGL1 and SGL2 extending on first to fourth fin type stacked structures 9-1, . . . 9-4 in the third direction.

However, the drain-side select gate transistor and the source-side select gate transistor may be different in structure from the memory cells. For example, each of these transistors may have a MIS structure that comprises a gate insulating layer and a select gate electrode disposed on the gate insulating layer.

In this embodiment, the drain-side select gate transistor can be normally on. This is because first to third layer select transistors are provided in first and second portions 7a and 7b. The first to third layer select transistors will be described later.

Similarly to the memory cells, the assist gate transistor also comprises first to third semiconductor layers 3 (3a, 3b, and 3c), and a stacked gate structure disposed on the side surfaces of first to third semiconductor layers 3 (3a, 3b, and 3c) in the third direction. The stacked gate structure comprises first insulating layer 6a, charge storage layer 6b, second insulating layer 6c, and electrode layer 6d.

First insulating layer 6a functions as a gate insulating layer. Electrode layer 6d functions as assist gate electrodes AG1, . . . AG4.

However, the assist gate transistor may also be different in structure from the memory cells. For example, the assist gate transistor may have a MIS structure that comprises a gate insulating layer and an assist gate electrode disposed on the gate insulating layer.

Assist gate electrodes AG1, . . . AG4 are electrically isolated from one another. Assist gate electrodes AG1, . . . AG4 are connected to assist gate lines AGL1, . . . AGL4 via contact plugs AC1, . . . AC4, respectively. This allows the assist gate transistor to have a function of selecting one of first to fourth fin type stacked structures 9-1, . . . 9-4.

More specifically, the first to third layer select transistors are formed, for example, at the ends of first and second portions 7a and 7b in the third direction, so that one of first to third memory strings NANDa, NANDb, and NANDc can be selected.

Thus, one of first to fourth fin type stacked structures 9-1, . . . 9-4 can be further selected by using the assist gate transistor. Reading/writing/erasing can be performed in the selected one memory string in the selected one fin type stacked structure.

Insulating layers 2, 4 (4a, 4b), and 5 isolate semiconductor layers 3 (3a, 3b, and 3c) from one another.

In this embodiment, impurity region (e.g., N-type diffusion layer) 8 is provided in first to third semiconductor layers 3 (3a, 3b, and 3c) of the assist gate transistor on the side of first or second portion 7a or 7b. This impurity region 8 is also provided in first to third semiconductor layers 3 (including the bit line contact areas) 3a, 3b, and 3c of first or second portion 7a or 7b.

Impurity region (e.g., N-type diffusion layer) 8 is also provided in first to third semiconductor layers 3 (3a, 3b, and 3c) of the assist gate transistor on the side of the memory cells.

Although, in this embodiment, electrode layer 6d has a double gate structure that covers two sides of first to third semiconductor layers 3 (3a, 3b, and 3c) in the third direction in the memory cells, the drain-side select gate transistor, the source-side select gate transistor, and the assist gate transistor, the present invention is not limited to this.

First to third memory strings NANDa, NANDb, and NANDc use first to third semiconductor layers 3 (3a, 3b, and 3c) as channels. Here, as one memory string use one semiconductor layer as a channel, increasing the number of semiconductor layers that constitutes one fin type stacked structure to increase the number of memory strings is preferable to higher integration.

First insulating layer 6a, charge storage layer 6b, second insulating layer 6c, and electrode layer 6d are separated in the second direction in the memory cells, the drain-side/source-side select gate transistors, and the assist gate transistor. However, first insulating layer 6a, charge storage layer 6b, and second insulating layer 6c may be united (continuous) throughout the memory cells, the drain-side/source-side select gate transistors, and the assist gate transistor.

However, at least electrode layer 6d needs to be separated in the memory cells, the drain-side/source-side select gate transistors, and the assist gate transistor.

In the meantime, the assist gate transistors are disposed at the ends of odd fin type stacked structures 9-1 and 9-3 on the side of first portion 7a, and disposed at the ends of even fin type stacked structures 9-2 and 9-4 on the side of second portion 7b.

That is, as a whole, at the ends of first to fourth fin type stacked structures 9-1, . . . 9-4 on the side of first portion 7a, the assist gate transistors are alternately disposed across first to fourth fin type stacked structures 9-1, . . . 9-4 in the third direction. Similarly, at the ends of first to fourth fin type stacked structures 9-1, . . . 9-4 on the side of second portion 7b, the assist gate transistors are alternately disposed across first to fourth fin type stacked structures 9-1, . . . 9-4 in the third direction.

This makes it possible to reduce the pitch (or spaces) of first to fourth fin type stacked structures 9-1, . . . 9-4 in the third direction, and contribute to higher integration.

The source region of first to third memory strings NANDa, NANDb, and NANDc comprises impurity region (e.g., N-type diffusion layer) 9 in first to third semiconductor layers 3 (3a, 3b, and 3c) of the memory cells on the side of first or second portion 7a or 7b. Impurity region 9 as the source region is connected to source line SL via contact plug SC.

Here, the source region of first to third memory strings NANDa, NANDb, and NANDc is disposed closer to the memory cells than a line that connects assist gate electrodes AG1, . . . AG4 in the third direction.

First to third layer select transistors Ta, Tb, and Tc are formed at the end of each of first and second portions 7a and 7b in the third direction in order from the side of contact plug (drain electrode) BC1.

Here, the number of layer select transistors Ta, Tb, and Tc is equal to the number of memory strings NANDa, NANDb, and NANDc. To generalize, when each of first to fourth fin type stacked structures 9-1, . . . 9-4 has first to i-th memory strings (i is a natural number equal to or more than 2), first to fourth fin type stacked structures 9-1, . . . 9-4 have first to i-th layer select transistors.

Similarly to the memory cells, first to third layer select transistors Ta, Tb, and Tc have a stacked gate structure that extends across first to third semiconductor layers 3 (3a, 3b, and 3c) in the second direction. The stacked gate structure comprises first insulating layer 6a, charge storage layer 6b, second insulating layer 6c, and electrode layer 6d.

First insulating layer 6a functions as a gate insulating layer. Electrode layer 6d functions as layer select gate electrodes LG1, LG2, and LG3.

However, first to third layer select transistors Ta, Tb, and Tc may have a structure different from the structure of the memory cells. For example, first to third layer select transistors Ta, Tb, and Tc may have a MIS structure that comprises a gate insulating layer and a layer select gate electrode disposed on the gate insulating layer.

Layer select gate electrodes LG1, LG2, and LG3 are electrically isolated from one another. Layer select gate electrodes LG1, LG2, and LG3 are connected to layer select gate lines LGL1, LGL2, and LGL3 via contact plugs LC1, LC2, and LC3, respectively. This allows first to third layer select transistors Ta, Tb, and Tc to have a function of selecting one of first to third memory strings NANDa, NANDb, and NANDc.

In this embodiment, layer select gate electrodes LG1, LG2, and LG3 cover two opposite side surfaces of each of first to third semiconductor layers 3a, 3b, and 3c in first and second portions 7a and 7b in the second direction. That is, first to third layer select transistors Ta, Tb, and Tc have a double gate structure.

Here, the positions of the edges of second and third insulating layers 4 (4a and 4b) in first and second portions 7a and 7b on the side of bit line contact area 10 are described.

The edge of second insulating layer 4a on the side of bit line contact area 10 is located at the same position as the edge of layer select gate electrode LG1 opposite to its edge on the side of bit line contact area 10, or located closer to bit line contact area 10 than this edge of layer select gate electrode LG1.

For example, as shown in FIG. 22, the edge of second insulating layer 4a on the side of bit line contact area 10 is located at point a or located closer to bit line contact area 10 than this point.

The edge of third insulating layer 4b on the side of bit line contact area 10 is located at the same position as the edge of layer select gate electrode LG2 opposite to its edge on the side of bit line contact area 10, or located closer to bit line contact area 10 than this edge of layer select gate electrode LG2.

For example, as shown in FIG. 22, the edge of third insulating layer 4b on the side of bit line contact area 10 is located at point b or located closer to bit line contact area 10 than this point.

The threshold states of first to third layer select transistors Ta, Tb, and Tc are described.

First layer select transistor Ta closest to bit line contact area 10 is normally on in lowermost first semiconductor layer 3a within the range of the voltage applied to layer select gate electrode LG1 (uncontrollable state).

Here, first layer select transistor Ta can be normally on when impurity region 13a is provided in first semiconductor layer 3a serving as the channel of first layer select transistor Ta.

In other second and third semiconductor layers 3b and 3c, the on/off of first layer select transistor Ta is controlled within the range of the voltage applied to layer select gate electrode LG1.

Second layer select transistor Tb is normally on in intermediate second semiconductor layer 3b within the range of the voltage applied to layer select gate electrode LG2 (uncontrollable state).

Here, second layer select transistor Tb can be normally on when impurity region 13b is provided in second semiconductor layer 3b serving as the channel of second layer select transistor Tb.

In other first and third semiconductor layers 3a and 3c, the on/off of second layer select transistor Tb is controlled within the range of the voltage applied to layer select gate electrode LG2.

Third layer select transistor Tc farthest from bit line contact area 10 is normally on in uppermost third semiconductor layer 3c within the range of the voltage applied to layer select gate electrode LG3 (uncontrollable state).

Here, third layer select transistor Tc can be normally on when impurity region 13c is provided in third semiconductor layer 3c serving as the channel of third layer select transistor Tc.

In other first and second semiconductor layers 3a and 3b, the on/off of third layer select transistor Tc is controlled within the range of the voltage applied to layer select gate electrode LG3.

According to such a structure, first to third memory strings NANDa, NANDb, and NANDc can share one contact plug (drain electrode) BC1, and a leak path running through an unselected memory string can be blocked.

For example, first layer select transistor Ta is switched off in second and third memory strings NANDb and NANDc, all first to third layer select transistors Ta, Tb, and Tc are switched on in first memory string NANDa, and a current is passed through first memory string NANDa. In this case, a leak path from first memory string NANDa to second and third memory strings NANDb and NANDc is blocked by second insulating layer 4a.

B. Material Examples

Materials best suited to the generations of semiconductor memories can be properly selected as the materials that constitute the elements of the device structure shown in FIG. 19 to FIG. 22.

Material examples are the same as those in the first embodiment, and are therefore not described here.

However, as the elements newly added in the third embodiment, the following materials, for example, are used for impurity regions 13a, 13b, and 13c, first and second common semiconductors 14, and first to third layer select transistors Ta, Tb, and Tc.

As an impurity to constitute impurity regions 13a, 13b, and 13c, it is possible to use an impurity serving as an N-type semiconductor, for example, a pentad such as arsenic (As) or phosphorus (P), an impurity serving as a P-type semiconductor, for example, a triad such as boron (3) or indium (In), and a combination of these substances.

First and second common semiconductors 14 are made of, for example, monocrystalline silicon (Si), and combined with first and third semiconductor layers 3a, 3b, and 3c. First and second common semiconductors 14 are preferably monocrystalline similarly to first and third semiconductor layers 3a, 3b, and 3c, but may be amorphous or polycrystalline.

When the stacked gate structure of first to third layer select transistors Ta, Tb, and Tc is the same as the stacked gate structure of the memory cells, the same materials as those in the first embodiment can be used for the layers that constitute the stacked gate structure of first to third layer select transistors Ta, Tb, and Tc.

C. Modification

Figure 23:
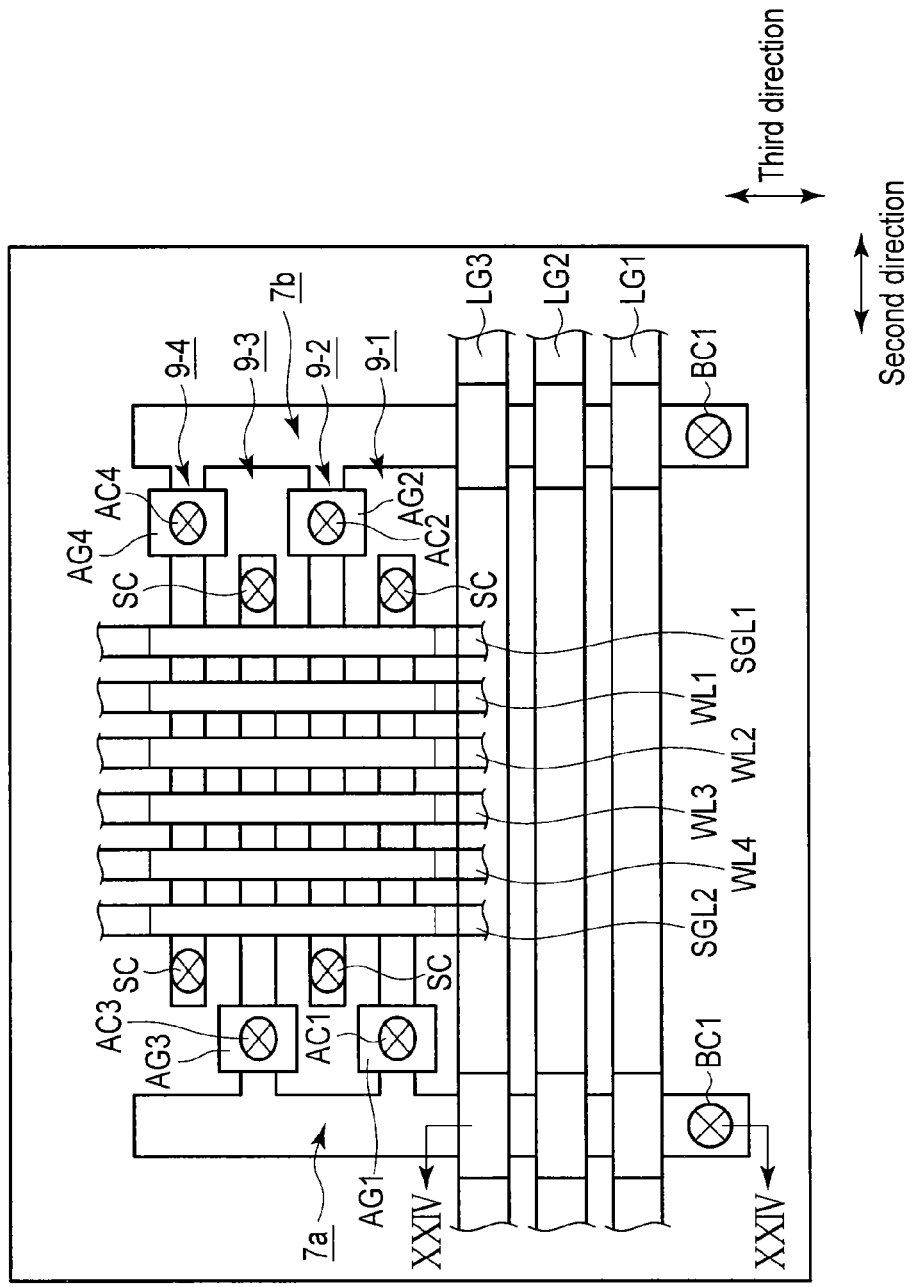
FIG. 23 is a plan view showing a modification.

FIG. 23 and FIG. 24 show a modification of the device structure shown in FIG. 19 to FIG. 22. FIG. 24 is a sectional view taken along the line XXIV-XXIV of FIG. 23. Here, the same elements as those in FIG. 19 to FIG. 22 are provided with the same signs and are not described in detail.

This modification is characterized in that the stacked gate structure of first to third layer select transistors Ta, Tb, and Tc is different from the stacked gate structure of the memory cells and in that layer select gate electrodes LG1, LG2, and LG3 extend in the second direction and serve as layer select gate lines.

In this embodiment, the stacked gate structure of first to third layer select transistors Ta, Tb, and Tc comprises gate insulating layer 6a and electrode layer 6d.

The advantage in this case is that layer select gate lines LSL1, LSL2, and LSL3 in FIG. 19 to FIG. 22 can be omitted.

However, layer select gate electrodes (layer select gate lines) LG1, LG2, and LG3 intersect with word lines WL1, . . . WL4 and select gate lines SGL1 and SGL2. Therefore, after an insulating layer is formed on word lines WL1, . . . WL4 and select gate lines SGL1 and SGL2, layer select gate electrodes (layer select gate lines) LG1, LG2, and LG3 have to be formed on this insulating layer.

D. Memory Cell Array Structure

FIG. 25 shows a memory cell array that uses the device structure shown in FIG. 19 to FIG. 22. Here, the same elements as those in FIG. 19 to FIG. 22 are provided with the same signs and are not described in detail.

The memory cell array comprises m (m is a natural number equal to or more than 2, e.g., m=16, 32, 64 . . . ) fin type stacked structures which are arranged in the third direction and which have the same structure as first to fourth fin type stacked structures 9-1, . . . 9-4 shown in FIG. 19 to FIG. 22. m assist gate lines AGL1, . . . AGLm correspond to the m fin type stacked structures.

As first to third layer select transistors Ta, Tb, and Tc are disposed at both ends of first and second portions 7a and 7b in the third direction, the bit line contact areas do not have a staircase structure.

In such a memory cell array structure, for example, a group including fin type stacked structures arranged in the third direction is defined as one block. In this embodiment, two blocks BK1 and BK2 are shown.

In this case, m fin type stacked structures in block BK1 are connected to bit line BL1, and m fin type stacked structures in block BK2 are connected to bit line BL2. m assist gate lines AGL1, . . . AGLm are provided in two common blocks BK1 and BK2.

Thus, reading/writing/erasing can be simultaneously performed in one memory string in one selected fin type stacked structure within block BK1 and in one memory string in one selected fin type stacked structure within block BK2.

In the memory cell array structure of this embodiment, the number of memory strings in one block is (the number of memory strings in one fin type stacked structure)×(the number of columns m). Therefore, a three-dimensionally stacked semiconductor memory having a high memory capacity can be obtained.

E. Operation

An example of the operation of the nonvolatile semiconductor memory device of the third embodiment (FIG. 19 to FIG. 25) is described.

An example of write operation is as follows.

It is assumed that first fin type stacked structure 9-1 is selected and writing is performed in one memory string in first fin type stacked structure 9-1.

First, a ground potential is applied to bit line BL1 and source line SL, and in this condition, a first positive bias is applied to all word lines WL1, . . . WL4. At the same time, N-type impurity storage regions are formed in first to third semiconductor layers 3a, 3b, and 3c serving as channels of first to third memory strings NANDa, NANDb, and NANDc.

Furthermore, the potential of assist gate line AGL1 is set to, for example, "H", and the assist gate transistor in first fin type stacked structure 9-1 is switched on. In order to keep the potentials of assist gate lines AGL2, . . . AGL4 at, for example, "L", the assist gate transistors in second to fourth fin type stacked structures 9-2, . . . 9-4 are off.

"L" is applied to layer select gate electrode LG1, so that layer select transistor Ta is switched off in second and third semiconductor layers 3b and 3c. In first semiconductor layer 3a, layer select transistor Ta is normally on regardless of the potential of layer select gate electrode LG1.

As the potentials of layer select gate electrodes LG2 and LG3 are "H", layer select transistors Tb and Tc are on in first to third semiconductor layers 3a, 3b, and 3c.

Subsequently, for example, a second positive bias higher than the first positive bias is applied to word line (control gate electrode) WL-select of the selected memory cell targeted for writing, and program data "0"/"1" is transferred to the channel of first memory string NANDa in first fin type stacked structure 9-1 from bit line BL1.

In second and third memory strings NANDb and NANDc in first fin type stacked structure 9-1, the channel potential is increased by capacitive coupling resulting from the application of the second positive bias. Therefore, a voltage high enough for writing is not applied across the control gate electrode (or charge storage layer) and the channel, and writing is inhibited accordingly.

Similarly, in first to third memory strings NANDa, NANDb, and NANDc in second to fourth fin type stacked structures 9-2, . . . 9-4, the channel potential is increased by capacitive coupling resulting from the application of the second positive bias. Therefore, a voltage high enough for writing is not applied across the control gate electrode (or charge storage layer) and the channel, and writing is inhibited accordingly.

In first semiconductor layer 3a in which selected memory string NANDa is formed, first layer select transistor Ta is on, so that program data "0"/"1" is transferred to first semiconductor layer 3a as the channel.

When the program data is "0", first semiconductor layer 3a as the channel, for example, has a positive potential. In this condition, if the second positive bias is applied to the control gate electrode of the selected memory cell and the channel potential is slightly increased by the capacitive coupling, first layer select transistor Ta is cut off.

Therefore, in first semiconductor layer 3a, the channel potential is increased by the capacitive coupling resulting from the application of the second positive bias. That is, a sufficiently high voltage is not applied across the control gate electrode (or charge storage layer) and the channel, and electrons are not injected into the charge storage layer. Therefore, writing is inhibited ("0"-programming).

In contrast, when the program data is "1", first semiconductor layer 3a as the channel, for example, has a ground potential. In this condition, even if the second positive bias is applied to the control gate electrode of the selected memory cell, first layer select transistor Ta is not cut off.

Therefore, the ground potential is applied to first semiconductor layer 3a as the channel, and the second positive bias is applied to the control gate electrode. That is, a sufficiently high voltage is generated across the control gate electrode (or charge storage layer) and the channel, and electrons are injected into the charge storage layer. Thus, writing is performed ("1"-programming).

Furthermore, by the same operation as the operation for writing in memory string NANDa, writing can be performed in memory string NANDb that uses second semiconductor layer 3b in first fin type stacked structure 9-1 as a channel.

However, "L" is applied to layer select gate electrode LG2, so that layer select transistor Tb is switched off in first and third semiconductor layers 3a, 3b, and 3c. In second semiconductor layer 3b, layer select transistor Tb is normally on regardless of the potential of layer select gate electrode LG2.

Moreover, "H" is applied to layer select gate electrodes LG1 and LG3, so that layer select transistors Ta and Tc are switched on in first to third semiconductor layers 3a, 3b, and 3c.

Finally, by the same operation as the operation for writing in memory string NANDa, writing can also be performed in memory string NANDc that uses third semiconductor layer 3c in first fin type stacked structure 9-1 as a channel.

However, "L" is applied to layer select gate electrode LG3, so that layer select transistor Tc is switched off in first and second semiconductor layers 3a and 3b. In third semiconductor layer 3c, layer select transistor Tc is normally on regardless of the potential of layer select gate electrode LG3.

Moreover, "H" is applied to layer select gate electrodes LG1 and LG2, so that layer select transistors Ta and Tb are switched on in first to third semiconductor layers 3a, 3b, and 3c.

Examples of erase operation are as follows.

FIRST EXAMPLE

The erase operation can be simultaneously performed in, for example, one or more fin type stacked structures (e.g., all the fin type stacked structures) in a block.

First, a ground potential is applied to bit line BL1 and source line SL, and a first negative bias is applied to select gate lines SGL1 and SGL2 and word lines WL1, ... WL4. At the same time, P-type impurity storage regions are formed in first to third semiconductor layers 3a, 3b, and 3c serving as channels of first to third memory strings NANDa, NANDb, and NANDc.

Furthermore, the potential of the assist gate line corresponding to selected one or more fin type stacked structures targeted for erasing is set to "H", and the assist gate transistor corresponding to selected one or more fin type stacked structures is switched on.

A second negative bias higher than the first negative bias is then applied to all word lines WL1, ... WL4.

As a result, a voltage high enough for erasing is generated across the control gate electrode (or charge storage layer) and the channel, and electrons in the charge storage layer are discharged to the channel. Thus, erasing is performed.

SECOND EXAMPLE

The erase operation can also be performed in, for example, one of first to third memory strings NANDa, NANDb, and NANDc in one fin type stacked structure.

For example, in order to erase first memory string NANDa, layer select gate electrode LG1 is set to "L", and the remaining layer select gate electrodes LG2 and LG3 are set to "H". Thus, first layer select transistor Ta is off in second and third semiconductor layers 3b and 3c, so that first memory string NANDa can be selectively erased.

In order to erase second memory string NANDb, layer select gate electrode LG2 is set to "L", and the remaining layer select gate electrodes LG1 and LG3 are set to "H".

In order to erase third memory string NANDc, layer select gate electrode LG3 is set to "L", and the remaining layer select gate electrodes LG1 and LG2 are set to "H".

THIRD EXAMPLE

The erase operation can also be performed in, for example, one memory cell in one selected memory string.

In this case, the following condition is further added to the conditions in the first and second examples described above.

A second negative bias higher than a first negative bias is applied to the control gate electrode of a selected memory cell targeted for erasing. The second negative bias is not applied to the control gate electrodes of unselected memory cells which are not targeted for erasing.

Consequently, a sufficiently high voltage is generated across the control gate electrode (or charge storage layer) and the channel in the selected memory cell alone, and electrons in the charge storage layer are discharged to the channel, thereby performing erasing.

An example of read operation is as follows.

It is assumed that first fin type stacked structure 9-1 is selected and reading is performed in one memory string in first fin type stacked structure 9-1.

First, a reading circuit is connected to bit line BL1, and a ground voltage is applied to source line SL. The potential of assist gate line AGL1 is set to, for example, "H", and the assist gate transistor in first fin type stacked structure 9-1 is switched on. In order to keep the potentials of assist gate lines AGL2, ... AGL4 at, for example, "L", the assist gate transistors in second to fourth fin type stacked structures 9-2, ... 9-4 are off.

To read first memory string NANDa that uses first semiconductor layer 3a as a channel, "L" is applied to layer select gate electrode LG1, so that layer select transistor Ta is switched off in second and third semiconductor layers 3b and 3c. In first semiconductor layer 3a, layer select transistor Ta is normally on regardless of the potential of layer select gate electrode LG1.

As the potentials of layer select gate electrodes LG2 and LG3 are "H", layer select transistors Tb and Tc are on in first to third semiconductor layers 3a, 3b, and 3c.

Subsequently, data is sequentially read in memory string NANDa from the source-side memory cells to the drain-side memory cells.

In the selected memory cell targeted for reading, for example, a second positive bias for reading lower than the first positive bias is applied to the control gate electrode. The second positive bias has, for example, a value between the threshold of the "0"-data and the threshold of the "1"-data.

Therefore, whether to switch on or off the selected memory cell is determined by the value of the data stored in the selected memory cell, so that reading can be performed by using the reading circuit to detect potential changes in bit line BL1 and changes in a current running through bit line BL1.

Furthermore, by the same operation as the operation for reading in memory string NANDa, reading can be performed in memory string NANDb that uses second semiconductor layer 3b in first fin type stacked structure 9-1 as a channel.

However, "L" is applied to layer select gate electrode LG2, so that layer select transistor Tb is switched off in first and third semiconductor layers 3a and 3c. In second semiconductor layer 3b, layer select transistor Tb is normally on regardless of the potential of layer select gate electrode LG2.

Moreover, "H" is applied to layer select gate electrodes LG1 and LG3, so that layer select transistors Ta and Tc are switched on in first to third semiconductor layers 3a, 3b, and 3c.

Finally, by the same operation as the operation for reading in memory string NANDa, reading can also be performed in memory string NANDc that uses third semiconductor layer 3c in first fin type stacked structure 9-1 as a channel.

However, "L" is applied to layer select gate electrode LG3, so that layer select transistor Tc is switched off in first and second semiconductor layers 3a and 3b. In third semiconductor layer 3c, layer select transistor Tc is normally on regardless of the potential of layer select gate electrode LG3.

Moreover, "H" is applied to layer select gate electrodes LG1 and LG2, so that layer select transistors Ta and Tb are switched on in first to third semiconductor layers 3a, 3b, and 3c.

F. Example of Method of Manufacturing the Structure Shown in FIG. 19 to FIG. 25

FIG. 26A to FIG. 26H show a method of manufacturing the structure shown in FIG. 19 to FIG. 25.

Figure 26A:
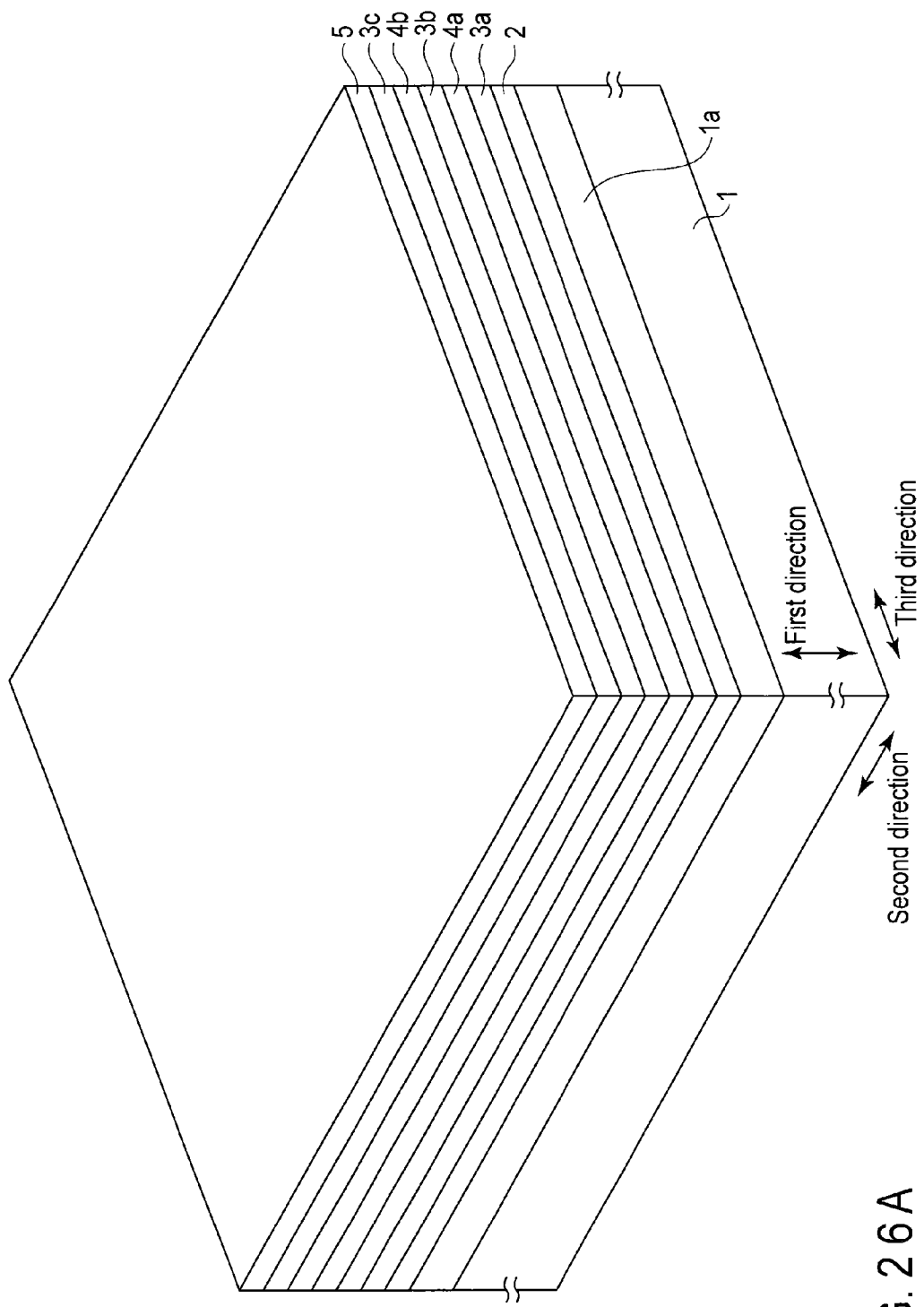

First, as shown in FIG. 26A, first-conductivity-type (e.g., P-type) semiconductor substrate (e.g., silicon) 1 having, for example, a plane direction (100) and a specific resistance of 10 to 20 Ωcm is prepared. On this semiconductor substrate 1, element isolation insulating layer 1a and first insulating layer 2 are formed, and first semiconductor layer (e.g., silicon) 3a is formed on first insulating layer 2.

A resist pattern is then formed on first semiconductor layer 3a by a photo engraving process (PEP). Ions are implanted using this resist pattern as a mask, thereby forming an impurity region in first semiconductor layer 3a. The resist pattern is removed afterwards.

Second insulating layer 4a and second semiconductor layer 3b are then formed on first semiconductor layer 3a. A resist pattern is then formed on second semiconductor layer 3b by the PEP. Ions are implanted using this resist pattern as a mask, thereby forming an impurity region in second semiconductor layer 3b. The resist pattern is removed afterwards.

Third insulating layer 4b and third semiconductor layer 3c are then formed on second semiconductor layer 3b. A resist pattern is then formed on third semiconductor layer 3c by the PEP. Ions are implanted using this resist pattern as a mask, thereby forming an impurity region in third semiconductor layer 3c. The resist pattern is removed afterwards.

Finally, fourth insulating layer 5 is formed on third semiconductor layer 3c.

Furthermore, as shown in FIG. 26B, a resist pattern is formed on fourth insulating layer 5 by the PEP. The RIE is performed using this resist pattern as a mask, thereby patterning fourth insulating layer 5 and third semiconductor layer 3c. As a result, part of third insulating layer 4b is exposed. The resist pattern is removed afterwards.

A resist pattern is again formed on fourth insulating layer 5 and third insulating layer 4b by the PEP. The RIE is performed using this resist pattern as a mask, thereby patterning third insulating layer 4b and second semiconductor layer 3b. As a result, part of second insulating layer 4a is exposed. The resist pattern is removed afterwards.

A resist pattern is again formed on fourth insulating layer 5, third insulating layer 4b, and second insulating layer 4a by the PEP. The RIE is performed using this resist pattern as a mask, thereby patterning second insulating layer 4a and first semiconductor layer 3a. As a result, part of first insulating layer 2 is exposed. The resist pattern is removed afterwards.

Finally, a resist pattern is again formed on fourth insulating layer 5, third insulating layer 4b, second insulating layer 4a, and first insulating layer 2 by the PEP. The RIE is performed using this resist pattern as a mask, thereby patterning first insulating layer 2.

In the process described above, bit line contact area 10 with a staircase structure is formed at the end in the third direction.

Figure 26C:
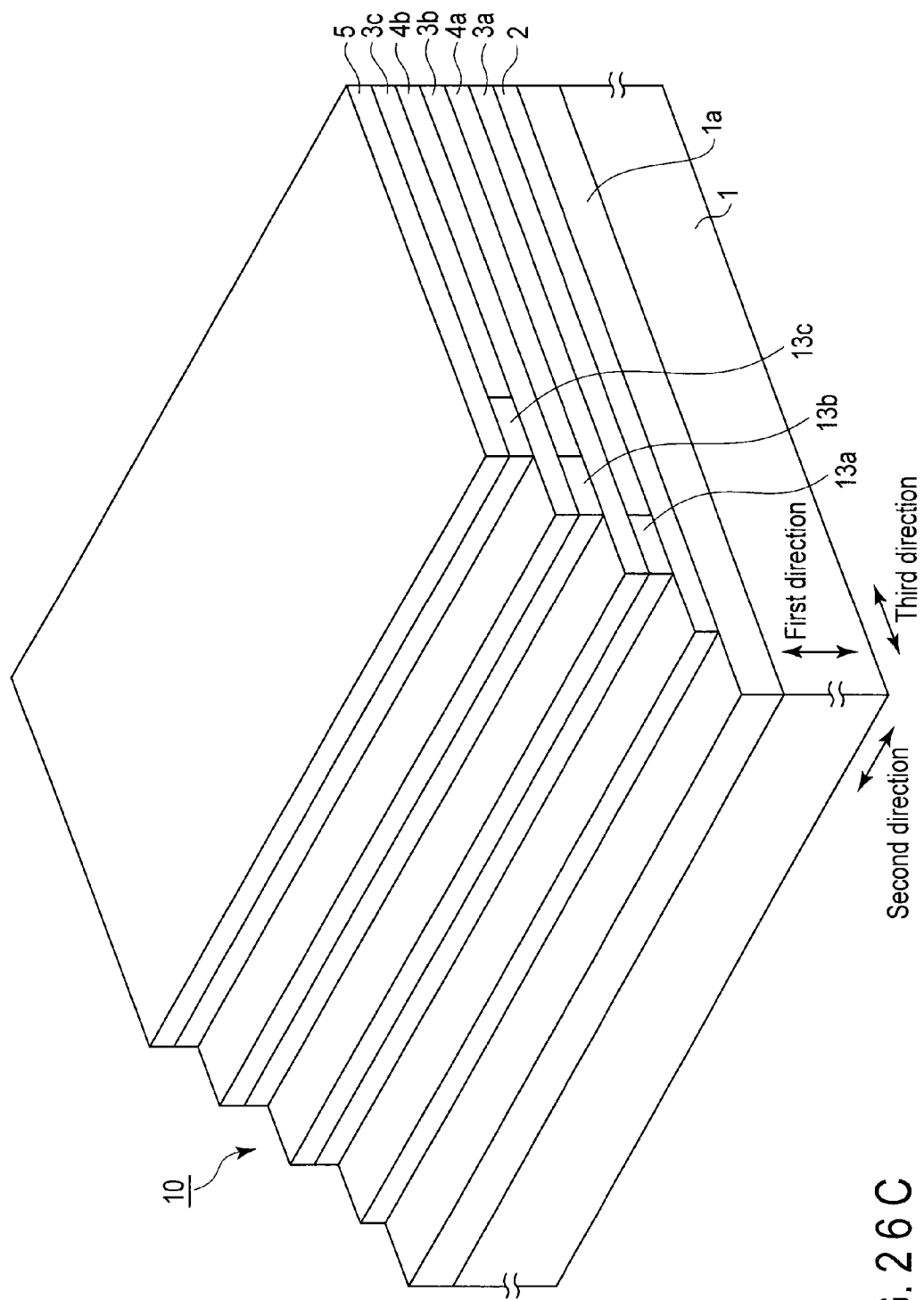

Furthermore, as shown in FIG. 26C, a resist pattern is formed on fourth insulating layer 5 by the PEP. Ions are implanted using this resist pattern as a mask, thereby simultaneously forming impurity regions 13a, 13b, and 13c in first to third semiconductor layers 3a, 3b, and 3c. The resist pattern is removed afterwards.

Although impurity regions 13a, 13b, and 13c are formed after the formation of the staircase structure at the end in the third direction in this embodiment, impurity regions 13a, 13b, and 13c may be formed, for example, by ion implantation in the step in FIG. 26A for forming the staircase structure.

Figure 26D:
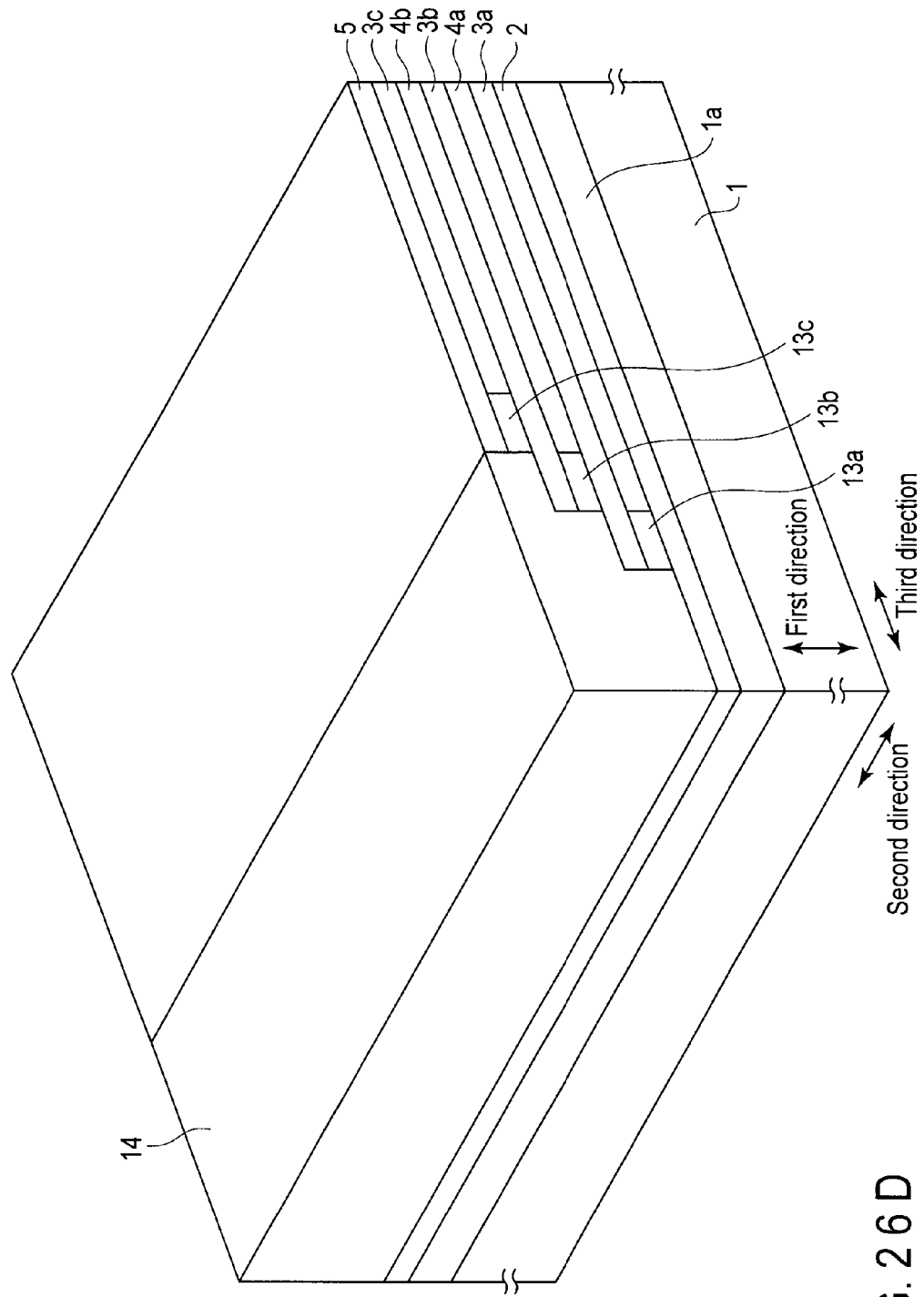

Furthermore, as shown in FIG. 26D, at the ends of first to third semiconductor layers 3a, 3b, and 3c in the third direction, common semiconductor 14 which connects these layers is formed.

Figure 26E:
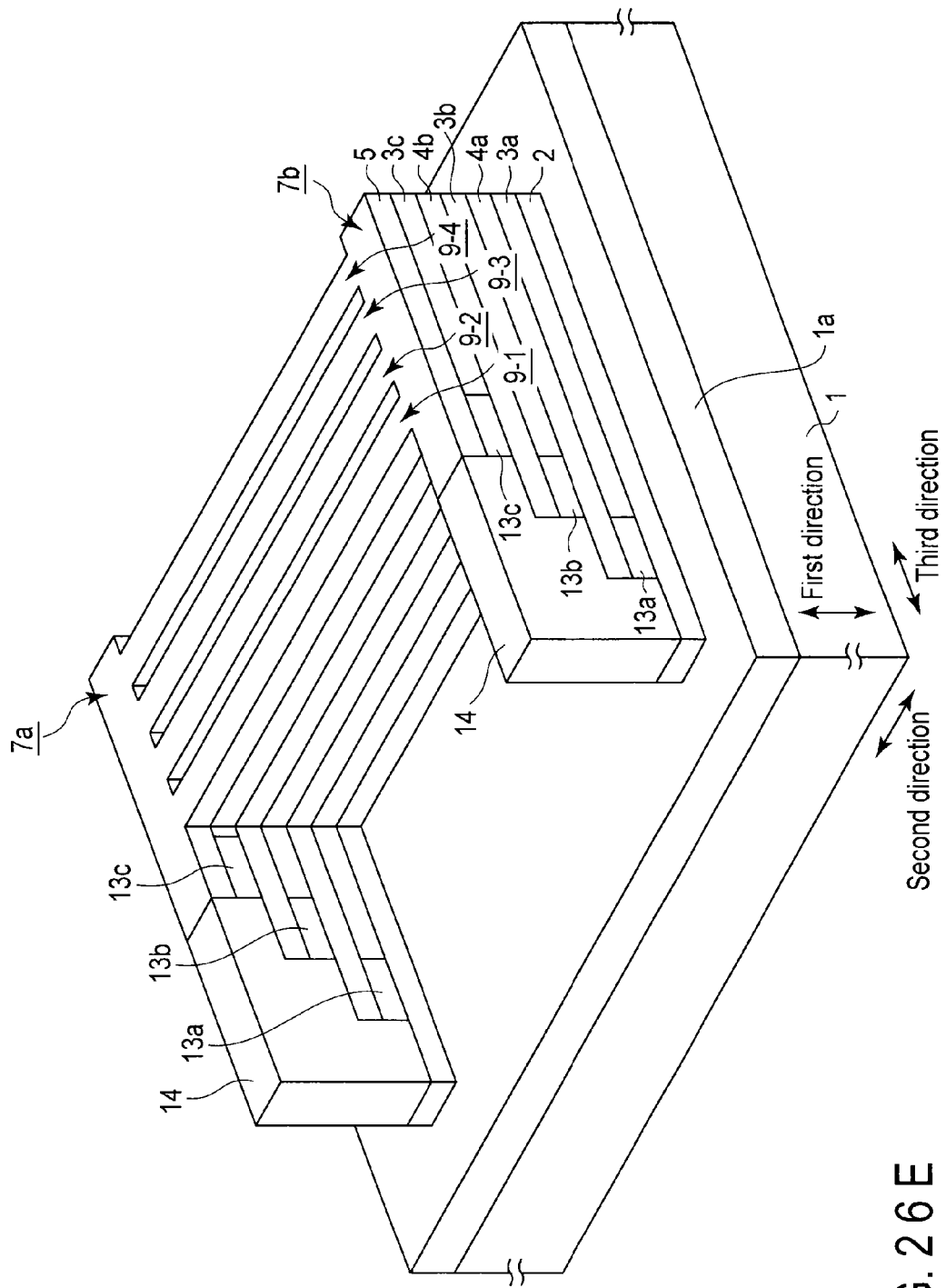

As shown in FIG. 26E, etching is then performed to obtain first to fourth fin type stacked structures 9-1, . . . 9-4, and first and second portions 7a and 7b.

That is, a resist pattern is formed on fourth insulating layer 5 by the PEP. The RIE is performed using this resist pattern as a mask, thereby patterning fourth insulating layer 5, third semiconductor layer 3c, third insulating layer 4b, second semiconductor layer 3b, second insulating layer 4a, first semiconductor layer 3a, and first insulating layer 2.

As a result, first to fourth fin type stacked structures 9-1, . . . 9-4, and first and second portions 7a and 7b are formed on element isolation insulating layer 1a on semiconductor substrate 1. The resist pattern is removed afterwards.

Figure 26F:
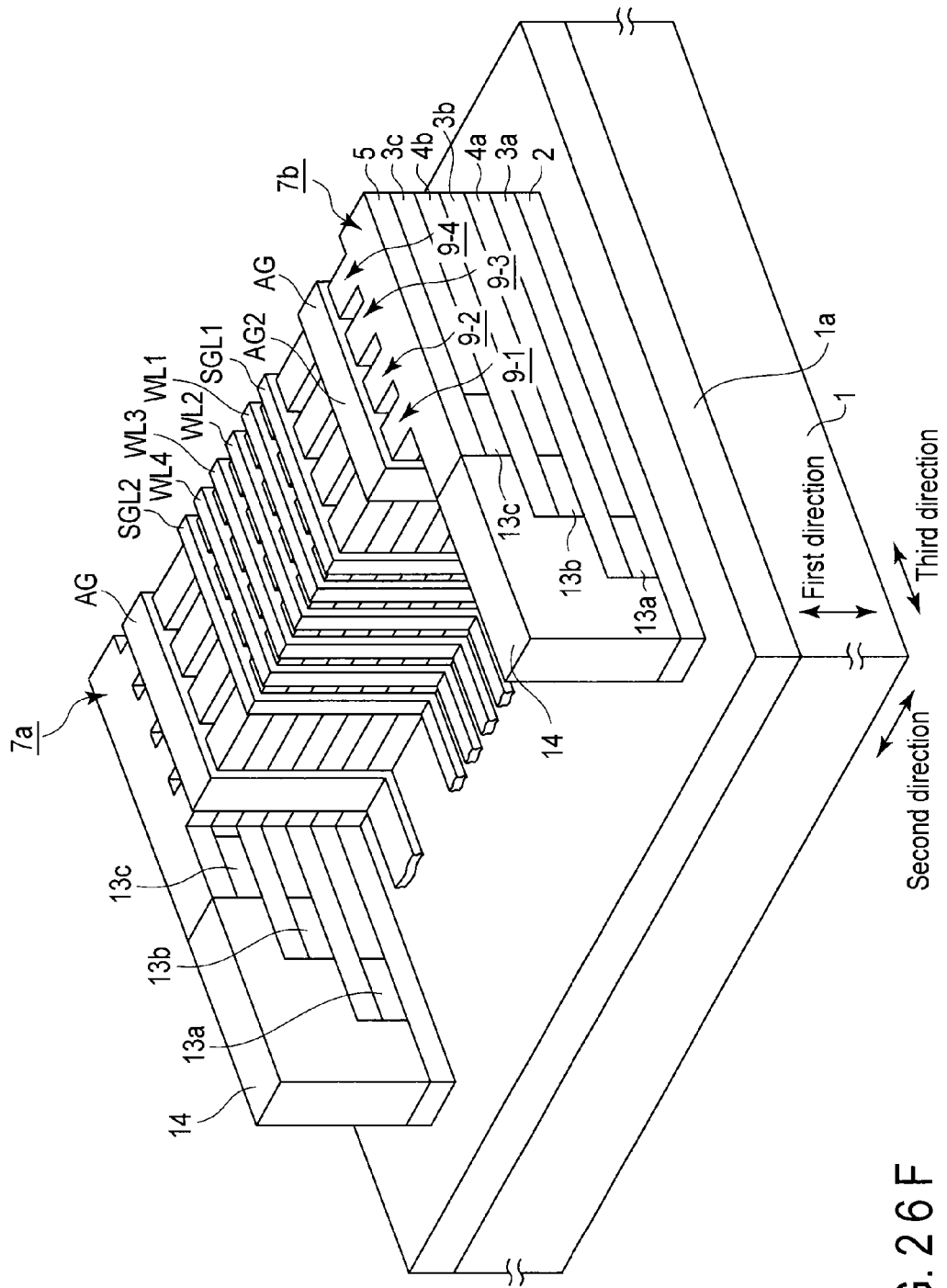

Furthermore, as shown in FIG. 26F, a stacked gate structure is formed. The stacked gate structure comprises, for example, a first insulating layer, a charge storage layer, a second insulating layer, and an electrode layer.

A resist pattern is formed on this stacked gate structure. The RIE is performed using this resist pattern as a mask, thereby forming word lines WL1, . . . WL4, select gate lines SGL1 and SGL2, and assist gate electrode AG. The resist pattern is removed afterwards.

It should be understood that at this point, assist gate electrode AG is disposed across first to fourth fin type stacked structures 9-1, . . . 9-4.

Figure 26G:
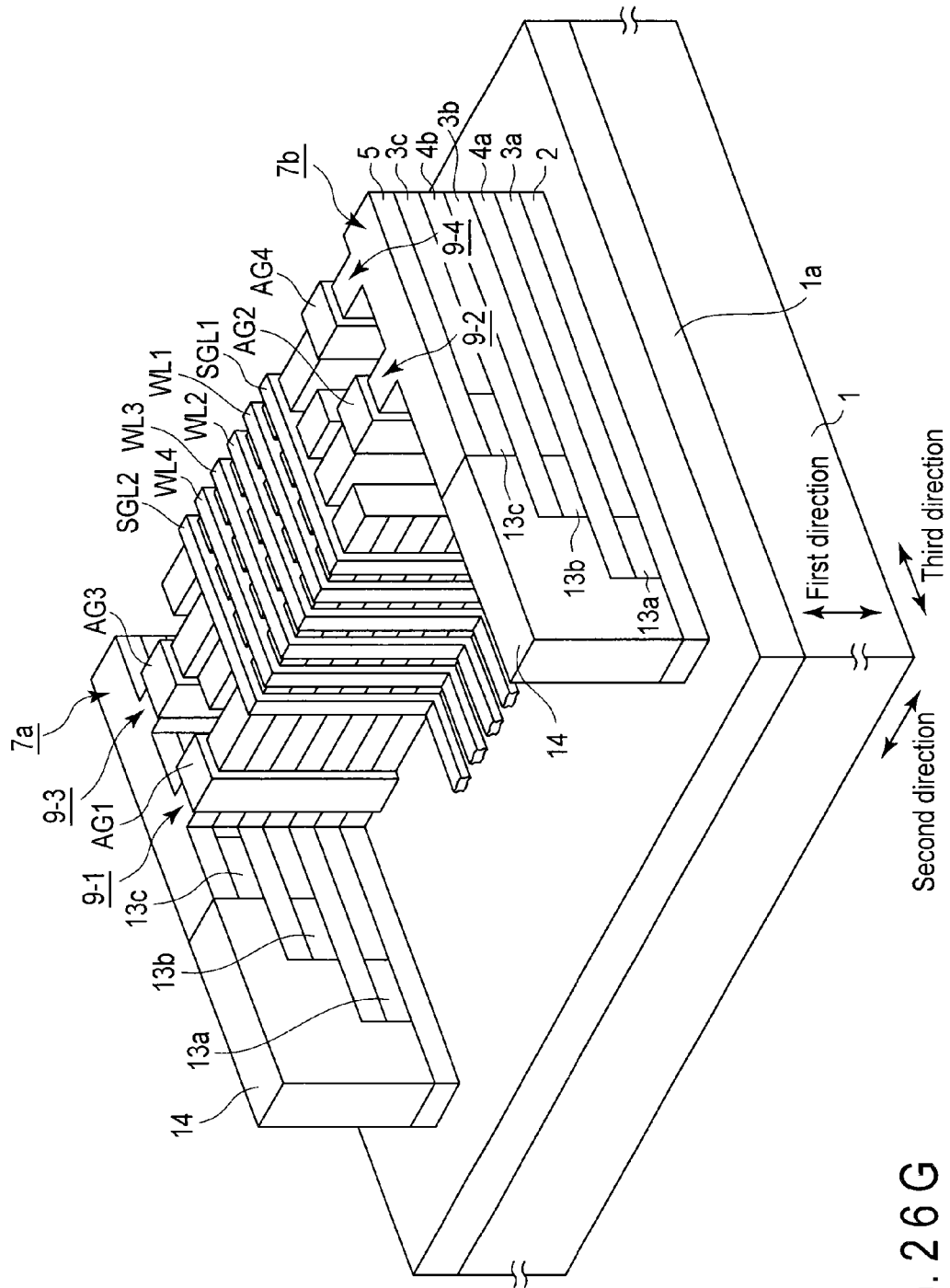

Thus, as shown in FIG. 26G, a resist pattern is again formed on the stacked gate structure. This resist pattern is used as a mask to etch assist gate electrode AG in FIG. 26F, such that assist gate electrodes AG1, . . . AG4 of first to fourth fin type stacked structures 9-1, . . . 9-4 are electrically isolated from one another.

At the same time, odd fin type stacked structures 9-1 and 9-3 among first to fourth fin type stacked structures 9-1, . . . 9-4 are cut from second portion 7b at the other end in the second direction, and even fin type stacked structures 9-2 and 9-4 among first to fourth fin type stacked structures 9-1, . . . 9-4 are cut from first portion 7a at the other end in the second direction.

The resist pattern is removed afterwards.

In this embodiment, assist gate electrodes AG1, . . . AG4 are patterned by two etchings. However, for example, by one etching in the process in FIG. 26F, assist gate electrodes AG1, . . . AG4 of first to fourth fin type stacked structures 9-1, . . . 9-4 can be electrically isolated from one another, and first to fourth fin type stacked structures 9-1, . . . 9-4 can be cut at the other end in the second direction.

Before the PEP process in FIG. 26A and FIG. 26F, the base for this process can be planarized by the CMP.

Figure 26H:
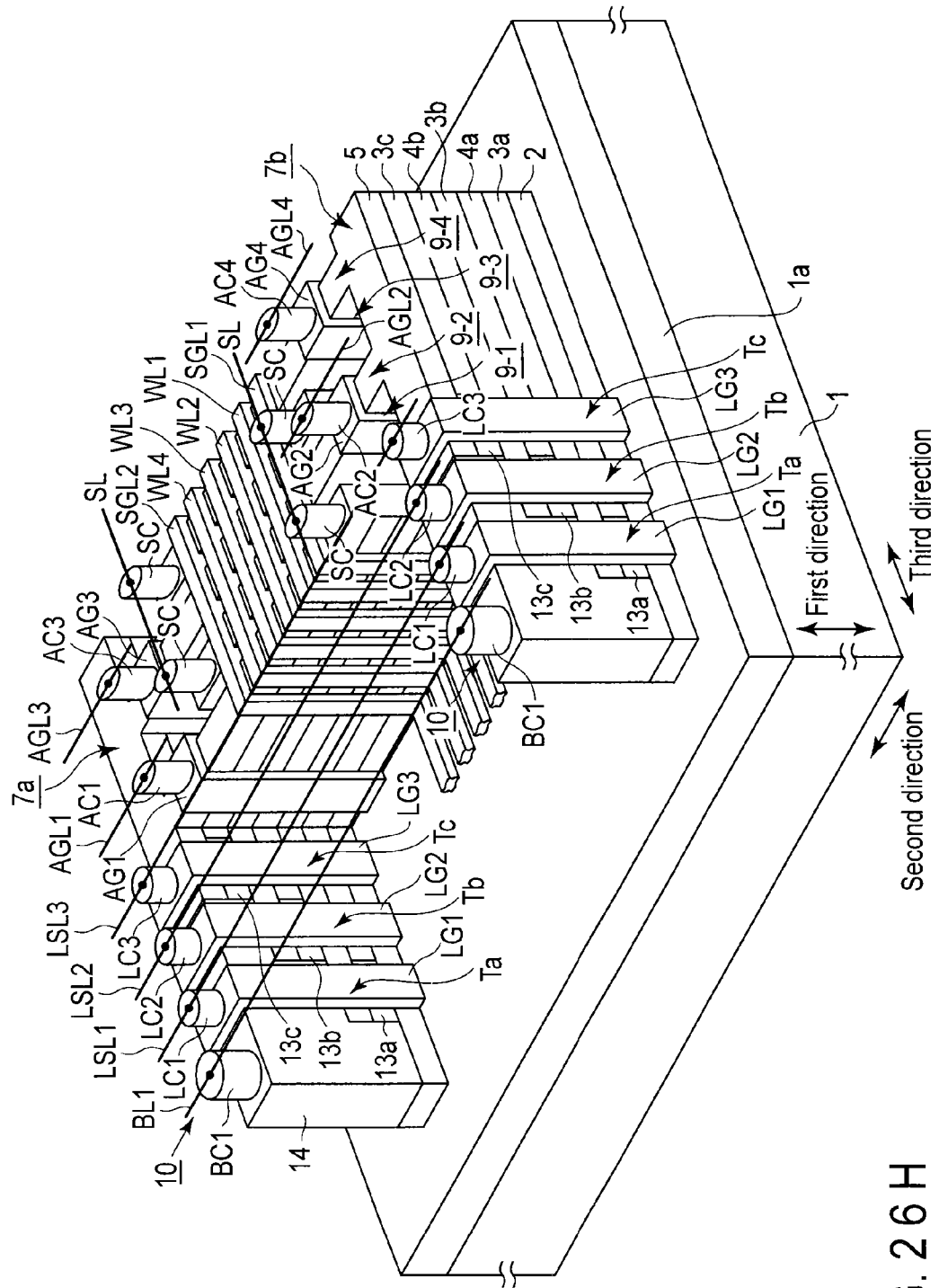

Furthermore, as shown in FIG. 26H, the stacked gate structure of first to third layer select transistors Ta, Tb, and Tc is formed, and layer select gate electrodes LG1, LG2, and LG3 are formed by the PEP and RIE.

When the stacked gate structure of first to third layer select transistors Ta, Tb, and Tc is the same as the stacked gate structure of the memory cells, layer select gate electrodes LG1, LG2, and LG3 can be formed in the steps in FIG. 26F and FIG. 26G.

Contact plug (drain electrode) BC1 connected to common semiconductor 14 is then formed. Also, contact plugs LC1, LC2, and LC3 are formed on layer select gate electrodes LG1, LG2, and LG3, contact plugs AC1, . . . AC4 are formed on assist gate electrodes AG1, . . . AG4, and contact plug SC is formed on the source region.

Moreover, bit line BL1 is formed on contact plug BC1, layer select gate lines LSL1, LSL2, and LSL3 are formed on contact plugs LC1, LC2, and LC3, assist gate lines AGL1, . . . AGL4 are formed on contact plugs AC1, . . . AC4, and source line SL is formed on contact plug SC.

The structure shown in FIG. 19 to FIG. 25 is completed in the process described above.

G. Summary

According to the third embodiment, the same advantages as those in the first or second embodiment can be obtained.

Moreover, first to third layer select transistors Ta, Tb, and Tc are provided at the ends of first and second portions 7a and 7b in the third direction. This makes it possible to connect first to third memory strings NANDa, NANDb, and NANDc to one common bit line BL1, and contribute to higher integration.

Furthermore, in first to third layer select transistors Ta, Tb, and Tc, the positions of the edges of the insulating layers to insulate first to third semiconductor layers 3a, 3b, and 3c are within a predetermined range, so that a leak path running through an unselected memory string can be blocked, and reliability can be further enhanced.

4. Others

Although no diffusion layer is formed between transistors in the memory cells (cell transistors) connected in series and the source side/drain side select gate transistors in the first to third embodiments, diffusion layer may be formed between transistors instead.

When the gate distance (electrode pitch) is 30 nm or less, a current path can be formed in the semiconductor layer (channel) without forming any diffusion layer between transistors (e.g., see Chang-Hyum Lee et al., VLSI Technology Digest of Technical Papers, pp 118-119, 2008).

5. Conclusion

According to the embodiments, it is possible to enhance the reliability and integration of a nonvolatile semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   elements, each extending in a first direction and each including memory cells and first and second select gate transistors, the first select gate transistor arranged to a first side of the memory cells in the first direction, the second select gate transistor arranged to a second side of the memory cells in the first direction, the first direction being parallel to the semiconductor substrate, the elements including a first element, a second element, a third element, and a fourth element, the second element being stacked above the first element, the fourth element being stacked above the third element, both the third element and the fourth element being arranged in a second direction away from both the first element and the second element, the second direction being parallel to the semiconductor substrate, the second direction being orthogonal to the first direction;
   a first portion electrically connected to the first element;
   a second portion electrically connected to the second element;
   a third portion electrically connected to the third element;
   a fourth portion electrically connected to the fourth element, the first and second portions arranged to the first side, the third and fourth portions arranged to the second side;
   a third select gate transistor arranged between the first portion and the first element and between the second portion and the second element; and
   a fourth select gate transistor arranged between the third portion and the third element and between the fourth portion and the fourth element.

2. The memory of claim 1,
   wherein the first side is opposite to the second side in the first direction.

3. The memory of claim 2,
   wherein the first and second portions are electrically isolated from the third and fourth elements, and
   the third and fourth portions are electrically isolated from the first and second elements.

4. The memory of claim 3,
   wherein the first and second portions are physically combined with the third and fourth elements, and
   the third and fourth portions are physically combined with the first and second elements.

5. The memory of claim 2,
   wherein the first and second portions are physically separated from the third and fourth elements, and
   the third and fourth portions are physically separated from the first and second elements.

6. The memory of claim 1,
   wherein the first and second elements have drain regions at the first sides of the first and second elements, respectively, and
   the third and fourth elements have drain regions at the second sides of the third and fourth elements, respectively.

7. The memory of claim 1,
   wherein the first and second elements have source regions at the second sides of the first and second elements, respectively, and
   the third and fourth elements have source regions at the first sides of the third and fourth elements, respectively.

8. The memory of claim 7,
   wherein the third select gate transistor is disposed closer to the first and second portions than the source regions of the third and fourth elements, and
   the fourth select gate transistor is disposed closer to the third and fourth portions than the source regions of the first and second elements.

9. The memory of claim 7,
   wherein the source regions of the third and fourth elements are disposed closer to the first and second portions than the third select gate transistor, and
   the source regions of the first and second elements are disposed closer to the third and fourth portions than the fourth select gate transistor.

10. The memory of claim 7,
    wherein the third select gate transistor is arranged to the source regions of the third and fourth elements in the second direction, and the fourth select gate transistor is arranged to the source regions of the first and second elements in the second direction.

11. The memory of claim 1,
wherein the third select gate transistor is shared by the first and second elements, and
the fourth select gate transistor is shared by the third and fourth elements.

12. The memory of claim 1,
wherein the memory cells have word lines extending in the second direction, respectively,
the first and second select gate transistors have select gate lines extending in the second direction, respectively, and
the word lines and the select gate lines are shared by the first, second, third and fourth elements.

13. The memory of claim 1, further comprising:
a first bit line electrically connected to the first and second elements through the first and second portions,
a second bit line electrically connected to the third and fourth elements through the third and fourth portions,
the first and second bit lines extending in the first direction.

14. The memory of claim 13,
wherein each of the first and second portions includes a first bit line contact area with a staircase structure,
each of the third and fourth portions includes a second bit line contact area with a staircase structure,
the first bit line is electrically connected to the first and third elements through the first bit line contact area, and
the second bit line is electrically connected to the second and fourth elements through the second bit line contact area.

15. The memory of claim 1, further comprising:
a first layer select transistor disposed in the first and second portions, and
a second layer select transistor disposed in the third and fourth portions,
wherein the first layer select transistor selects one of the first and second elements, and the second layer select transistor selects one of the third and fourth elements.

16. The memory of claim 1,
wherein the memory cells include charge storage layers and control gate electrodes, respectively,
the first and second select gate transistors include select gate electrodes, respectively, and
the control gate electrodes and the select gate electrodes extend in a third direction orthogonal to the first and second direction between the first and third elements and between the second and fourth elements.

17. The memory of claim 16,
wherein the charge storage layers are charge trap insulating layers, and
the charge trap insulating layers of the memory cells in the first, second, third and fourth elements are physically combined with one another.

18. The memory of claim 1,
wherein the first, second, third and fourth elements are disposed in first, second, third and fourth semiconductor layers, respectively,
the first and second semiconductor layers are stacked in a third direction orthogonal to the first and second direction, and
the third and fourth semiconductor layers are stacked in the third direction.

19. The memory of claim 18,
wherein the first and second elements are disposed on surfaces in the second direction of the first and second semiconductor layers, respectively, and
the third and fourth elements are disposed on surfaces in the second direction of the third and fourth semiconductor layers, respectively.

20. The memory of claim 18,
wherein the first and second semiconductor layers are electrically isolated by an insulating layer therebetween, and
wherein the third and fourth semiconductor layers are electrically isolated by an insulating layer therebetween.

21. A nonvolatile semiconductor memory device comprising:
a semiconductor substrate;
elements, each extending in a first direction and each including memory cells and first and second select gate transistors, the first select gate transistor arranged to a first side of the memory cells in the first direction, the second select gate transistor arranged to a second side of the memory cells in the first direction, the first direction being parallel to the semiconductor substrate, the elements including a first element, a second element, a third element, and a fourth element, the second element being stacked above the first element, the fourth element being stacked above the third element, both the third element and the fourth element being arranged in a second direction away from both the first element and the second element, the second direction being parallel to the semiconductor substrate, the second direction being orthogonal to the first direction;
a third select gate transistor arranged to the first sides of the first and second elements; and
a fourth select gate transistor arranged to the second sides of the third and fourth elements.

22. The memory of claim 21,
wherein the memory cells include charge storage layers and control gate electrodes, respectively,
the first and second select gate transistors include select gate electrodes, respectively, and
the control gate electrodes and the select gate electrodes extend in a third direction orthogonal to the first and second direction between the first and third elements and between the second and fourth elements.

23. The memory of claim 22,
wherein the charge storage layers are charge trap insulating layers, and
the charge trap insulating layers of the memory cells in the first, second, third and fourth elements are physically combined with one another.

24. The memory of claim 21,
wherein the first, second, third and fourth elements are disposed in first, second, third and fourth semiconductor layers, respectively,
the first and second semiconductor layers are stacked in a third direction orthogonal to the first and second direction, and
the third and fourth semiconductor layers are stacked in the third direction.

25. The memory of claim 24,
wherein the first and second elements are disposed on surfaces in the second direction of the first and second semiconductor layers, respectively, and
the third and fourth elements are disposed on surfaces in the second direction of the third and fourth semiconductor layers, respectively.

26. The memory of claim 24,
wherein the first and second semiconductor layers are electrically isolated by an insulating layer therebetween, and wherein the third and fourth semiconductor layers are electrically isolated by an insulating layer therebetween.

* * * * *